United States Patent
Yoon et al.

(10) Patent No.: US 11,581,662 B2
(45) Date of Patent: Feb. 14, 2023

(54) ELECTRONIC DEVICE INCLUDING ANTENNA

(71) Applicant: Samsung Electronics Co., Ltd., Gyeonggi-do (KR)

(72) Inventors: Yonghyun Yoon, Gyeonggi-do (KR); Mincheol Seo, Gyeonggi-do (KR); Seho Kim, Gyeonggi-do (KR); Minkyung Lee, Gyeonggi-do (KR); Jongheon Lee, Gyeonggi-do (KR); Sooyoung Jang, Gyeonggi-do (KR); Hyuntae Jung, Gyeonggi-do (KR); Kyunggu Kim, Gyeonggi-do (KR); Jinwoo Jung, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/986,793

(22) Filed: Aug. 6, 2020

(65) Prior Publication Data

US 2021/0044029 A1    Feb. 11, 2021

(30) Foreign Application Priority Data

Aug. 7, 2019  (KR) .......................... 10-2019-0096134

(51) Int. Cl.
*H01Q 21/28*    (2006.01)
*H01Q 5/335*    (2015.01)
(Continued)

(52) U.S. Cl.
CPC .............. *H01Q 21/28* (2013.01); *H01Q 1/02* (2013.01); *H01Q 1/243* (2013.01); *H01Q 5/335* (2015.01)

(58) Field of Classification Search
CPC .......... H01Q 1/243; H01Q 5/30; H01Q 5/335; H01Q 5/378; H01Q 5/385; H01Q 5/392; H01Q 9/30
See application file for complete search history.

(56) References Cited

U.S. PATENT DOCUMENTS 10,141,625 B1 * 11/2018 Ryu ..................... H05K 7/2039
10,243,624 B2    3/2019 Kim et al.
(Continued)

FOREIGN PATENT DOCUMENTS

| CN | 101958454 | 1/2011 |
| CN | 109075450 | 12/2018 |

(Continued)

OTHER PUBLICATIONS

International Search Report dated Nov. 13, 2020 issued in counterpart application No. PCT/KR2020/010344, 8 pages.
(Continued)

*Primary Examiner* — Ricardo I Magallanes
(74) *Attorney, Agent, or Firm* — The Farrell Law Firm, P.C.

(57) ABSTRACT

An electronic device includes a housing including a front plate and a rear plate disposed opposite the front plate, and a display disposed in a space between the front plate and the rear plate, and disposed at least partially along the front plate. The electronic device further includes a first antenna structure disposed in the space and configured to transmit or receive a first signal in a first frequency band, wherein the first antenna structure includes at least one first conductive pattern. The electronic device also includes a second antenna structure disposed in the space without being overlapped with the first conductive pattern when viewed from above the rear plate, and configured to transmit or receive a second signal in a second frequency band different from the first frequency band. In addition, the electronic device includes a conductive sheet disposed in the space and on the rear plate. The conductive sheet is physically separated from the first conductive pattern, and at least partially overlapped with the first conductive pattern when viewed from above the rear plate.

18 Claims, 33 Drawing Sheets

(51) Int. Cl.
*H01Q 1/02* (2006.01)
*H01Q 1/24* (2006.01)

(56) References Cited

U.S. PATENT DOCUMENTS

| | | | | |
|---|---|---|---|---|
| 2011/0012794 | A1* | 1/2011 | Schlub | H01Q 1/243 343/702 |
| 2014/0375510 | A1* | 12/2014 | Lee | H01Q 1/243 343/702 |
| 2015/0244062 | A1 | 2/2015 | Chou et al. | |
| 2016/0056530 | A1* | 2/2016 | Lee | H01Q 1/243 343/702 |
| 2017/0244149 | A1 | 8/2017 | Kim et al. | |
| 2018/0034134 | A1* | 2/2018 | Dalmia | H01Q 19/30 |
| 2018/0070179 | A1* | 3/2018 | McAuliffe | H01Q 1/243 |
| 2018/0288203 | A1 | 10/2018 | Jeon et al. | |
| 2019/0044239 | A1* | 2/2019 | Sonoda | H01Q 1/243 |
| 2019/0051967 | A1* | 2/2019 | Ryu | H05K 1/028 |
| 2019/0067795 | A1 | 2/2019 | Shin et al. | |
| 2019/0074576 | A1 | 3/2019 | Bae et al. | |
| 2019/0104212 | A1 | 4/2019 | Lee et al. | |
| 2019/0157746 | A1* | 5/2019 | Ishizuka | H04M 1/026 |
| 2019/0165470 | A1 | 5/2019 | Jeon | |
| 2020/0028241 | A1 | 1/2020 | Jung et al. | |
| 2020/0128690 | A1* | 4/2020 | Ide | H01Q 1/22 |
| 2020/0313299 | A1* | 10/2020 | Jia | H01Q 5/307 |

FOREIGN PATENT DOCUMENTS

| | | |
|---|---|---|
| CN | 110034380 | 7/2019 |
| KR | 1020170116262 | 10/2017 |
| KR | 10-2019-0060180 | 6/2019 |
| KR | 1020190060477 | 6/2019 |
| WO | WO 2014/203976 | 12/2014 |
| WO | WO 2018/052188 | 3/2018 |
| WO | WO 2019/103485 | 5/2019 |

OTHER PUBLICATIONS

European Search Report dated Dec. 16, 2020 issued in counterpart application No. 20189572.9-1205, 91 pages.
Chinese Office Action dated Nov. 4, 2022 issued in counterpart application No. 202010788865.4, 21 pages.

* cited by examiner

FIG. 25

|  |  | VERTICAL POLARIZATION | HORIZONTAL POLARIZATION |
|---|---|---|---|
| 28 GHz | NO CONDUCTIVE SHEET APPLIED | 8.6 | 9.0 |
|  | CONDUCTIVE SHEET APPLIED | 9.3 | 9.6 |
|  | DIFFERENCE | 0.7 | 0.6 |
| 39 GHz | NO CONDUCTIVE SHEET APPLIED | 7.4 | 11.5 |
|  | CONDUCTIVE SHEET APPLIED | 7.8 | 12.3 |
|  | DIFFERENCE | 0.4 | 0.8 |

US 11,581,662 B2

ELECTRONIC DEVICE INCLUDING ANTENNA

CROSS-REFERENCE TO RELATED APPLICATION(S)

This application is based on and claims priority under 35 U.S.C. § 119 to Korean Patent Application No. 10-2019-0096134, filed on Aug. 7, 2019, in the Korean Intellectual Property Office, the disclosure of which is incorporated by reference herein in its entirety.

BACKGROUND

1. Field

The disclosure relates generally to an electronic device including an antenna.

2. Description of Related Art

With the development of wireless communication technologies, electronic devices are commonly used in everyday life. Thus, the use of digital contents is increasing, and the network capacity is gradually reaching its limit. In order to satisfy an increasing demand for wireless data traffic after commercialization of a 4th generation (4G) communication system, an enhanced communication system (e.g., a fifth generation (5G) communication system, a pre-5G communication system, or a new radio (NR) communication system) that transmits and/or receives signals using a frequency of a high frequency band (e.g., about a 3 gigahertz (GHz) to 300 GHz band) is being studied.

While electronic devices become slimmer, various components are added for various functions. Therefore, it is becoming increasingly difficult to design an antenna in a limited space to secure radiation performance for a desired frequency band while reducing electrical influences with various other elements in the electronic device. In addition, a communication system for processing high-frequency signals has been introduced for high-speed data communication, and thus it may be difficult to secure or maintain radiation performance with respect to a legacy antenna. Moreover, because high-frequency signals, such as millimeter waves, have high directivity and are sensitive to path loss, the radiation performance of the communication system for processing the high-frequency signals may be deteriorated by various factors such as components or structures residing in the electronic device.

SUMMARY

The present disclosure has been made to address the above-mentioned problems and disadvantages, and to provide at least the advantages described below.

According to an aspect of the disclosure, an electronic device includes a housing including a front plate and a rear plate disposed opposite the front plate, and a display disposed in a space between the front plate and the rear plate, and disposed at least partially along the front plate. The electronic device further includes a first antenna structure disposed in the space and configured to transmit or receive a first signal in a first frequency band, wherein the first antenna structure includes at least one first conductive pattern. The electronic device may also include a second antenna structure disposed in the space without being overlapped with the first conductive pattern when viewed from above the rear plate, and configured to transmit or receive a second signal in a second frequency band different from the first frequency band. In addition, the electronic device includes a conductive sheet disposed in the space and on the rear plate. The conductive sheet may be physically separated from the first conductive pattern, and overlapped at least in part with the first conductive pattern when viewed from above the rear plate.

According to another aspect of the disclosure, an electronic device includes a housing including a front plate and a rear plate disposed opposite the front plate, and a display disposed in a space between the front plate and the rear plate, and disposed at least partially along the front plate. The electronic device further includes an antenna structure disposed between the rear plate and the display, the antenna structure including a printed circuit board (PCB) having a first surface disposed to face the rear plate, and a second surface opposite to the first surface; and a plurality of antenna elements disposed on the first surface or inside the PCB near the first surface. The electronic device further includes an antenna radiator disposed in the space without being overlapped with the antenna structure when viewed from above the rear plate; and a conductive sheet disposed in the space and on the rear plate. The conductive sheet may be physically separated from the antenna radiator, and at least partially overlapped with the antenna radiator while surrounding at least a part of the first surface along an edge of the first surface when viewed from above the rear plate.

BRIEF DESCRIPTION OF THE DRAWINGS

The above and other aspects, features and advantages of certain embodiments of the disclosure will be more apparent from the following detailed description, taken in conjunction with the accompanying drawings, in which:

FIG. 25 is a table showing antenna gain of an antenna module based on the radiation patterns of FIGS. 23 and 24, according to an embodiment of the disclosure;

DETAILED DESCRIPTION

The following description with reference to the accompanying drawings is provided to assist in a comprehensive understanding of various embodiments of the disclosure as defined by the claims and their equivalents. The description includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to their dictionary meanings, but are merely used to enable a clear and consistent understanding of the disclosure. Accordingly, it should be apparent to those skilled in the art that the following description of various embodiments of the disclosure is provided for illustration purposes only and not for the purpose of limiting the disclosure, as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Various embodiments of the disclosure may provide an electronic device that includes an antenna for improving or securing antenna radiation performance in a limited antenna design space.

Figure 1:
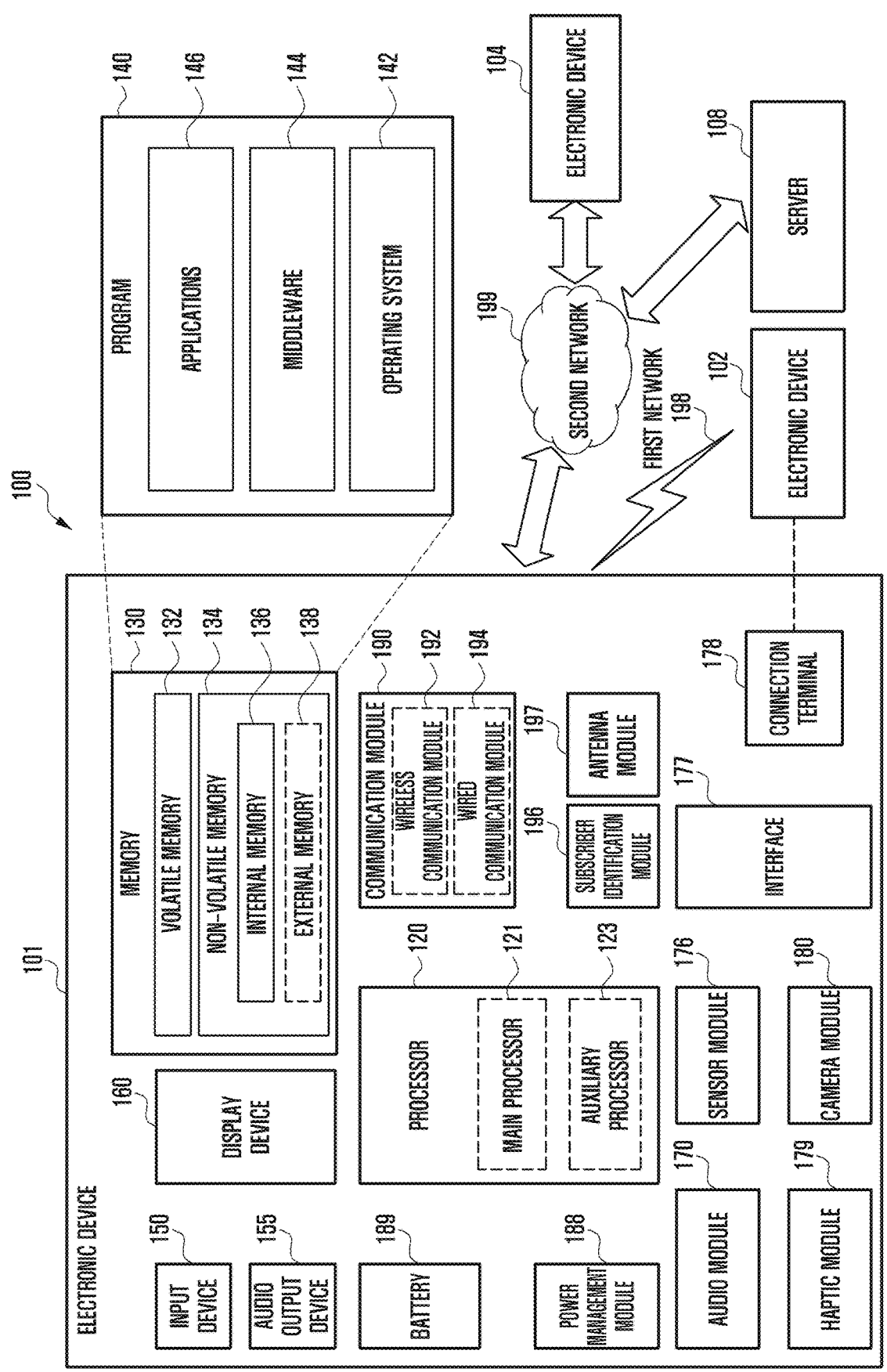
FIG. 1 illustrates an electronic device in a network environment, according to an embodiment of the disclosure.

FIG. 1 illustrates an electronic device 101 in a network environment 100 according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming call. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HMDI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
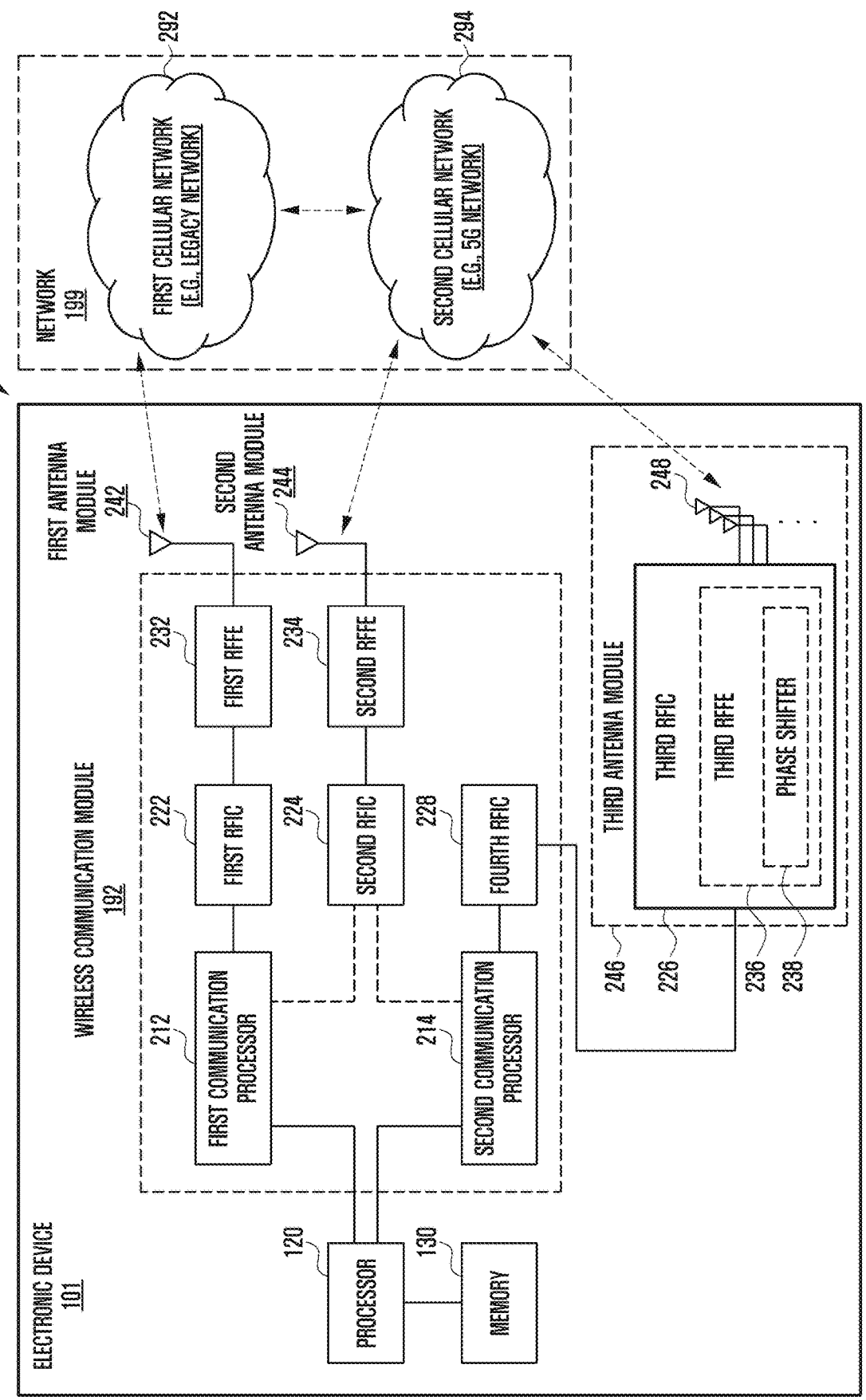
FIG. 2 is a block diagram illustrating an electronic device for supporting legacy network communication and 5G network communication, according to an embodiment of the disclosure.

FIG. 2 is a block diagram illustrating an electronic device in a network environment including a plurality of cellular networks according to various embodiments of the disclosure.

Referring to FIG. 2, the electronic device 101 may include a first CP 212, second CP 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include a processor 120 and a memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first CP 212, second CP 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first CP 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second CP 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first CP 212 or the second CP 214 may establish a communication channel corresponding to another designated band (e.g., about 6 GHz or less) of bands to be used for wireless communication with the second cellular network 294 and support 5G network communication through the established communication channel. According to one embodiment, the first CP 212 and the second CP 214 may be implemented in a single chip or a single package. According to various embodiments, the first CP 212 or the second CP 214 may be formed in a single chip or a single package with the processor 120, the auxiliary processor 123, or the communication module 190.

Upon transmission, the first RFIC 222 may convert a baseband signal generated by the first CP 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first CP 212.

Upon transmission, the second RFIC 224 may convert a baseband signal generated by the first CP 212 or the second CP 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding CP of the first CP 212 or the second CP 214.

The third RFIC 226 may convert a baseband signal generated by the second CP 214 to an RF signal (hereinafter, 5G Above 6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through the third RFFE 236. The third RFIC 226 may convert the preprocessed 5G Above6 RF signal to a baseband signal so as to be processed by the second CP 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second CP 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second CP 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first CP 212, or the second CP 214).

Figure 3A:
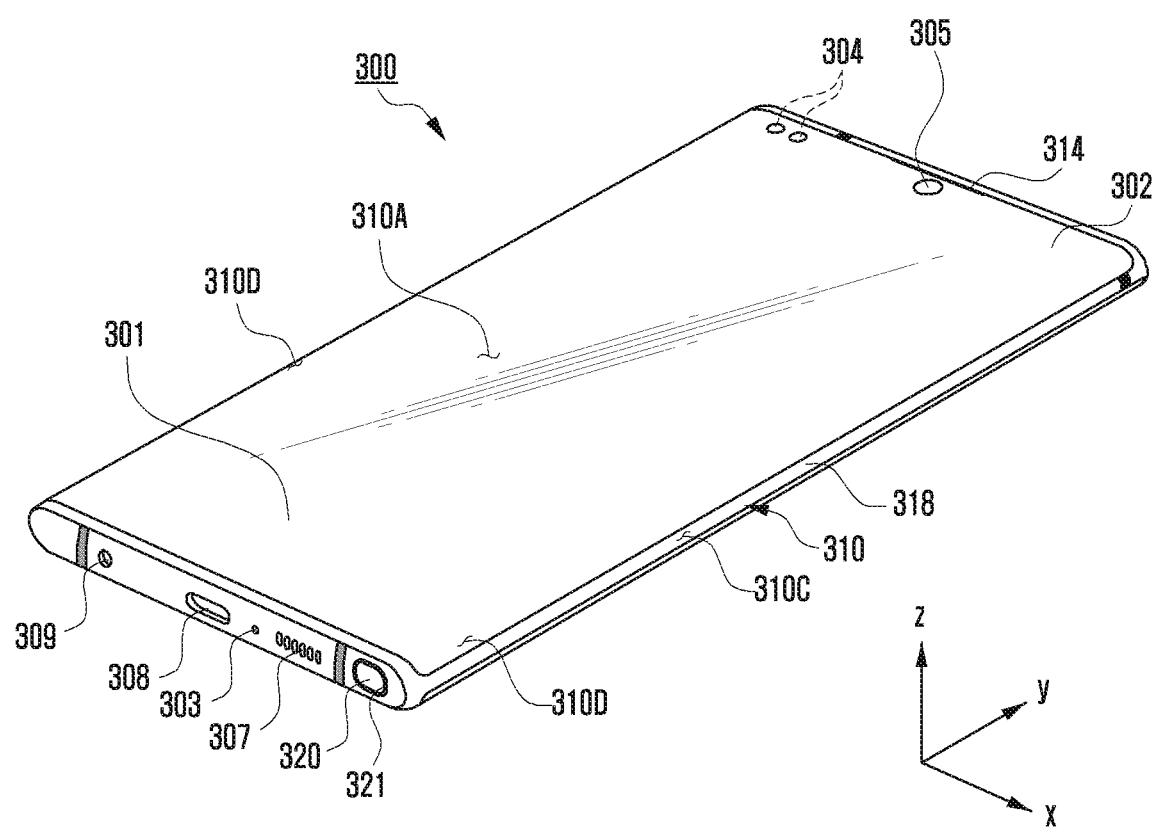
FIG. 3A is a perspective view illustrating a front surface of a mobile electronic device, according to an embodiment of the disclosure.

FIG. 3A is a perspective view illustrating a front surface of a mobile electronic device 300 according to an embodiment of the disclosure.

Figure 3B:
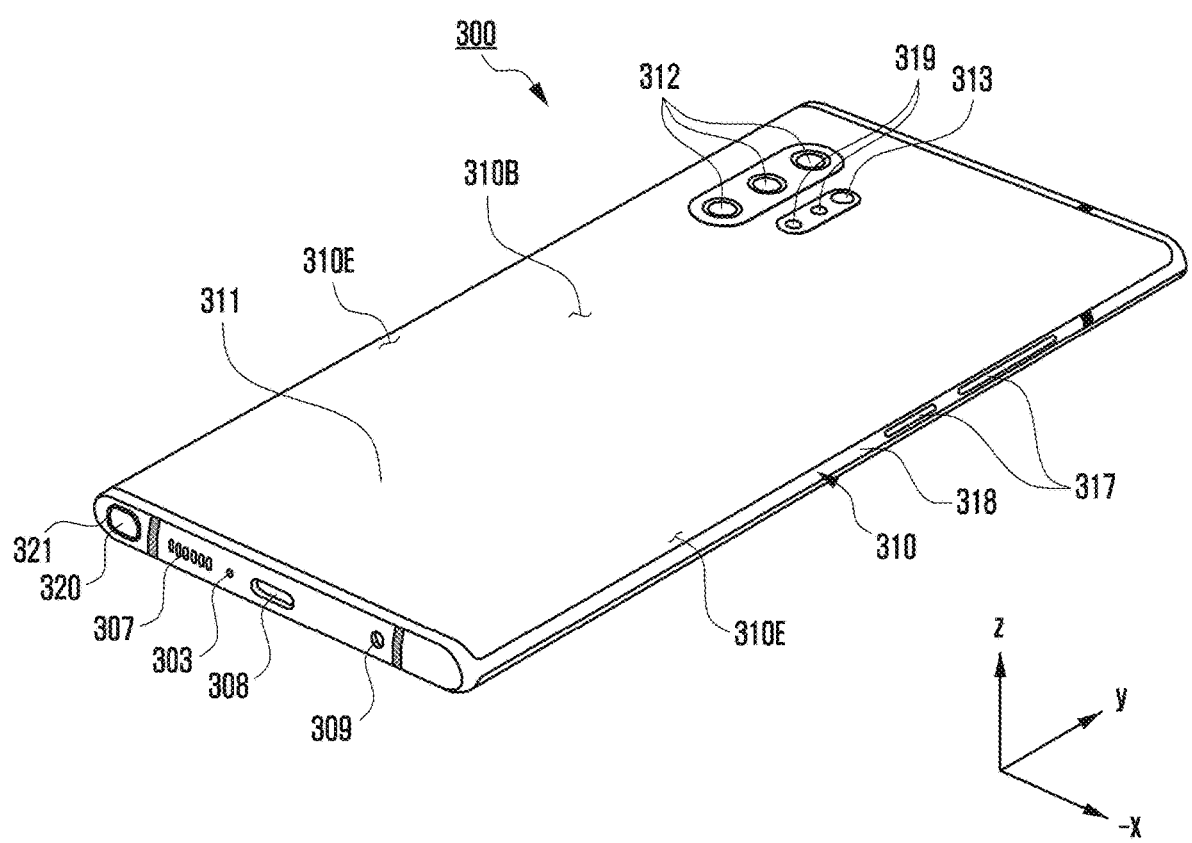
FIG. 3B is a perspective view illustrating a rear surface of the electronic device of FIG. 3A, according to an embodiment of the disclosure.

FIG. 3B is a perspective view illustrating a rear surface of the electronic device 300 of FIG. 3A according to an embodiment of the disclosure.

Referring to FIGS. 3A and 3B, according to an embodiment, an electronic device 300 may include a housing 310 that includes a first surface (or front surface) 310A, a second surface (or rear surface) 310B, and a lateral surface 310C that surrounds a space between the first surface 310A and the second surface 310B. According to another embodiment, the housing 310 may refer to a structure that forms a part of the first surface 310A, the second surface 310B, and the lateral surface 310C. According to an embodiment, the first surface 310A may lie formed of a front plate 302 (e.g., a glass plate or polymer plate coated with a variety of coating layers) at least a part of which is substantially transparent. The second surface 310B may be formed of a rear plate 311 which is substantially opaque. The rear plate 311 may be formed of, for example, coated or colored glass, ceramic, polymer, metal (e.g., aluminum, stainless steel (STS), or magnesium), or any combination thereof. The lateral surface 310C may be formed of a lateral bezel structure (or "lateral member") 318 which is combined with the front plate 302 and the rear plate 311 and includes a metal and/or polymer. In some embodiments, the rear plate 311 and the lateral bezel structure 318 may be integrally formed and may be of the same material (e.g., a metallic material such as aluminum). In the shown embodiment, the front plate 302 may include two first regions 310D disposed at long edges thereof, respectively, and bent and extended seamlessly from the first surface 310A toward the rear plate 311. In the shown embodiment, the rear plate 311 may include two second regions 310E disposed at long edges thereof, respectively, and bent and extended seamlessly from the second surface 310B toward the front plate 302 (refer to FIG. 3B). In various embodiments, the front plate 302 (or the rear plate 311) may include only one of the first regions 310D (or of the second regions 310E). In various embodiments, the first regions 310D or the second regions 310E may be omitted in part. In the embodiments, when viewed from a lateral side of the electronic device 300, the lateral bezel structure 318 may have a first thickness (or width) on a lateral side where one of the first regions 310D or one of the second regions 310E is not included, and may have a second thickness, being less than the first thickness, on another lateral side where one of the first regions 310D or one of the second regions 310E is included.

According to an embodiment, the electronic device 300 may include at least one of a display 301, audio modules 303, 307 and 314, sensor modules 304 and 319, camera modules 305, 312 and 313, key input devices 317, a pen input device 320, and connector holes 308 and 309. In various embodiments, the electronic device 300 may omit at least one (e.g., the key input devices 317) of the above components, or may further include other components (e.g., a fingerprint sensor, or a light emitting device). In various embodiments, the electronic device 300 may include the electronic device 101 of FIG. 1.

The display 301 may be exposed through a substantial portion of the front plate 302, for example. In various embodiments, at least a part of the display 301 may be exposed through the front plate 302 that forms the first surface 310A and the first regions 310D. In various embodiments, outlines (i.e., edges and corners) of the display 301 may have substantially the same form as those of the front plate 302. In another embodiment, the spacing between the outline of the display 301 and the outline of the front plate 302 may be substantially unchanged in order to enlarge the exposed area of the display 301.

In another embodiment, a recess or opening may be formed in a portion of a display area of the display 301 to accommodate or to be aligned with at least one of the audio modules (e.g., the audio module 314), the sensor module 304, and the camera module 305. In another embodiment, at least one of the audio modules (e.g., the audio module 314), the sensor module 304, and the camera module 305 may be disposed on the back of the display area of the display 301. In another embodiment, the display 301 may be combined with, or adjacent to, a touch sensing circuit, a pressure sensor capable of measuring the touch strength (pressure), and/or a digitizer for detecting a stylus pen. In various embodiments, at least a part of the sensor modules 304 and 319 and/or at least a part of the key input devices 317 may be disposed in one of the first regions 310D and/or one of the second regions 310E.

The audio modules 303, 307 and 314 may correspond to a microphone hole (e.g., the audio module 303) and speaker holes (e.g., the audio modules 307 and 314). The microphone hole may contain a microphone disposed therein for acquiring external sounds and, in a case, contain a plurality of microphones to sense a sound direction. The speaker holes may be classified into an external speaker hole and a call receiver hole. In various embodiments, the microphone hole and the speaker holes may be implemented as a single hole, or a speaker (e.g., a piezo speaker) may be provided without the speaker holes.

The sensor modules 304 and 319 may generate electrical signals or data corresponding to an internal operating state of the electronic device 300 or to an external environmental condition. The sensor modules 304 and 319 may include a first sensor module (e.g., the sensor module 304) (e.g., a proximity sensor) and/or a second sensor module (e.g., a fingerprint sensor) disposed on the first surface 310A of the housing 310, and/or a third sensor module (e.g., the sensor module 319) (e.g., a heart rate monitor (HRM) sensor) and/or a fourth sensor module (e.g., a fingerprint sensor) disposed on the second surface 310B of the housing 310. The fingerprint sensor may be disposed on the second surface 310B as well as the first surface 310A (e.g., the display 301) of the housing 310. The electronic device 300 may further include at least one of a gesture sensor, a gyro sensor, an air pressure sensor, a magnetic sensor, an acceleration sensor, a grip sensor, a color sensor, an IR sensor, a biometric sensor, a temperature sensor, a humidity sensor, or an illuminance sensor (e.g., the sensor module 304).

The camera modules 305, 312 and 313 may include a first camera device (e.g., the camera module 305) disposed on the first surface 310A of the electronic device 300, and a second camera device (e.g., the camera module 312) and/or a flash (e.g., the camera module 313) disposed on the second surface 310B of the electronic device 300. The camera module 305 or the camera module 312 may include one or more lenses, an image sensor, and/or an ISP. The flash may include, for example, a light emitting diode or a xenon lamp. In various embodiments, two or more lenses (infrared cameras, wide angle and telephoto lenses) and image sensors may be disposed on one side of the electronic device 300.

The key input devices 317 may be disposed on the lateral surface 310C of the housing 310. In another embodiment, the electronic device 300 may not include some or all of the key input devices 317 described above, and the key input devices 317 which are not included may be implemented in another form such as a soft key on the display 301. In various embodiments, the key input devices 317 may include a sensor module disposed on the second surface 310B of the housing 310.

The light emitting device may be disposed on the first surface 310A of the housing 310, for example. For example, the light emitting device may provide status information of the electronic device 300 in an optical form. In various embodiments, the light emitting device may provide a light source associated with the operation of the camera module 305. The light emitting device may include, for example, a light emitting diode (LED), an IR LED, or a xenon lamp.

The connector holes 308 and 309 may include a first connector hole (e.g., the connector hole 308) adapted for a connector (e.g., a USB connector) for transmitting and receiving power and/or data to and from an external electronic device, and/or a second connector hole (e.g., the connector hole 309) adapted for a connector (e.g., an earphone jack) for transmitting and receiving an audio signal to and from an external electronic device.

The pen input device 320 (e.g., a stylus pen) may be inserted into or removed from the housing 310 through a hole 321 formed in the housing 310, and may include a button for assisting an easy removal. The pen input device 320 may have a built-in resonant circuit to interwork with an electromagnetic induction panel (e.g., the electromagnetic induction panel 490 in FIG. 4) included in the electronic device 300. According to an embodiment, the pen input device 320 may be implemented in a manner of an electromagnetic induction.

According to various embodiments, the pen input device 320 may also be implemented in a manner of an electromagnetic resonance (EMR), active electrical stylus (AES), or electric coupled resonance (ECR).

Figure 4:
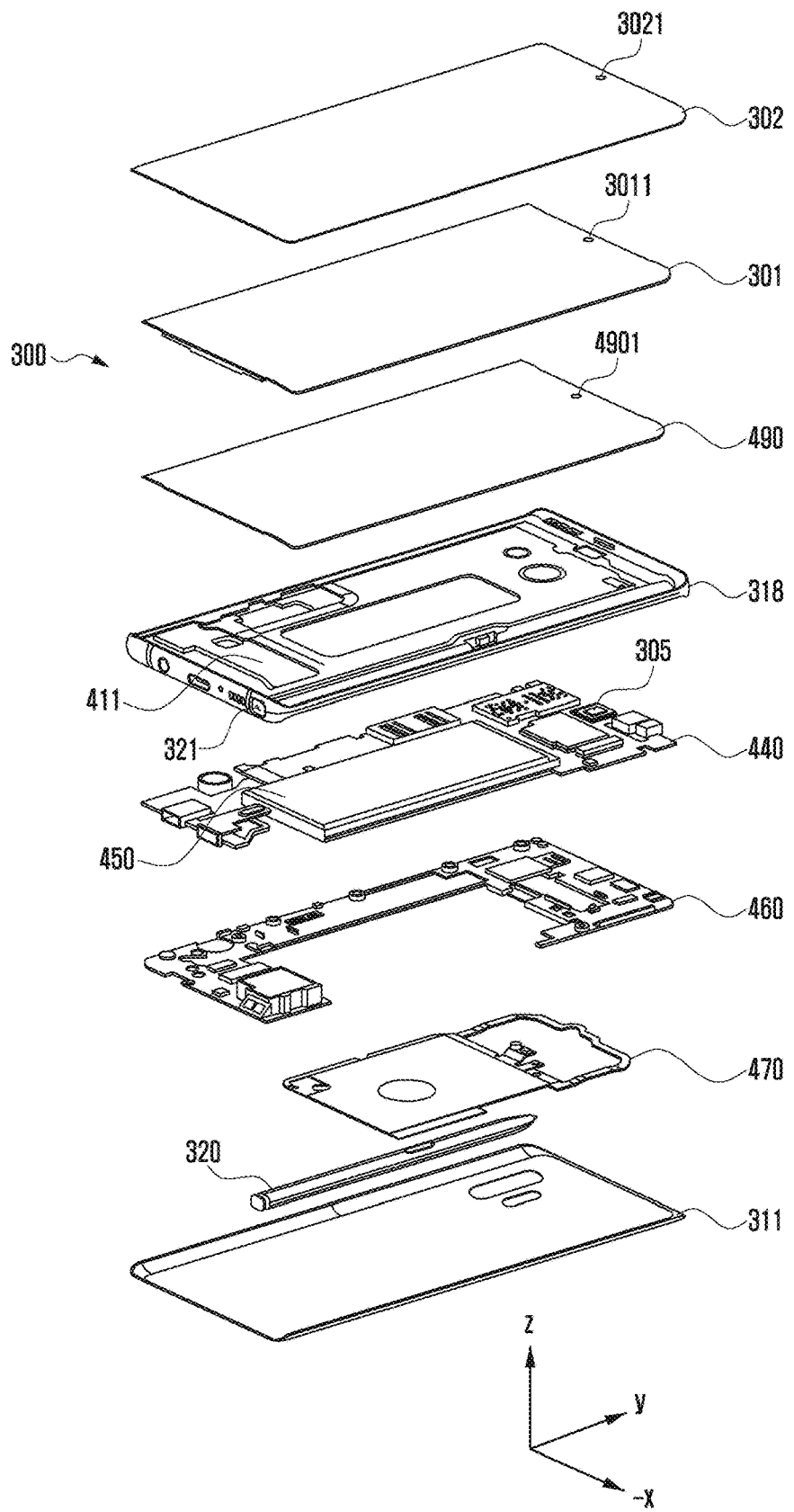
FIG. 4 is an exploded perspective view illustrating the electronic device of FIG. 3A, according to an embodiment of the disclosure.

FIG. 4 is an exploded perspective view illustrating the electronic device 300 of FIG. 3A according to an embodiment of the disclosure.

Referring to FIG. 4, the electronic device 300 may include the lateral bezel structure 318, a first support member 411 (e.g., a bracket), the front plate 302, the display 301, an electromagnetic induction panel 490, a printed circuit board (PCB) 440, a battery 450, a second support member 460 (e.g., a rear case), an antenna 470, the pen input device 320, and the rear plate 311. In various embodiments, the electronic device 300 may omit at least one (e.g., the first support member 411 or the second support member 460) of the above components or may further include another component. Some components of the electronic device 300 may be the same as or similar to those of the electronic device 300 shown in FIG. 3A or FIG. 3B, thus, descriptions thereof are omitted below.

According to an embodiment, the electromagnetic induction panel 490 (e.g., a digitizer) may be a panel for detecting an input of the pen input device 320. For example, the electromagnetic induction panel 490 may include a PCB (e.g., flexible PCB (FPCB)) and a shielding sheet. The shielding sheet may prevent interference between components (e.g., a display module, a PCB, an electromagnetic induction panel, etc.) included in the electronic device 300 due to the electromagnetic field generated from such components. The shielding sheet can block the electromagnetic field generated from the components, thereby allowing the input of the pen input device 320 to be accurately transmitted to a coil included in the electromagnetic induction panel 490. The electromagnetic induction panel 490 according to various embodiments may have an opening 4901 formed at a portion corresponding to an optical sensor (e.g., the first camera device 305 or the biometric sensor) disposed in the electronic device 300.

Depending on certain implements of the pen input device, the electromagnetic induction panel 490 may be omitted. For example, when the pen input device is implemented to generate a signal using the power of a battery included therein, the electromagnetic induction panel 490 may be omitted.

The first support member 411 is disposed inside the electronic device 300 and may be connected to, or integrated with, the lateral bezel structure 318. The first support member 411 may be formed of, for example, a metallic material and/or a non-metal (e.g., polymer) material. The first support member 411 may be combined with the display 301 at one side thereof and also combined with the PCB 440 at the other side thereof. On the PCB 440, a processor, a memory, and/or an interface may be mounted. The processor may include, for example, one or more of a CPU, an AP, a GPU, an ISP, a sensor hub processor, or a CP.

The memory may include, for example, volatile memory or non-volatile memory.

The interface may include, for example, an HDMI, a USB interface, an SD card interface, and/or an audio interface. The interface may electrically or physically connect the electronic device 300 with an external electronic device and may include a USB connector, an SD card/multimedia card (MMC) connector, or an audio connector.

The battery 450 is a device for supplying power to at least one component of the electronic device 300, and may include, for example, a non-rechargeable primary battery, a rechargeable secondary battery, or a fuel cell. At least a part of the battery 450 may be disposed on substantially the same plane as the PCB 440. The battery 450 may be integrally disposed within the electronic device 300, and may be detachably disposed from the electronic device 300.

The second support member 460, for example, may be coupled to the first support member 411, and may be disposed between the printed circuit board 440 and the rear plate 311. The second support member 460 may be coupled to the first support member 411 with the printed circuit board 440 via a joint mean such as a bolt. The second support member 460 may cover the printed circuit board 440 to protect. The second support member 460 may be formed of a metallic material and/or a non-metal (e.g., polymer) material.

The antenna 470 may be disposed between the rear plate 311 and the battery 450. The antenna 470 may include, for example, a near field communication (NFC) antenna, a wireless charging antenna, and/or a magnetic secure transmission (MST) antenna. The antenna 470 may perform short-range communication with an external device, or transmit and receive power required for charging wirelessly. In various embodiments, an antenna structure may be formed by a part or combination of the lateral bezel structure 318 and/or the first support member 411.

According to various embodiments, the display 301 may have an opening 3011 formed at a portion corresponding to an optical sensor (e.g., the first camera device 305 or the biometric sensor) disposed in the electronic device 300. The optical sensor may receive external light through a portion 3021 of the front plate 302, the opening 3011 of the display 301, and the opening 4901 of the electromagnetic induction panel 490, all of which are aligned with each other. According to other embodiments, the opening 3011 of the display 301 may be replaced with a substantially transparent region formed by changing the pixel structure and/or wiring structure.

Figure 5A:
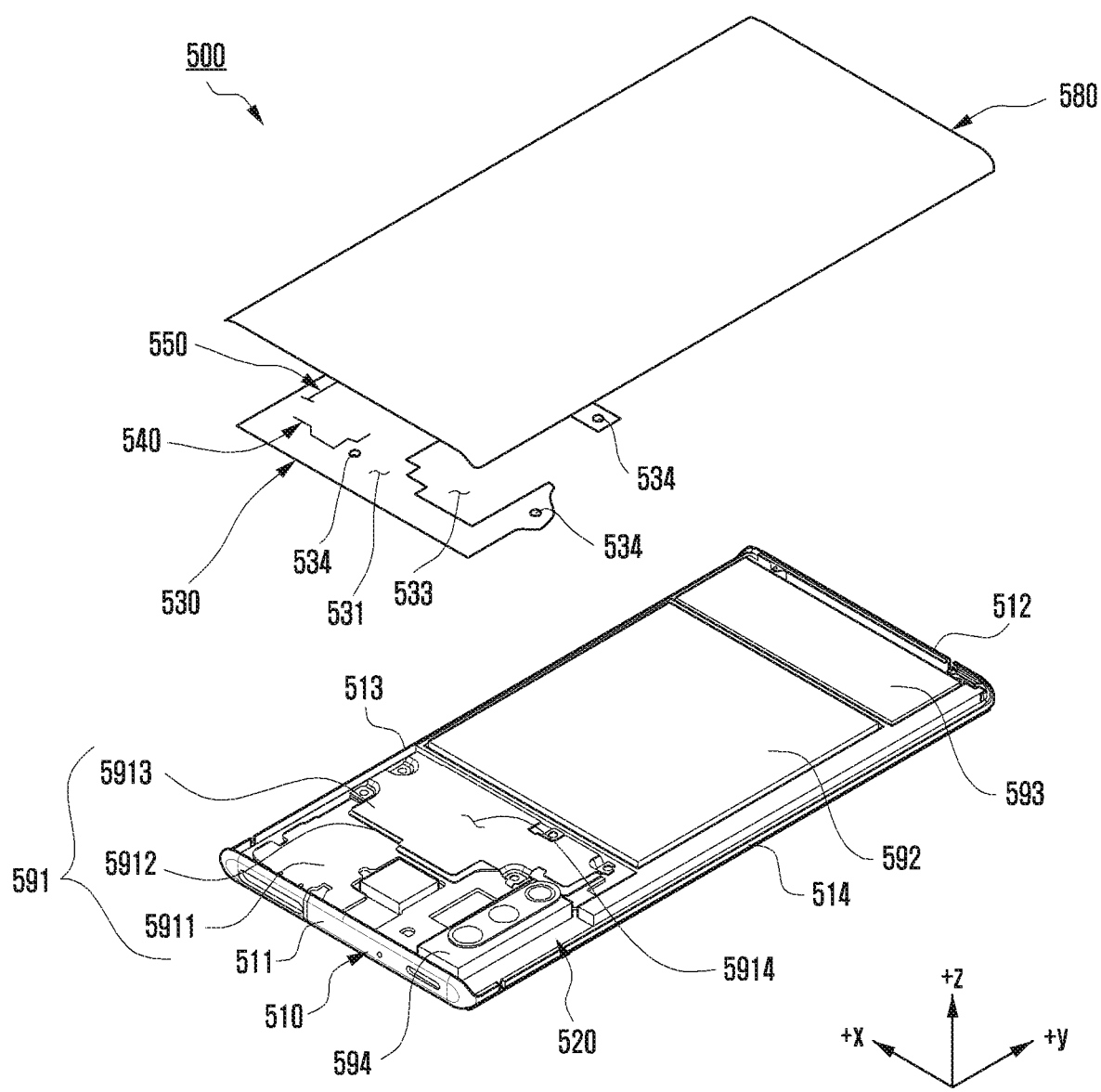
FIG. 5A illustrates an electronic device, according to an embodiment of the disclosure.
Figure 5B:
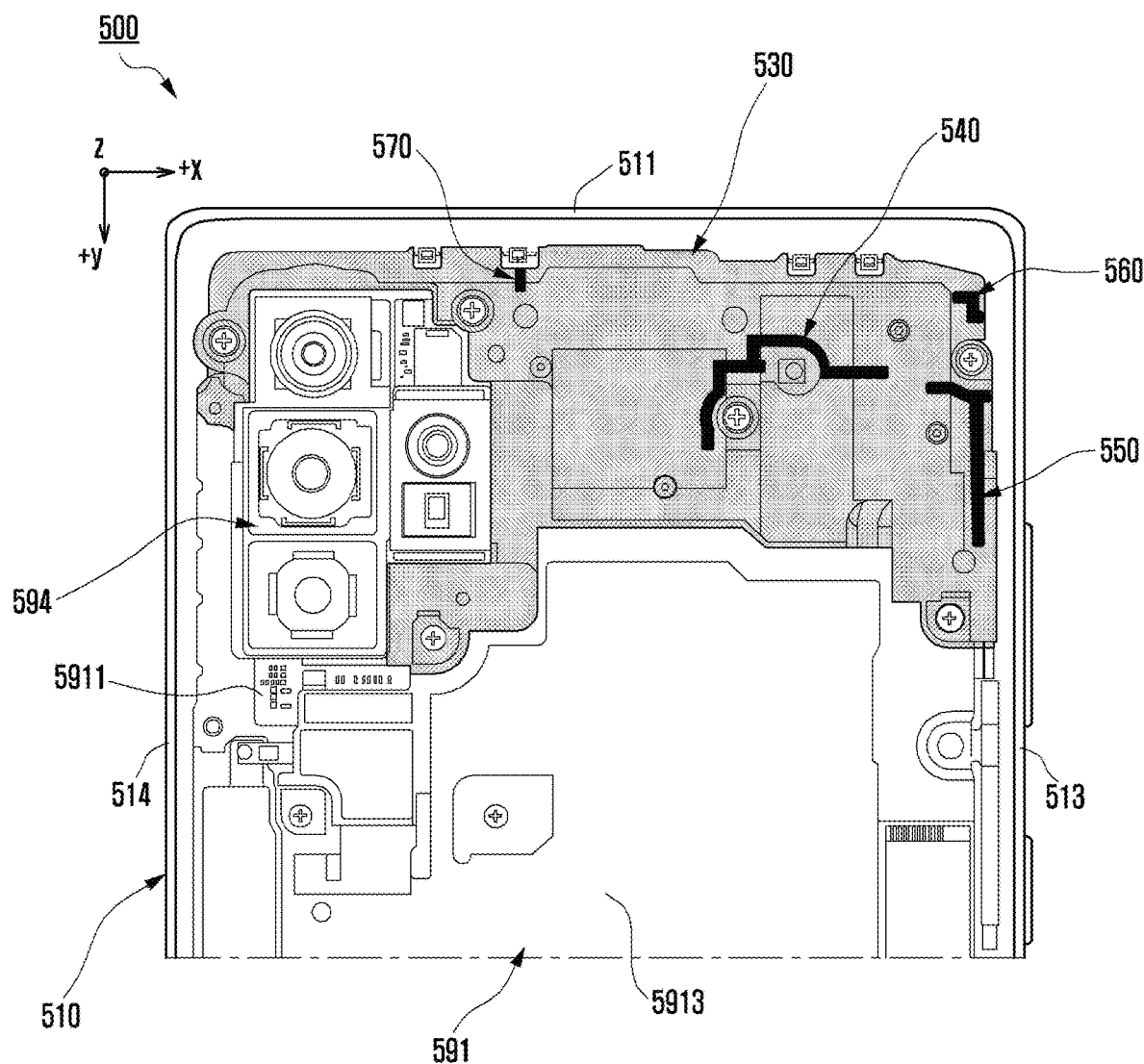
FIG. 5B illustrates an electronic device, according to an embodiment of the disclosure.
Figure 6A:
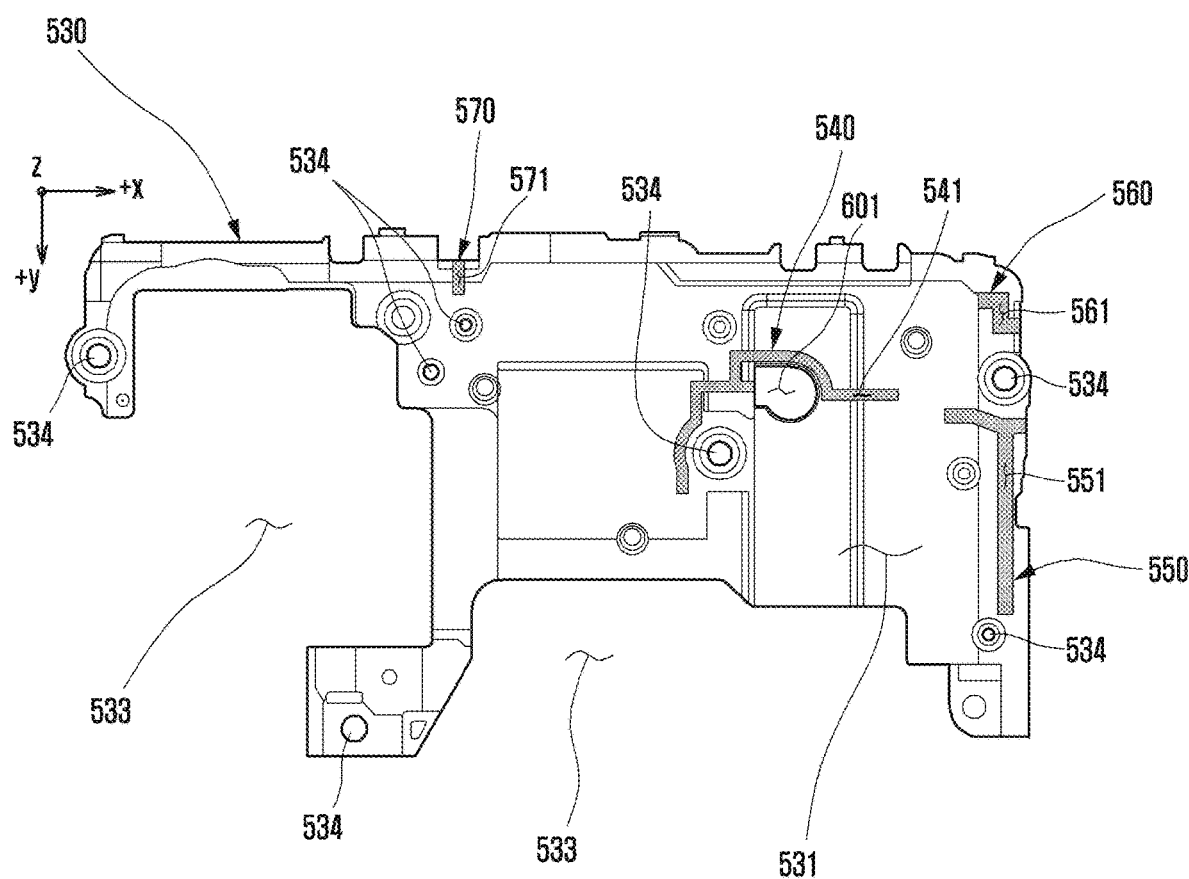
FIG. 6A is a plan view illustrating a front surface of a second support member, according to an embodiment of the disclosure.
Figure 6B:
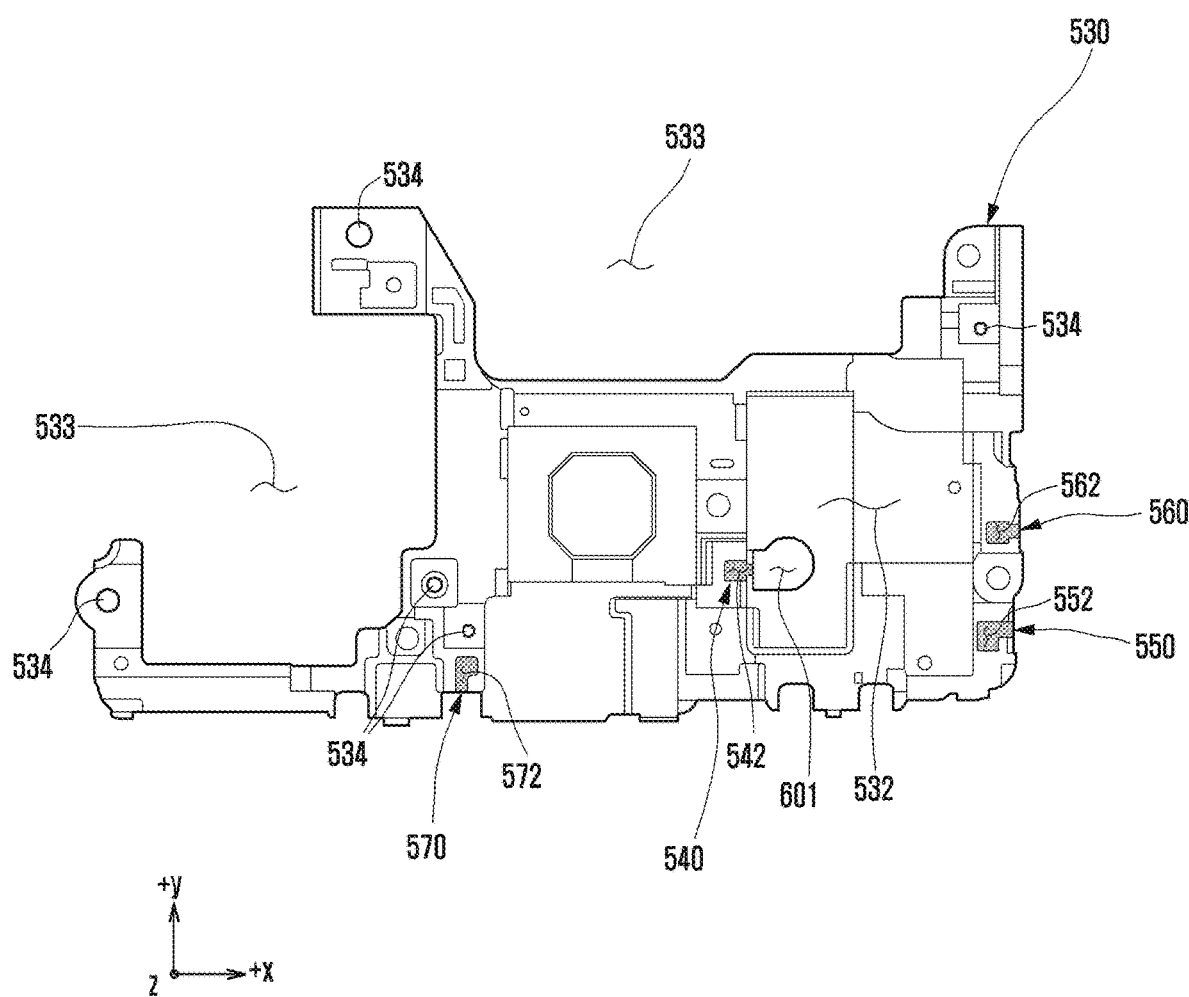
FIG. 6B is a plan view illustrating a rear surface of the second support member of FIG. 6A, according to an embodiment of the disclosure.

FIGS. 5A and 5B illustrate an electronic device 500 according to an embodiment of the disclosure. FIG. 6A is a plan view illustrating a front surface of a second support member 530 according to an embodiment of the disclosure. FIG. 6B is a plan view illustrating a rear surface of the second support member 530 of FIG. 6A according to an embodiment of the disclosure.

FIG. 5B illustrates a state in which a rear plate 580 (e.g., the rear plate 311 in FIG. 4) is removed from the electronic device 500 shown in FIG. 5A. Referring to FIGS. 5A and 5B the electronic device 500 includes a lateral member 510, the rear plate 580, a first support member 520, a second support member 530, a first conductive pattern 540, a second conductive pattern 550, a third conductive pattern 560, and/or a fourth conductive pattern 570. According to various embodiments, at least one of such components of the electronic device 500 may be identical with or similar to at least one of components of the electronic device 300 of FIGS. 3A, 3B, and/or 4, and the description thereof may be omitted hereinafter.

According to an embodiment, the lateral member 510 (e.g., the lateral member 318 in FIG. 4) may include a first lateral portion 511, a second lateral portion 512, a third lateral portion 513, and/or a fourth lateral portion 514. The first lateral portion 511 may be disposed opposite the second lateral portion 512 and may be substantially parallel to the second lateral portion 512. The third lateral portion 513 may connect one end of the first lateral portion 511 and one end of the second lateral portion 512. The fourth lateral portion 514 may connect the other end of the first lateral portion 511 and the other end of the second lateral portion 512. The fourth lateral portion 514 may be disposed opposite the third lateral portion 513 and may be substantially parallel to the third lateral portion 513.

According to an embodiment, the first support member 520 (e.g., the first support member 411 in FIG. 4) may be disposed inside the electronic device 500 and connected to the lateral member 510, or may be formed integrally with the lateral member 510.

According to an embodiment, the electronic device 500 may include various electronic components disposed therein. For example, the electronic device 500 may include a substrate assembly 591, a battery 592, an input/output assembly 593, and/or a camera module 594 (e.g., the second camera module 312 and/or the flash 313 in FIG. 3B). The substrate assembly 591 may be disposed in a first component mounting area formed in the first support member 520. The battery 592 may be disposed in a second component mounting area formed in the first support member 520. The input/output assembly 593 may be disposed in a third component mounting area formed in the first support member 520. The camera module 594 may be disposed in a fourth component mounting area formed in the first support member 520. The substrate assembly 591 may be disposed at least among the first lateral portion 511, a part of the third lateral portion 513, and a part of the fourth lateral portion 514. The input/output assembly 593 may be disposed at least among the second lateral portion 512, a part of the third lateral portion 513, and a part of the fourth lateral portion 514. When viewed from above the rear plate 580, the battery 592 may be disposed at least between the substrate assembly 591 and the input/output assembly 593. When viewed from above the rear plate 580, the camera module 594 may be disposed at least between the substrate assembly 591 and the fourth lateral portion 514.

According to an embodiment, when viewed from above the rear plate 580, the substrate assembly 591 may include a first PCB 5911 (e.g., a main PCB), a second PCB 5912 (e.g., a slave PCB or an interposer) disposed to be partially overlapped with the first PCB 5911, an interposer substrate disposed between the first PCB 5911 and the second PCB 5912, or a shielding member 5913 (e.g., a shield can) covering at least a part of the second PCB 5912.

According to an embodiment, the input/output assembly 593 may be electrically connected to the PCBs of the substrate assembly 591. The input/output assembly 593 may include various components such as a speaker module, a PCB including a USB connector, a microphone module, and/or an antenna pattern. The input/output assembly 593 may further include other components.

Referring to FIGS. 5A, 6A, and 6B, the second support member 530 (e.g., a rear case) may be disposed between the first support member 520 and the rear plate 580. The second support member 530 may be formed as a plate of a nonmetallic material (e.g., polymer). The second support member 530 may have a first surface 531 facing the rear plate 580, and a second surface 532 (see FIG. 6B) disposed opposite the first surface 531 and facing the first support member 520. The second support member 530 may have a plurality of through-holes 534 and may be combined with the first support member 520 through bolts inserted into the plurality of through-holes 534.

According an embodiment, when viewed from above the rear plate 580, the second support member 530 may cover a part of the substrate assembly 591, and the other part of the substrate assembly 591 may be exposed to a space 533 outside the second support member 530 to face the rear plate 580. For example, one surface 5914 of the shielding member 5913 may face the rear plate 580.

According an embodiment, the first conductive pattern 540, the second conductive pattern 550, the third conductive pattern 560, and/or the fourth conductive pattern 570 may be disposed on the second support member 530. In addition, the first conductive pattern 540, the second conductive pattern 550, the third conductive pattern 560, and/or the fourth conductive pattern 570 may be electrically connected to a wireless communication circuit (e.g., the wireless communication module 192 in FIG. 1) mounted on the first PCB 5911 of the substrate assembly 591, thus operating as an antenna radiator. The wireless communication circuit may transmit/receive signals of different frequencies through the first conductive pattern 540, the second conductive pattern 550, the third conductive pattern 560, and the fourth conductive pattern 570.

According an embodiment, the first conductive pattern 540, the second conductive pattern 550, the third conductive pattern 560, and/or the fourth conductive pattern 570 may be implemented using laser direct structuring (LDS). LDS is a technique to design a pattern on the second support member 530 (e.g., a structure formed of a resin such as polycarbonate) by using a laser and then form a conductive pattern by plating the designed pattern with a conductive material such as copper or nickel. According to various embodiments, the first conductive pattern 540, the second conductive pattern 550, the third conductive pattern 560, and/or the fourth conductive pattern 570 may be implemented in various forms such as plating, printing, SUS (or STS), or FPCB.

In an embodiment, referring to FIG. 5B, the second conductive pattern 550, the third conductive pattern 560, and/or the fourth conductive pattern 570 may be disposed near edges of the second support member 530. For example, each of the second conductive pattern 550 and the third conductive pattern 560 may be disposed near the third lateral portion 513 of the lateral member 510, and the fourth conductive pattern 570 may be disposed near the first lateral portion 511 of the lateral member 510. The first conductive pattern 540 may be disposed at a position spaced apart from the third lateral portion 513 and the fourth lateral portion 514 of the lateral member 510 and also spaced apart from the first lateral portion 511 and the shielding member 5913.

Referring to FIGS. 6A and 6B, the first conductive pattern 540 may include a first portion 541 disposed on the first surface 531, and a second portion 542 extended from the first portion 541 and disposed on the second surface 532. In addition, the first conductive pattern 540 may include a third portion disposed on an inner surface of an opening 601, formed in the second support member 530, and connecting the first portion 541 and the second portion 542. The second conductive pattern 550 may include a first portion 551 disposed on the first surface 531, and a second portion 552 extended from the first portion 551 and disposed on the second surface 532. In addition, the second conductive pattern 550 may include a third portion disposed on a lateral surface of the second support member 530 and connecting the first portion 551 and the second portion 552. The third conductive pattern 560 may be formed similarly to the second conductive pattern 550 and thus include a first portion 561, a second portion 562, and a third portion. The fourth conductive pattern 570 may be formed similarly to the second conductive pattern 550 and thus include a first portion 571, a second portion 572, and a third portion. According to an embodiment, the first portions 541, 551, 561, and 571 may be antenna radiators or radiation parts. In addition, the second portions 542, 552, 562, and 572 may be feeding parts or feeding structures and may be electrically connected to at least one wireless communication circuit (e.g., the wireless communication module 192 in FIG. 1). The at least one wireless communication circuit may transmit radiation currents through the second portions 542, 552, 562, and 572, so that the conductive patterns 540, 550, 560, and 570 may radiate radio waves. The at least one wireless communication circuit may transmit and/or receive a signal of a selected or designated frequency through the first conductive pattern 540, the second conductive pattern 550, the third conductive pattern 560, and/or the fourth conductive pattern 570. A flexible conductive member may be disposed between the first PCB 5911 and the second portion(s) 542, 552, 562, and/or 572. In this case, the at least one wireless communication circuit disposed on the first PCB 5911 may be electrically connected to the conductive pattern(s) 540, 550, 560, and/or 570 through the flexible conductive member. The flexible conductive member may be formed of, for example, a C-clip (e.g., a C-shaped spring), a pogo-pin, a spring, a conductive PORON™, a conductive rubber, a conductive tape, or a copper connector.

According to various embodiments, the first conductive pattern 540 may be referred to as a first antenna structure that includes a radiation part (e.g., the first portion 541) and a feeding part (e.g., the second portion 542). Similarly, the second conductive pattern 550, the third conductive pattern 560, and the fourth conductive pattern 570 may be referred to as a second antenna structure, a third antenna structure, and a fourth antenna structure, respectively.

According to various embodiments, the shapes, positions, and number of conductive patterns disposed on the second support member 530 and operating as antenna radiators may be varied without being limited to the embodiment of FIGS. 6A and 6B.

According to various embodiments, the second support member may be implemented in various forms other than a specific form implemented in the embodiment of FIG. 5B. In addition, the conductive patterns operating as antenna radiators may be disposed at various positions on the second support member.

According to various embodiments, such a conductive pattern operating as an antenna radiator may be disposed on any other component. For example, referring to FIG. 5A, at least one conductive pattern may be disposed on a surface of the input/output assembly 593 facing the rear plate 580.

Figure 7:
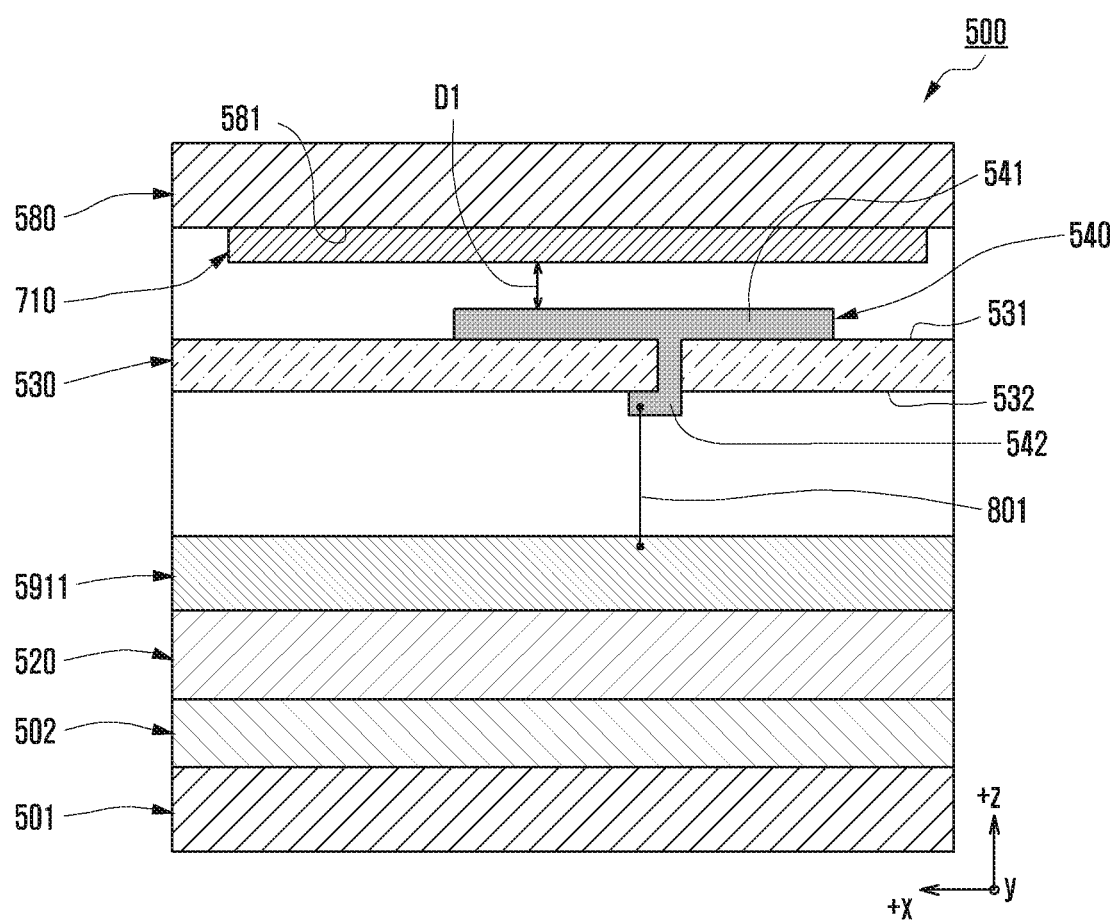
FIG. 7 is a cross-sectional view schematically illustrating an electronic device, according to an embodiment of the disclosure.
Figure 8:
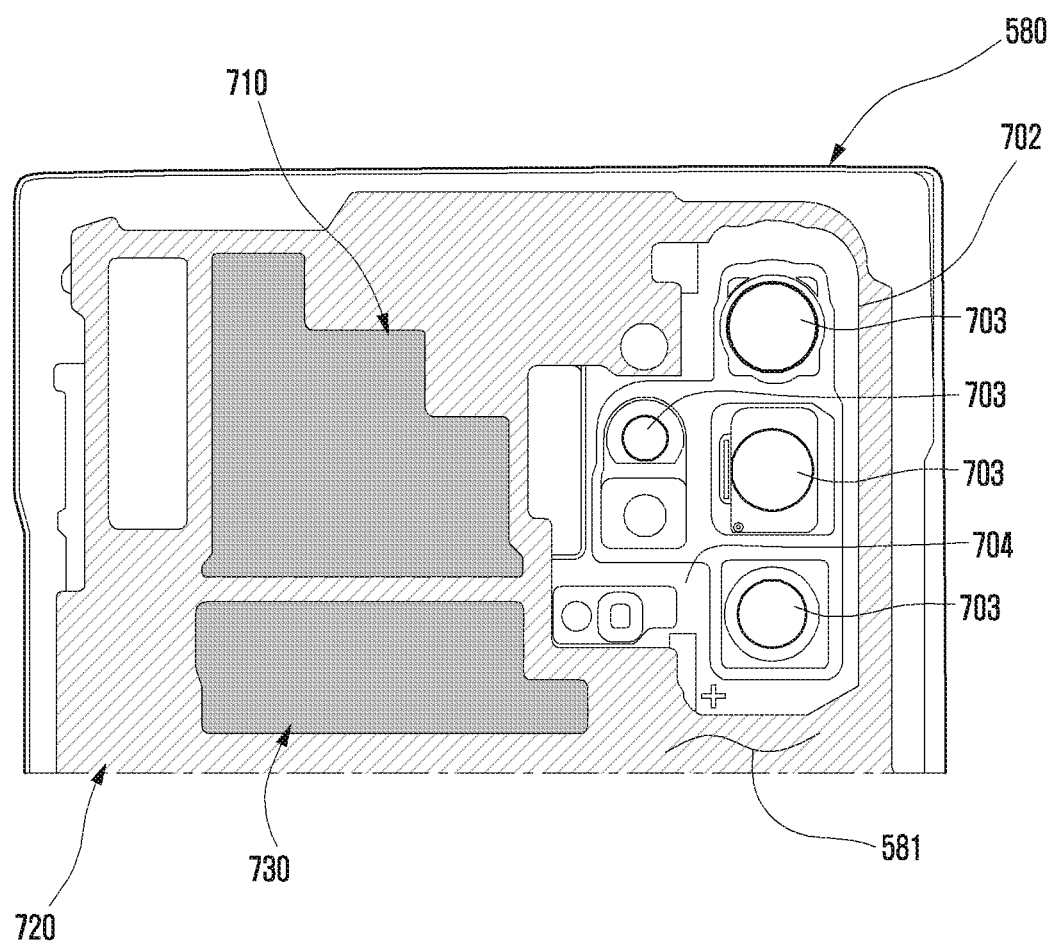
FIG. 8 is a plan view illustrating a rear plate, according to an embodiment of the disclosure.

FIG. 7 is a cross-sectional view schematically illustrating an electronic device 500, according to an embodiment of the disclosure. FIG. 8 is a plan view illustrating a rear plate 580, according to an embodiment of the disclosure.

Referring to FIG. 7, the electronic device 500 may include a front plate 501, the rear plate 580, the first support member 520, a display 502, the first PCB 5911, the second support member 530, the first conductive pattern 540, a conductive sheet 710, and/or an electrical path 801. At least one of such components of the electronic device 500 may be identical with or similar to at least one of components shown in FIGS. 4 to 6B, and the descriptions thereof may be omitted hereinafter. For example, the front plate 501 may be identical with or similar to the front plate 302 of FIG. 4. The first support member 520, which is a support structure on which the display 502 (e.g., the display 301 of FIG. 4) and the first PCB 5911 (e.g., the PCB 440 of FIG. 4) are disposed, may be identical with or similar to the first support member 411 of FIG. 4 or the first support member 520 of FIGS. 5A to 6B. The second support member 530, which is a support structure disposed between the rear plate 580 and the first PCB 5911, may be identical with or similar to the second support member 460 of FIG. 4 or the second support member 530 of FIGS. 5A to 6B.

Referring to FIGS. 7 and 8, in an embodiment, the rear plate 580 may be formed of a nonmetallic material such as glass or polymer. The rear plate 580 may have a third surface 581 that faces the first surface 531 of the second support member 530. The conductive sheet 710 (or a conductive layer) may be disposed on the third surface 581. An adhesive member may be disposed in a region of the third surface 581 adjacent to and along edges of the third surface 581 so as to bond the rear plate 580 to the lateral member 510 and/or the first support member 520 shown in FIG. 5B.

Referring to FIG. 7, in an embodiment, the first conductive pattern 540 disposed on the second support member 530 may include the first portion 541 disposed on the first surface 531 facing the rear plate 580, and the second portion 542 extended from the first portion 541 and disposed on the second surface 532 facing the first PCB 5911. The second portion 542 may be electrically connected to the first PCB 5911 through the electrical path 801. The electrical path 801 may include a flexible conductive member, such as a C-clip, a pogo-pin, a spring, a conductive PORON™, a conductive rubber, a conductive tape, or a copper connector, disposed between the second portion 542 and the first PCB 5911. The second portion 542, which is the feeding part of the first conductive pattern 540, may be electrically connected to the wireless communication circuit (e.g., the wireless communication module 192 in FIG. 1) mounted on the first PCB 5911. The wireless communication circuit may transmit a radiation current to the conductive pattern 540 through the second portion 542.

According to an embodiment, when viewed from above the rear plate 580, the conductive sheet 710 may be overlapped, at least in part, with the first conductive pattern 540. The conductive sheet 710 may be disposed to be spaced apart from the first conductive pattern 540.

According to an embodiment, the conductive sheet 710 may be electromagnetically coupled with the first conductive pattern 540, thus operating, together with the first conductive pattern 540, as an antenna radiator that transmits and/or receives a signal of a selected or designated frequency. According to various embodiments, the conductive sheet 710 electromagnetically coupled with the first conductive pattern 540 may be implemented in various numbers or forms without being limited to the embodiment of FIG. 8.

According to various embodiments, the conductive sheet 710 may be electrically connected to a ground contained in the first PCB 5911. For example, various electrical paths, such as a flexible conductive member, may be disposed between the conductive sheet 710 and the first PCB 5911.

According to an embodiment, the conductive sheet 710 may be disposed so as not to exert an electromagnetic effect on antenna radiators (e.g., the second conductive pattern 550, the third conductive pattern 560, and the fourth conductive pattern 570 in FIG. 5B) other than the first conductive pattern 540. For example, when viewed from above the rear plate 580, the conductive sheet 710 may not be overlapped with the second conductive pattern 550, the third conductive pattern 560, and/or the fourth conductive pattern 570 shown in FIG. 5B. In addition, when viewed from above the rear plate 580, the conductive sheet 710 may be disposed to be spaced apart from the second conductive pattern 550 by a certain distance or more based on the wavelength of the second conductive pattern 550 such that the second conductive pattern 550 of FIG. 5B can be electromagnetically isolated from the conductive sheet 710. Similarly the third conductive pattern 560 and/or the fourth conductive pattern 570 of FIG. 5B may also be electromagnetically isolated from the conductive sheet 710.

According to an embodiment, the conductive sheet 710 may adjust the frequency of an antenna device (or antenna system) that utilizes the first conductive pattern 540. For example, due to the slimness of the electronic device 500 of FIG. 5A, the first conductive pattern 540 disposed in a limited antenna design space may be electrically affected by peripheral components or structures. It may be therefore difficult to secure a selected or designated frequency, bandwidth, or radiation performance in radio communication that utilizes the first conductive pattern 540. For example, the conductive sheet 710 may shift the resonant frequency of the first conductive pattern 540 to a designated frequency or shift the resonant frequency of the first conductive pattern 540 by a specified amount.

According to various embodiments, a structure in winch the first conductive pattern 540 is physically separated from the conductive sheet 710 and overlapped at least in part with the conductive sheet 710 when viewed from above the rear plate 580 may expand the bandwidth. For example, adding the conductive sheet 710 can expand the bandwidth in a designated frequency band operating through the first conductive pattern 540, thereby allowing signals to be transmitted/received in a wider frequency band.

According to various embodiments, the frequency or bandwidth may be variously adjusted depending on dimensions, such as length, width, or thickness, of the conductive sheet 710. In addition, the frequency or bandwidth may be variously adjusted depending on a distance (D1) between the conductive sheet 710 and the first conductive pattern 540. The conductive sheet 710 may be disposed to be spaced apart from the first conductive pattern 540 within a half of the wavelength of the radio wave reflected from the first conductive pattern 540, thereby being electromagnetically coupled to the first conductive pattern 540. According to various embodiments, the frequency or bandwidth may be variously adjusted depending on the position or area of an overlap between the conductive sheet 710 and the first conductive pattern 540 when viewed from above the rear plate 580.

According to various embodiments, the conductive sheet may be implemented to include a plurality of conductive parts separated from each other. The frequency or bandwidth may be variously adjusted depending on the shape, spacing, or other various factors of the plurality of conductive parts.

According to an embodiment, the conductive sheet 710 may be formed of a material capable of securing or increasing the radiation efficiency (or radiation performance) through electromagnetic coupling with the first conductive pattern 540. Referring to Equation (1) below, the radiation efficiency ($\eta$) may be determined based on the antenna radiation resistance ($R_r$), the antenna loss resistance ($R_L$), the ground loss ($R_g$), and the medium loss ($R_c$).

$$\eta = \frac{R_r}{R_r + R_L + R_g + R_c} \quad (1)$$

For example, the medium loss ($R_c$) may be lowered as the electrical conductivity is lowered, and the radiation efficiency ($\eta$) may vary depending on the electrical conductivity of the conductive sheet 710.

According to an embodiment, the conductive sheet 710 may contain a thermally conductive material and thereby act as a heat spreader. The heat spreader is capable of spreading heat generated inside the electronic device 500. For example, heat may be generated in components consuming a lot of current, such as a processor (e.g., an AP), a communication module, or a charging module included in the substrate assembly 591 as shown in FIG. 5A. That is, if the processor has more work to do, or if the communication module is constantly driven to catch a signal, a lot of heat may be generated. In addition, the battery may generate heat due to current consumption of such components. Unfortunately, excessive heat may degrade the system performance or, at worst, affect the battery, which may increase the likelihood of an explosion. Nevertheless, due to the slimness of the electronic device 500 as shown in FIG. 5A, it is difficult to mount an active structure such as a cooling fan. Accordingly, the electronic device 500 may utilize the conductive sheet 710 as a cooling system for heat management.

According to an embodiment, the conductive sheet 710 may be formed of a material capable of not only increasing the radiation efficiency together with the first conductive pattern 540, but also rapidly spreading or dispersing heat as the heat spreader. The conductive sheet 710 may be formed of a graphite having an electrical conductivity (about $3\times10^5$ S/m (siemens per meter)) smaller than that of copper (about $5.96\times10^7$ S/m), thereby ensuring reliable radiation efficiency and also performing smooth heat dissipation. According to various embodiments, the conductive sheet 710 may be implemented with any other material in consideration of both the radiation efficiency increasing as the electrical conductivity is low, and the heat dissipation efficiency increasing as the thermal conductivity is high.

Referring to FIG. 8, in an embodiment, a heat dissipation sheet 720 may be disposed on the third surface 581 of the rear plate 580. For example, the heat dissipation sheet 720 may be disposed at least in part in a region of the third surface 581 of the rear plate 580 where the conductive sheet 710 is not disposed. The third surface 581 of the rear plate 580 may have a first region in which the conductive sheet 710 is disposed, and a second region in which the heat dissipation sheet 720 is disposed. The conductive sheet 710 and the heat dissipation sheet 720 may adjoin or connect each other at a boundary between the first region and the second region.

According to various embodiments, the conductive sheet 710 and the heat dissipation sheet 720 may be implemented as one composite sheet and attached to the third surface 581 of the rear plate 580. For example, the composite sheet may include a film (or a film base) formed of a polymer such as polyethylene terephthalate (PET), a conductive layer containing a conductive material coated on a certain region of one surface of the film, and a layer of a thermally conductive material coated on the other region of the one surface of the film.

According to various embodiments, instead of the conductive sheet 710 and the heat dissipation sheet 720, a conductive layer containing a conductive material coated on a certain region of the third surface 581, and a layer of thermally conductive material coated on the other region of the third surface 581 may be used.

According to various embodiments, a heat dissipation sheet may be attached to the third surface 581 of the rear plate 580, and a conductive sheet may be attached to the heat dissipation sheet. In this case, the conductive sheet may be spaced apart from the third surface 581 of the rear plate 580 by the heat dissipation sheet interposed therebetween.

Referring to FIGS. 5A and 8, in an embodiment, the heat dissipation sheet 720 may be overlapped at least in part with at least one antenna radiator when viewed from above the rear plate 580. For example, when viewed from above the rear plate 580, the heat dissipation sheet 720 may be partially overlapped with the first conductive pattern 540 and also at least partially overlapped with the second conductive pattern 550 (or the third conductive pattern 560 or the fourth conductive pattern 570 in FIG. 5B). In order to prevent the degradation of the radiation performance due to the dielectric constant of the heat dissipation sheet 720, both the first conductive pattern 540 and the second conductive pattern 550 (or the third conductive pattern 560 or the fourth conductive pattern 570 in FIG. 5B) may be spaced apart from the heat dissipation sheet 720. The heat dissipation sheet 720 may be utilized as a heat spreader for spreading or dispersing heat together with the conductive sheet 710. In consideration of the fact that the lower the dielectric constant is, the more the radiation performance of the first conductive pattern 540 or the second conductive pattern 550 (or the third conductive pattern 560 or the fourth conductive pattern 570 in FIG. 5B) is secured reliably, and in consideration of the fact that the higher the thermal conductivity is, the higher the heat dissipation efficiency is, the heat dissipation sheet 720 may be implemented with various materials.

In various embodiments, referring to FIG. 5A, the electronic device 500 may include at least one coil disposed between the battery 592 and the rear plate 580. For example, an FPCB including at least one coil may be disposed between the battery 592 and the rear plate 580. The at least one coil may be a planar-type helical coil (e.g., a flat coil) disposed on one surface of the FPCB facing the rear plate 580. The at least one coil may be an antenna for NFC communication, wireless charging, and/or MST communication. When viewed from above the rear plate 580, the conductive sheet 710 of FIG. 8 may not be overlapped with the at least one coil of the FPCB, whereby the radiation performance for the at least one coil can be secured. The heat dissipation sheet 720 of FIG. 8 may cover at least a part of the at least one coil of the FPCB. The heat dissipation sheet 720 of FIG. 8 may spread or disperse heat emitted from the at least one coil. According to various embodiments, the FPCB including the at least one coil may also include a thermally conductive layer such as graphite. The heat dissipation sheet 720 of FIG. 8 may be implemented with various materials in consideration of the fact that the lower the dielectric constant is, the more the radiation performance of the at least one coil is secured reliably, and in consideration of the fact that the higher the thermal conductivity is, the higher the heat dissipation efficiency is. For example, the lower the dielectric constant of the heat dissipation sheet 720 of FIG. 8 is, the more the effect on the magnetic flux of the at least one coil may be reduced. According to various embodiments, a shielding layer, such as ferrite, may be included between the at least one coil and the battery 592, and the shielding layer may allow the magnetic flux from the at least one coil to be formed substantially toward the rear plate 580. The shielding layer may intensively absorb a frequency band used in wireless communication using the at least one coil, and may reduce an electromagnetic wave absorption rate in other frequency bands.

Referring to FIG. 8, in various embodiments, an additional conductive sheet 730 acting as a heat spreader may be disposed on the third surface 581 of the rear plate 580 so as not to be overlapped with at least one antenna radiator.

Referring to FIG. 8, in an embodiment, the rear plate 580 may include a specific portion 702 facing the camera module 594 of FIG. 5A. For example, the specific portion 702 may have openings 703 and a support structure 704 for the camera module 594 (e.g., the second camera module 312 and/or the flash 313 in FIG. 3B). The conductive sheet 710 may be disposed on the third surface 581 while avoiding various designated portions such as the specific portion 702.

According to various embodiments, the conductive sheet 710 may have an extended portion thereof with the heat dissipation sheet 720 omitted. In this case, the extended portion may be disposed on the third surface 581 in consideration of electrical effects on various other components of the electronic device 500 as shown in FIG. 5A. For example, based on the radiation performance of at least one antenna radiator, the conductive sheet 710 may be expanded to replace the heat dissipation sheet 720.

Figure 9:
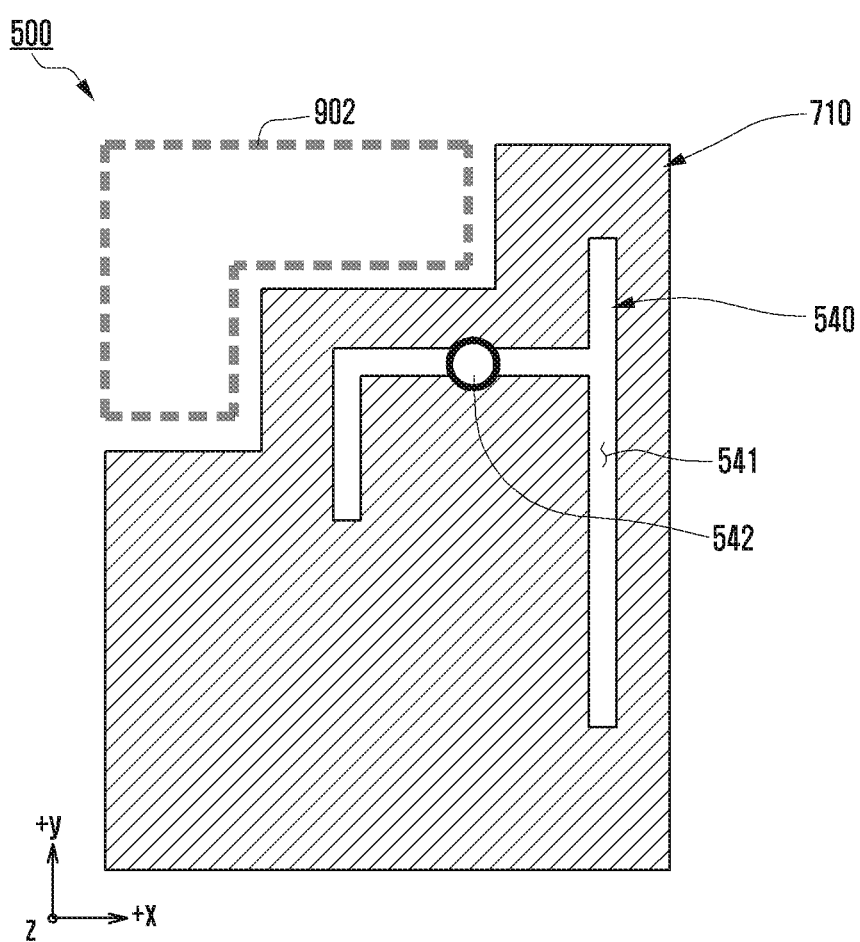
FIG. 9 is a schematic view illustrating an arrangement structure of the conductive sheet and the first conductive pattern in the electronic device of FIG. 8, according to an embodiment of the disclosure.

FIG. 9 is a schematic view illustrating an arrangement structure of the conductive sheet 710 and the first conductive pattern 540 in the electronic device 500 of FIG. 8, according to an embodiment of the disclosure.

FIG. 9 schematically shows the arrangement structure of the conductive sheet 710 and the first conductive pattern 540 when viewed from above the rear plate 580 of FIG. 8. This is simply an example and is not to be construed as a limitation.

Referring to FIG. 9, in an embodiment, when viewed from above the rear plate 580, the conductive sheet 710 may be disposed on the rear plate 580 of FIG. 8 so as to be completely overlapped with the first conductive pattern 540 (or the first portion 541 in FIG. 9) disposed on the second support member 530 in FIG. 9. When a radiation current is supplied to the second portion 542 of the first conductive pattern 540, the first conductive pattern 540 and the conductive sheet 710 may be electromagnetically coupled with each other to form at least one resonant frequency selected or designated. The electromagnetic coupling with the conductive sheet 710 may be made in the entire area of the first conductive pattern 540, and a frequency characteristic change due to the electromagnetic coupling with the conductive sheet 710 may substantially or greatly occur at a feeding part (e.g., the second portion 542) where the radiation current is the maximum. According to various embodiments, the resonant frequency may be lowered because of the electromagnetic coupling between the first conductive pattern 540 and the conductive sheet 710. In other embodiments, the conductive sheet 710 may be disposed on the rear plate 580 of FIG. 9 so as to be partially overlapped with the first conductive pattern 540.

According to an embodiments, the conductive sheet 710 may be disposed to avoid at least one designated portion 902 (e.g., the specific portion 702 in FIG. 8).

Figure 10:
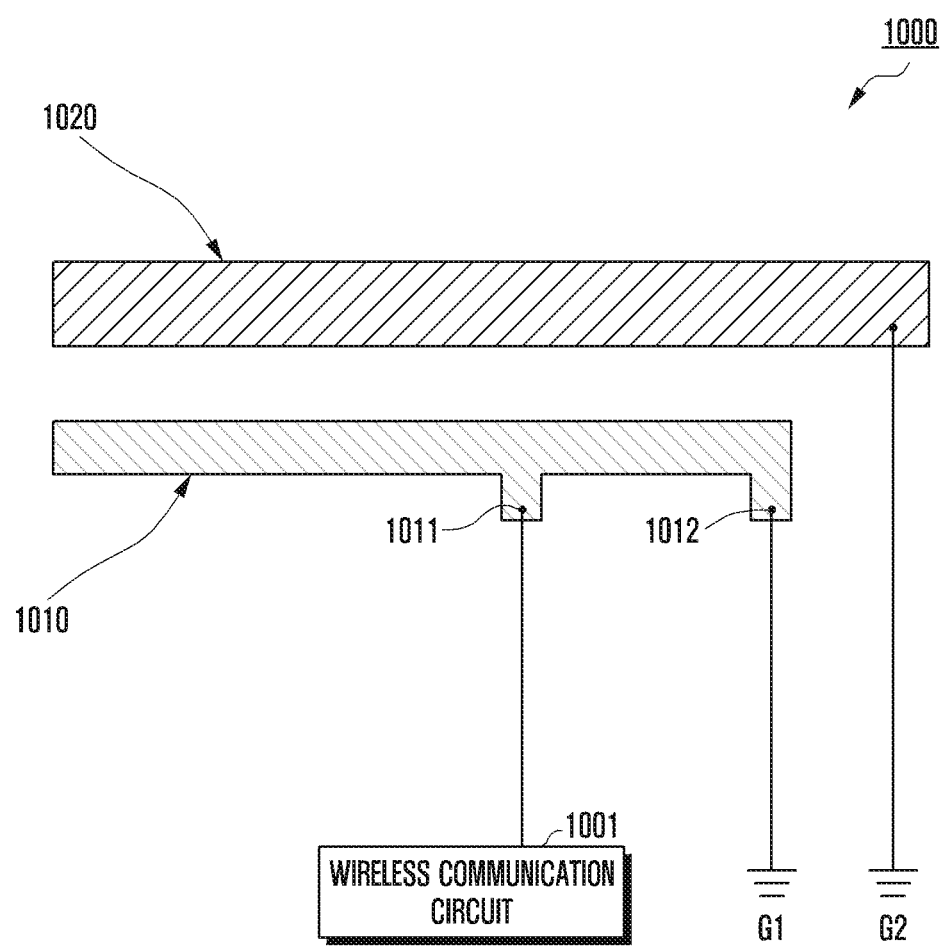
FIG. 10 is a circuit diagram illustrating an antenna system, according to an embodiment of the disclosure.
Figure 11:
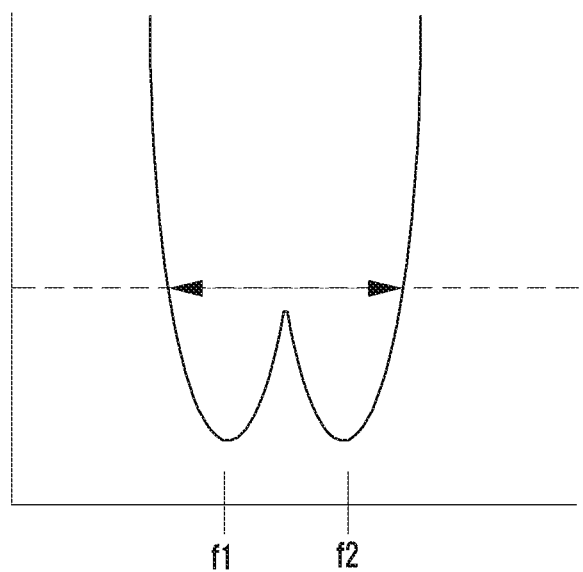
FIG. 11 is a graph showing resonance characteristics in a frequency distribution caused by electromagnetic coupling between two antenna radiators, according to an embodiment of the disclosure.
Figure 12:
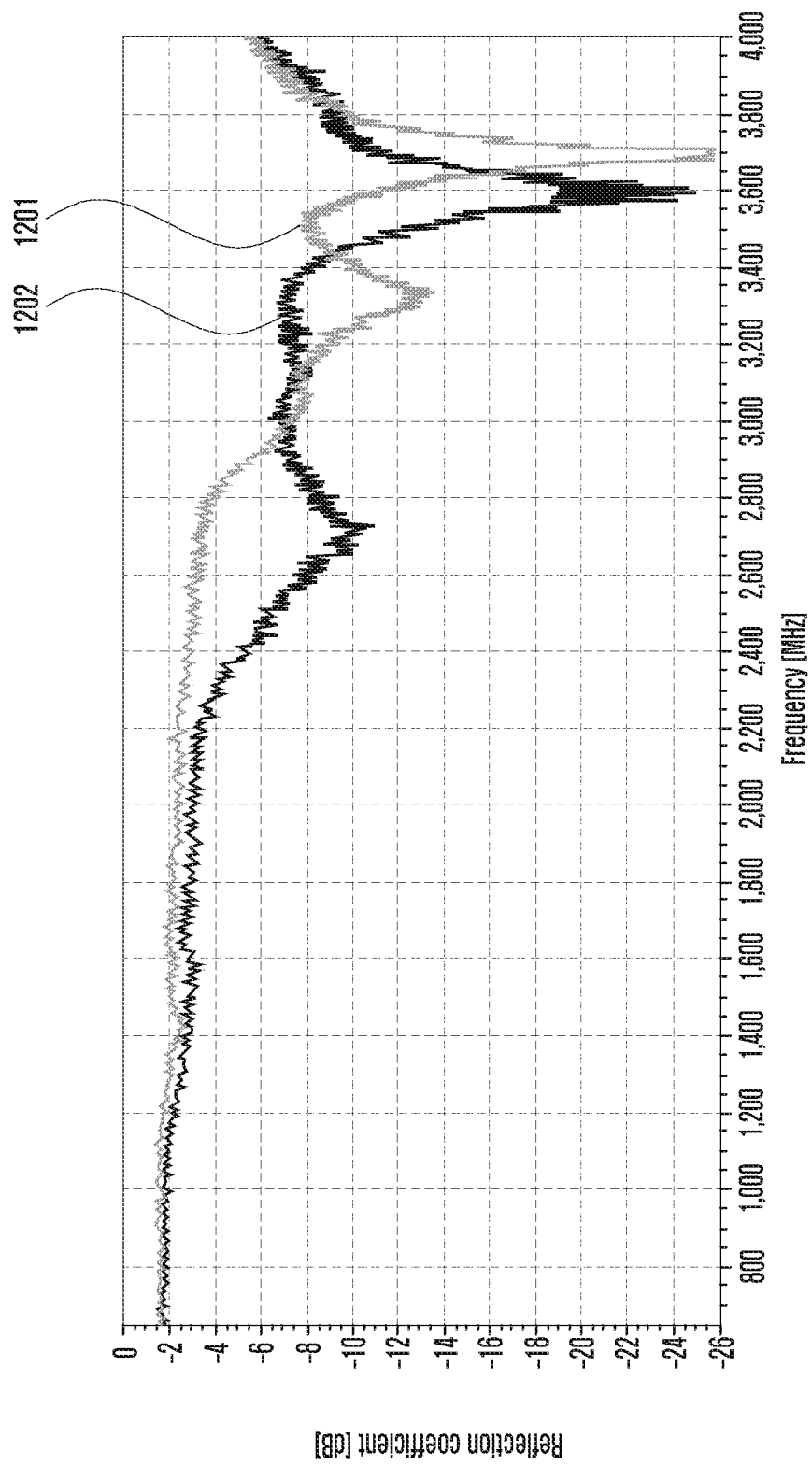
FIG. 12 is a graph showing a reflection coefficient in a frequency distribution for an antenna system, according to an embodiment of the disclosure.
Figure 13:
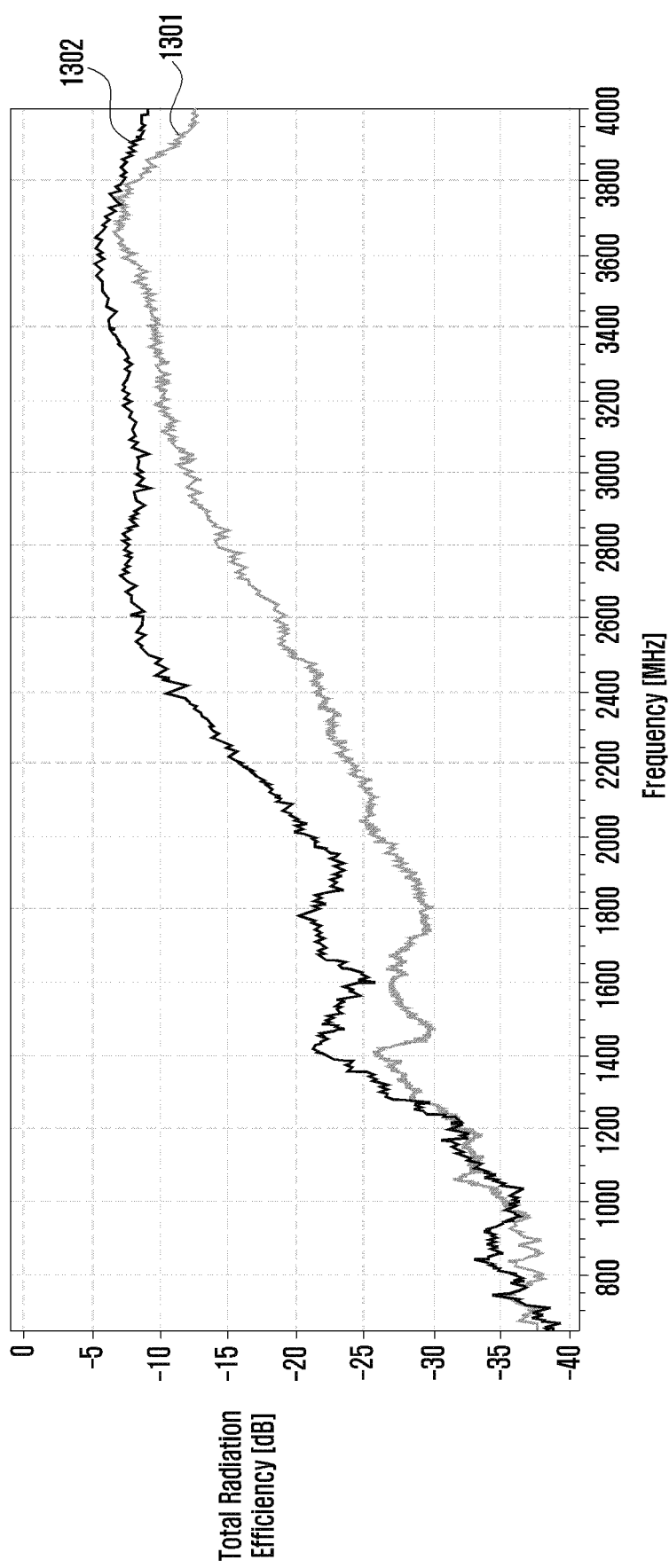
FIG. 13 is a graph showing a total radiation efficiency in a frequency distribution for an antenna system, according to an embodiment of the disclosure.

FIG. 10 is a circuit diagram illustrating an antenna system 1000, according to an embodiment of the disclosure. FIG. 11 is a graph showing resonance characteristics in a frequency distribution caused by electromagnetic coupling between two antenna radiators, according to an embodiment of the disclosure. FIG. 12 is a graph showing a reflection coefficient in a frequency distribution for an antenna system 1000, according to an embodiment of the disclosure. FIG. 13 is a graph showing a total radiation efficiency in a frequency distribution for an antenna system 1000, according to an embodiment of the disclosure.

Referring to FIG. 10, in an embodiment, the antenna system 1000 (or an antenna) may include a first antenna radiator 1010, a second antenna radiator 1020, a wireless communication circuit 1001, and/or grounds G1 and G2. The first antenna radiator 1010 may include the first conductive pattern 540 (or the antenna structure) disposed on the second support member 530 as shown in FIG. 7. The second antenna radiator 1020 may include the conductive sheet 710 disposed under the rear plate 580 as shown in FIG. 7.

According to an embodiment, the first antenna radiator 1010 may include a feeding part 1011 and a ground part 1012. The feeding part 1011 may be electrically connected to the wireless communication circuit 1001, and the ground part 1012 may be electrically connected to the ground G1. The second antenna radiator 1020 may be electrically connected to the ground G2. The ground G1 or G2 may be, for example, a ground included in a PCB (e.g., the first PCB 5911 in FIG. 5A), and/or a ground included in a support member (e.g., the first support member 520 or the second support member 530 in FIG. 5A).

According to an embodiment, the wireless communication circuit 1001 (e.g., the wireless communication module 192 in FIG. 1) may transmit a radiation current (or a radio signal) to the first antenna radiator 1010 through the feeding part 1011. When the current is supplied, the first antenna radiator 1010 (e.g., an inverted F antenna (IFA)) may radiate radio waves while resonating. When the current is supplied, the first antenna radiator 1010 and the second antenna radiator 1020 may be electromagnetically coupled (e.g., capacitive coupling), and thus the second antenna radiator 1020 may operate as an additional antenna radiator. For example, the first antenna radiator 1010 and the second antenna radiator 1020 may be disposed at a distance capable of resonating together based on a wavelength corresponding to a selected or designated frequency.

According to an embodiment, such electromagnetic coupling between the first antenna radiator 1010 and the second antenna radiator 1020 may improve antenna radiation performance. For example, the second antenna radiator 1020 may operate as an antenna booster. Because an antenna radiation area is expanded by the second antenna radiator 1020, the antenna system 1000 may substantially operate as a planar IFA (PIFA).

Referring to FIG. 11, in an embodiment, the antenna system 1000 using the electromagnetic coupling of the first antenna radiator 1010 and the second antenna radiator 1020 may expand a bandwidth to have two resonant frequencies f1 and f2 in a selected or designated frequency band or in a broadband. According to various embodiment, the antenna system 1000 may form three or more resonant frequencies in a selected or designated frequency band or in a broadband.

Referring to FIG. 12, reference numeral 1201 indicates a reflection coefficient in a frequency distribution for an antenna system using the first antenna radiator 1010 without the second antenna radiator 1020. On the other hand, reference numeral 1202 indicates a reflection coefficient in a frequency distribution for the antenna system 1000 including both the first antenna radiator 1010 and the second antenna radiator 1020. As indicated by the reference numerals 1201 and 1202, adding the second antenna radiator 1020 electromagnetically coupled with the first antenna radiator 1010 may shift the resonant frequency to a designated frequency or by a specified amount (i.e., about 3.3 GHz to about 3.8 GHz).

Referring to FIG. 13, reference numeral 1301 indicates a total radiation efficiency in a frequency distribution for an antenna system using the first antenna radiator 1010 without the second antenna radiator 1020. On the other hand, reference numeral 1302 indicates a total radiation efficiency in a frequency distribution for the antenna system 1000 including both the first antenna radiator 1010 and the second antenna radiator 1020. As indicated by the reference numerals 1301 and 1302, adding the second antenna radiator 1020 electromagnetically coupled with the first antenna radiator 1010 may increase a total radiation efficiency (or radiation performance) in at least some frequency bands. For example, the electromagnetic coupling of the first antenna radiator 1010 and the second antenna radiator 1020 may increase a total radiation efficiency of about 3 dB or more in a selected or designated frequency band by about 3.3 GHz to about 3.8 GHz.

Figure 14:
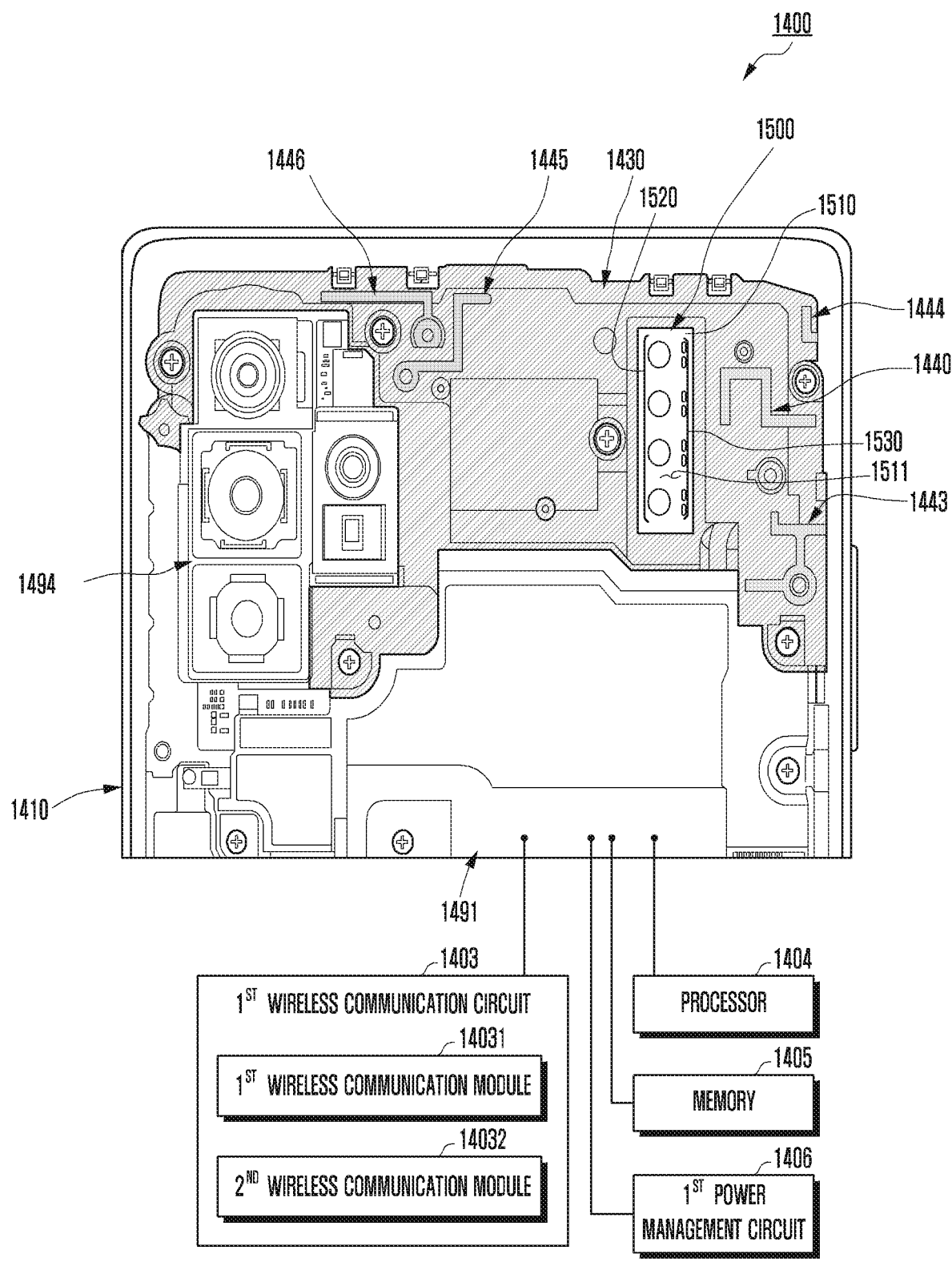
FIG. 14 is a schematic view illustrating an electronic device, according to an embodiment of the disclosure.

FIG. 14 is a schematic view illustrating an electronic device 1400, according to an embodiment of the disclosure.

FIG. 14 shows a state in which a rear plate (e.g., the rear plate 311 in FIG. 4 is removed. Referring to FIG. 14, the electronic device 1400 may include a lateral member 1410, a second support member 1430, an antenna module 1500, a plurality of conductive patterns 1440, 1443, 1444, 1445, and 1446, a substrate assembly 1491, and/or a camera module 1494. According to various embodiments, at least one of the above components of the electronic device 1400 may be identical with or similar to at least one of components of the electronic device 500 shown in FIG. 5A or 5B, and the descriptions thereof may be omitted hereinafter. For example, the lateral member 1410 may be similar to the lateral member 510 in FIG. 5B. A structure in which the plurality of conductive patterns 1440, 1443, 1444, 1445, and 1446 are disposed on the second support member 1430 may be similar to or substantially identical with a structure in which the plurality of conductive patterns 540, 550, 560, and 570 are disposed on the second support member 530 in FIG. 5B. The plurality of conductive patterns 1440, 1443, 1444, 1445, and 1446 may be electrically connected to at least one wireless communication circuit (e.g., the wireless communication module 192 in FIG. 1) included in the substrate assembly 1491. In addition, similar to components (e.g., the first support member 520, the battery 592, and/or the input/output assembly 593) shown in FIG. 5A or 5B, various other components in FIG. 14 may be disposed in the electronic device 1400.

According to an embodiment, the antenna module 1500 may be disposed on the second support member 1430. The antenna module 1500 may include a first antenna array 1520 or a second antenna array 1530 disposed on a first surface 1511 thereof facing a rear plate (e.g., the rear plate 311 of FIG. 4). Compared to the plurality of conductive patterns 1440, 1443, 1444, 1445, and 1446, the antenna module 1500 may transmit/receive a signal having a higher frequency (e.g., a millimeter wave) through the first antenna array 1520 or the second antenna array 1530.

Figure 15A:
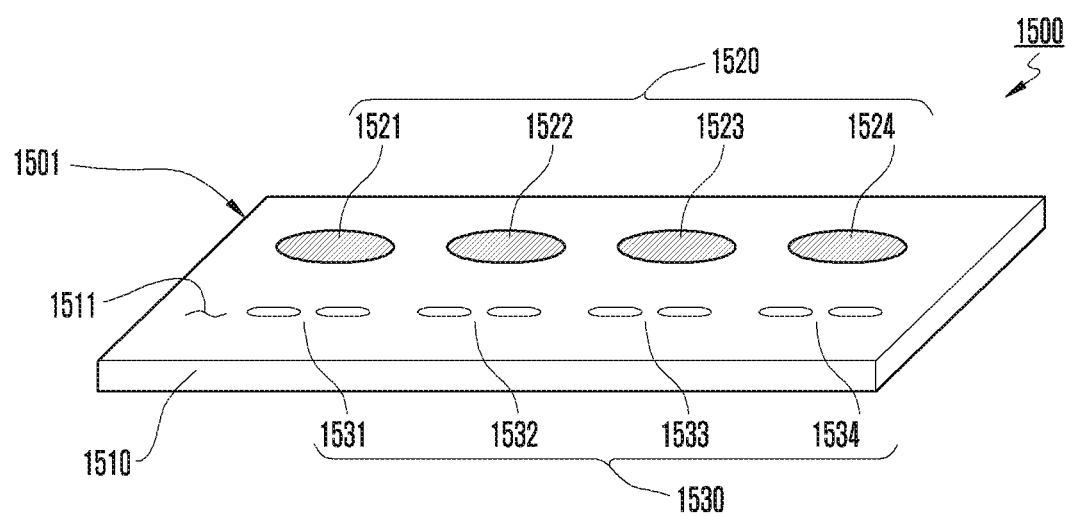
FIG. 15A is a perspective view illustrating the antenna module of FIG. 14, according to an embodiment of the disclosure.
Figure 15B:
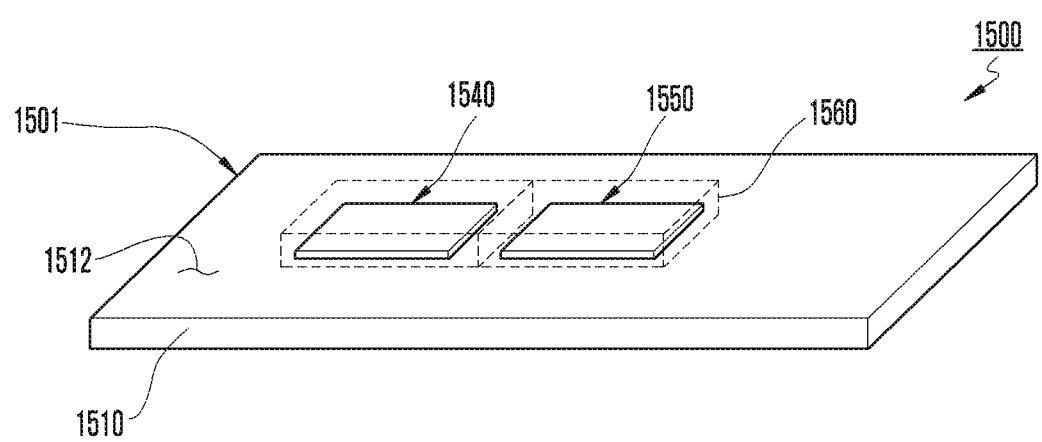
FIG. 15B is a perspective view illustrating the antenna module of FIG. 14, according to an embodiment of the disclosure.

FIGS. 15A and 15B are perspective views illustrating the antenna module 1500 of FIG. 14, according to an embodiment of the disclosure.

Referring to FIGS. 15A and 15B, in an embodiment, the antenna module 1500 may include an antenna structure 1501, a second wireless communication circuit 1540, and/or a second power management circuit 1550. The antenna module 1500 may be, for example, the third antenna module 246 shown in FIG. 2.

According to an embodiment, the antenna structure 1501 may include a PCB 1510 on which the first antenna array 1520 and the second antenna array 1530 are disposed. The PCB 1510 may have a first surface 1511 and a second surface 1512 disposed opposite the first surface 1511. The first antenna array 1520 may include a plurality of first antenna elements 1521, 1522, 1523, and 1524 disposed on the first surface 1511 or near the first surface 1511 inside the PCB 1510. The plurality of first antenna elements 1521, 1522, 1523, and 1524 may have substantially the same shape and may be disposed at regular intervals. The second antenna array 1530 may include a plurality of second antenna elements 1531, 1532, 1533, and 1534 disposed on the first surface 1511 or near the first surface 1511 inside the PCB 1510. The plurality of second antenna elements 1531, 1532, 1533, and 1534 may have substantially the same shape and may be disposed at regular intervals. The PCB 1510 may include a plurality of conductive layers (e.g., conductive pattern layers) and a plurality of non-conductive layers (e.g., insulating layers) stacked alternately with the plurality of conductive layers. The plurality of first antenna elements 1521, 1522, 1523, and 1524 and the plurality of second antenna elements 1531, 1532, 1533, and 1534 may be, for example, implemented with at least some of the plurality of conductive layers. According to various embodiments, the number or locations of the antenna arrays and the number or locations of the antenna elements included in each antenna array may be varied without being limited to the example shown in FIG. 15A.

According to an embodiment, the plurality of first antenna elements 1521, 1522, 1523, and 1524 may operate as a patch antenna. The plurality of second antenna elements 1531, 1532, 1533, and 1534 may operate as a dipole antenna.

According to an embodiment, the second wireless communication circuit 1540 may be disposed on the second surface 1512 of the PCB 1510 through a conductive bonding member such as solder. In addition, the second wireless communication circuit 1540 may be electrically connected to the plurality of first antenna elements 1521, 1522, 1523, and 1524 and the plurality of second antenna elements 1531, 1532, 1533, and 1534 through wires (e.g., an electrical path formed of a conductive pattern and a via) included in the PCB 1510. The second wireless communication circuit 1540 may be an RFIC (e.g., the third RFIC 226 in FIG. 2).

According to an embodiment, the plurality of first antenna elements 1521, 1522, 1523, and 1524 may be directly fed with power by the second wireless communication circuit 1540, thereby operating as an antenna radiator.

According another embodiment, each of the first antenna elements 1521, 1522, 1523, and 1524 may be utilized as a dummy element (e.g., a dummy antenna, a dummy patch, or a conductive patch). The dummy element may be physically separated from any other conductive element, thus being in an electrically floating state.

According to an embodiment, the antenna structure 1501 may include a ground plane (or a ground layer) implemented with at least some of the plurality of conductive layers included in the PCB 1510. The ground plane may be disposed between the first antenna array 1520 and the second surface 1512 and may be overlapped at least partially with the first antenna array 1520 when viewed toward the first surface 1511.

According to various embodiments, the plurality of second antenna elements 1531, 1532, 1533, and 1534 included in the second antenna array 1530 may be directly or indirectly fed with power, thereby operating as an antenna radiator (e.g., a dipole antenna). When viewed from above the first surface 1511, the ground plane included in the PCB 1510 may be disposed so as not to be overlapped with the second antenna array 1530.

According to an embodiment, the second power management circuit 1550 may be disposed on the second surface 1512 of the PCB 1510 through a conductive bonding member such as solder. In addition, the second power management circuit 1550 may be electrically connected to the second wireless communication circuit 1540 or various other components (e.g., connectors or passive elements) disposed in/on the PCB 1510 through wires (e.g., an electrical path formed of a conductive pattern and a via) included in the PCB 1510. The second power management circuit 1550 may be a PMIC.

According to various embodiments, the antenna module 1500 may further include a shielding member 1560 disposed on the second surface 1512 to surround at least one of the second wireless communication circuit 1540 or the second power management circuit 1550. The shielding member 1560 may electromagnetically shield the second wireless communication circuit 1540 and/or the second power management circuit 1550. For example, the shielding member 1560 may include a conductive member such as a shield can. In another example, the shielding member 1560 may include a protective member such as urethane resin, and a conductive paint such as electromagnetic interference (EMI) paint coated on the protective member.

According to various embodiments, the antenna module 1500 may further include a frequency adjusting circuit, such as a tuner or a passive element, disposed on the PCB 1510. The frequency adjusting circuit may shift the resonant frequency, or impedance matching, to a designated frequency or by a specified amount.

Referring to FIG. 14, in an embodiment, the electronic device 1400 may include a first wireless communication circuit 1403 (e.g., the wireless communication module 192 in FIG. 1) electrically connected to a PCB (e.g., the first PCB 5911 in FIG. 5A) included in the substrate assembly 1491, a processor 1404 (e.g., the processor 120 in FIG. 1), a memory 1405 (e.g., the memory 130 in FIG. 1), and/or a first power management circuit 1406 (e.g., the power management module 188 in FIG. 1). The first wireless communication circuit 1403, the processor 1404, the memory 1405, and/or the first power management circuit 1406 may be disposed on the PCB in the substrate assembly 1491 through a conductive bonding member such as solder. The plurality of conductive patterns 1440, 1443, 1444, 1445, and 1446 may be electrically connected to the PCB in the substrate assembly 1491 through various electrical paths.

According to an embodiment, the PCB 1510 of the antenna module 1500 may be disposed substantially in parallel with the PCB (e.g., the first PCB 5911 in FIG. 5A) included in the substrate assembly 1491. According to various embodiments, the PCB 1510 of the antenna module 1500 may be disposed so as not to be parallel with the PCB included in the substrate assembly 1491. For example, the PCB 1510 may be disposed such that the first surface 1511 thereof substantially faces the lateral member 1410.

According to an embodiment, the antenna module 1500 may be electrically connected to the PCB (e.g., the first PCB 5911 in FIG. 5A) in the substrate assembly 1491 through an FPCB. According to various embodiments, the FPCB may be replaced with any other electrical path such as a coaxial cable. According to various embodiments, the antenna module 1500 may be electrically connected to the PCB in the substrate assembly 1491 through various electrical paths such as a board-to-board connector or an interposer.

According to an embodiment, through the first antenna array 1520 or the second antenna array 1530, the second wireless communication circuit 1540 of the antenna module 1500 may transmit and/or receive a first signal of a certain frequency band which is at least ranging from about 3 GHz to about 100 GHz. For example, the second wireless communication circuit 1540 may up-convert or down-convert a frequency of a signal to be transmitted or received. The second wireless communication circuit 1540 may receive an intermediate frequency (IF) signal from a second wireless communication module 14032 of the first wireless communication circuit 1403, and then up-convert the received IF signal into an RF signal. The second wireless communication circuit 1540 may down-convert an RF signal (e.g., a millimeter wave) received through the first antenna array 1520 or the second antenna array 1530 into an IF signal, and then provide the IF signal to the second wireless communication module 14032 of the first wireless communication circuit 1403.

According to an embodiment, at least some of the plurality of conductive layers included in the PCB 1510 of the antenna module 1500 may include a transmission line (e.g., an RF line) between an antenna array (e.g., the first antenna array 1520 or the second antenna array 1530) and the second wireless communication circuit 1540. The transmission line is a structure for transmitting a frequency signal (e.g., voltage or current) and may be a conductive system using a wave transfer function by electrical parameters (e.g., resistance, inductance, conductance, or capacitance per unit length). For example, some of the plurality of conductive layers included in the PCB 1510 of the antenna module 1500 may include an electrical path for supplying power to the antenna array (e.g., the first antenna array 1520 or the second antenna array 1530) from the second wireless communication circuit 1540.

The processor 1404 may execute software to control at least one component (e.g., hardware or software component) of the electronic device 1400 electrically connected thereto, and may also perform processing or arithmetic operation of various data. The processor 1404 may transmit and/or receive a signal through the first wireless communication circuit 1403. Also, the processor 1404 may write or read data to or from the memory 1405. In addition, the processor 1404 may perform functions of a protocol stack required for a communication standard. At least a part of the first wireless communication circuit 1403 and/or the processor 704 may be referred to as a CP.

According to an embodiment, the first wireless communication circuit 1403 may perform functions for transmitting/receiving a signal through a radio channel. The first wireless communication circuit 1403 may perform a function of changes between a baseband signal and a bit string in accordance with a physical layer standard of the system. For example, in case of data transmission, the first wireless communication circuit 1403 may generate complex symbols by encoding and modulating a transmission bit string. Also, in case of data reception, the first wireless communication circuit 1403 may restore a reception bit string by demodulating and decoding a baseband signal. The first wireless communication circuit 1403 may up-convert an RF signal and then transmit it through at least one antenna, and also down-convert an RF signal, received through at least one antenna, into a baseband signal. The first wireless communication circuit 1403 may include components such as a transmission filter, an amplifier, a mixer, an oscillator, a digital-to-analog converter (DAC), and/or an analog-to-digital converter (ADC).

According to an embodiment, the first wireless communication circuit 1403 may include a plurality of wireless communication modules for processing signals of different frequency bands. For example, the first wireless communication circuit 1403 may include the plurality of wireless communication modules to support different wireless access techniques. Such different wireless access techniques may include, for example, a Bluetooth low energy (BLE) technique, a WiFi technique, a WiFi Gigabyte (WiGig) technique, and/or a cellular network technique (e.g., LTE). In addition, such different frequency bands may include a super high frequency (SHF) (e.g., about 2.5 GHz or about 5 GHz) band and a millimeter wave (e.g., about 60 GHz) band.

According to an embodiment, the first wireless communication circuit 1403 may include a baseband processor, at least one communication circuit (e.g., an IF integrated circuit (IFIC)), and/or an RFIC. The baseband processor included in the first wireless communication circuit 1403 may be different from the processor 1404 (e.g., an AP).

According to an embodiment, the first wireless communication circuit 1403 may include the first wireless communication module 14031 and/or the second wireless communication module 14032. The electronic device 1400 may further include one or more interfaces for supporting inter-chip communication between the first wireless communication circuit 1403 and the processor 1404. The processor 1404 and each of the first wireless communication module 14031 and the second wireless communication module 14032 may transmit/receive data (or signals) using such an inter-chip interface (e.g., an inter-processor communication channel).

According to an embodiment, each of the first wireless communication module 14031 and the second wireless communication module 14032 may provide an interface for performing communication with other entities. For example, the first wireless communication module 14031 may support wireless communication for a first network (e.g., the first cellular network 292 in FIG. 2) that utilizes the conductive pattern(s) 1440, 1443, 1444, 1445, and/or 1446. For example, the second wireless communication module 14032 may support wireless communication for a second network (e.g., the second cellular network 294 in FIG. 2) that utilizes the antenna module 1500. The first network may include a 4G network, and the second network may include a 5G network. The first network may be associated with WiFi or GPS.

According to an embodiment, the first wireless communication module 14031 may receive a high-frequency signal (hereinafter, an RF signal) related to the first network (e.g., the 4G network) through the conductive pattern(s) 1440, 1443, 1444, 1445, and/or 1446, modulate (e.g., down-convert) the received RF signal into a low-frequency signal (hereinafter, a baseband signal), and transmit the baseband signal to the processor 1404. In addition, the first wireless communication module 14031 may receive a baseband signal related to the first network from the processor 1404, modulate (e.g., up-convert) the received baseband signal into an RF signal, and transmit the RF signal to the air through the conductive pattern(s) 1440, 1443, 1444, 1445, and/or 1446. The first wireless communication module 14031 may include the RFIC. According to various embodiments, when modulating an RF signal into a baseband signal and vice versa, an input of a local oscillator (LO) may be utilized.

According to an embodiment, the second wireless communication module 14032 may receive a baseband signal related to the second network from the processor 1404. Then, the second wireless communication module 14032 may up-convert the baseband signal into an IF signal by using an input (hereinafter, an LO signal) of the local oscillator, and transmit the IF signal to the antenna module 1500. The antenna module 1500 may receive the IF signal from the second wireless communication module 14032. Then, the antenna module 1500 may up-convert the IF signal into an RF signal by using the LO signal, and transmit the RF signal to the air through the first antenna array 1520 and/or the second antenna array 1530 included in the antenna module 1500. The antenna module 1500 may receive an RF signal through the first antenna array 1520 and/or the second antenna array 1530. Then, the antenna module 1500 may down-convert the RF signal into an IF signal by using the LO signal, and transmit the IF signal to the second wireless communication module 14032. The second wireless communication module 14032 may receive the IF signal from the antenna module 1500. Then, the second wireless communication module 14032 may down-convert the IF signal into a baseband signal by using the LO signal, and transmit the baseband signal to the first wireless communication circuit 1403. The second wireless communication module 14032 may include the IFIC. The second wireless communication module 14032 may transmit and/or receive a second signal of a frequency band between about 5 GHz and about 15 GHz.

According to an embodiment, the second wireless communication circuit 1540 of the antenna module 1500 may include a plurality of transmission/reception paths. For example, the second wireless communication circuit 1540 of the antenna module 1500 may include a beamforming system that processes transmission/reception signals such that energy radiated from the plurality of antenna elements of the first antenna array 1520 and/or the second antenna array 1530 is concentrated in a specific direction in space. For example, the beamforming system may form a beam pattern (e.g., a beam width and a beam direction) by adjusting the phase of a current supplied to the plurality of antenna elements of the first antenna array 1520 and/or the second antenna array 1530.

According to an embodiment, the memory 1405 may store codebook information about beamforming. Based on the codebook information, the processor 1404, the second wireless communication module 14032, and/or the second wireless communication circuit 1540 of the antenna module 1500 may efficiently control (e.g., allocate or deploy) multiple beams through the plurality of antenna elements of the first antenna array 1520 and/or the second antenna array 1530.

According to various embodiments, the first wireless communication module 14031 and/or the second wireless communication module 14032 may form one module with the processor 1404. For example, the first wireless communication module 14031 and/or the second wireless communication module 14032 may be integrally formed with the processor 1404. According to some embodiments, the first wireless communication module 14031 and/or the second wireless communication module 14032 may be disposed in one chip or implemented in the form of an independent chip.

According to an embodiment, the processor 1404 and one wireless communication module (e.g., the first wireless communication module 14031) may be integrally formed in one chip (i.e., SoC chip), and the other wireless communication module (e.g., the second wireless communication module 14032) may be formed in another chip.

According to an embodiment, the first power management circuit 1406 may manage power supplied to the electronic device 1400 by using power of a battery (e.g., the battery 592 in FIG. 5A) electrically connected to a PCB (e.g., the first PCB 5911 in FIG. 5A) included in the substrate 1491. The second power management circuit 1550 of the antenna module 1500 may receive power from the first power management circuit 1406 and manage power supplied to the antenna module 1500 by using the received power. For example, the second power management circuit 1550 of the antenna module 1500 may be implemented as at least a part of the PMIC. According to a certain embodiment, the second power management circuit 1550 of the antenna module 1500 may be omitted from the antenna module 1500, and instead the first power management circuit 1406 may manage power supplied to the antenna module 1500.

Figure 16:
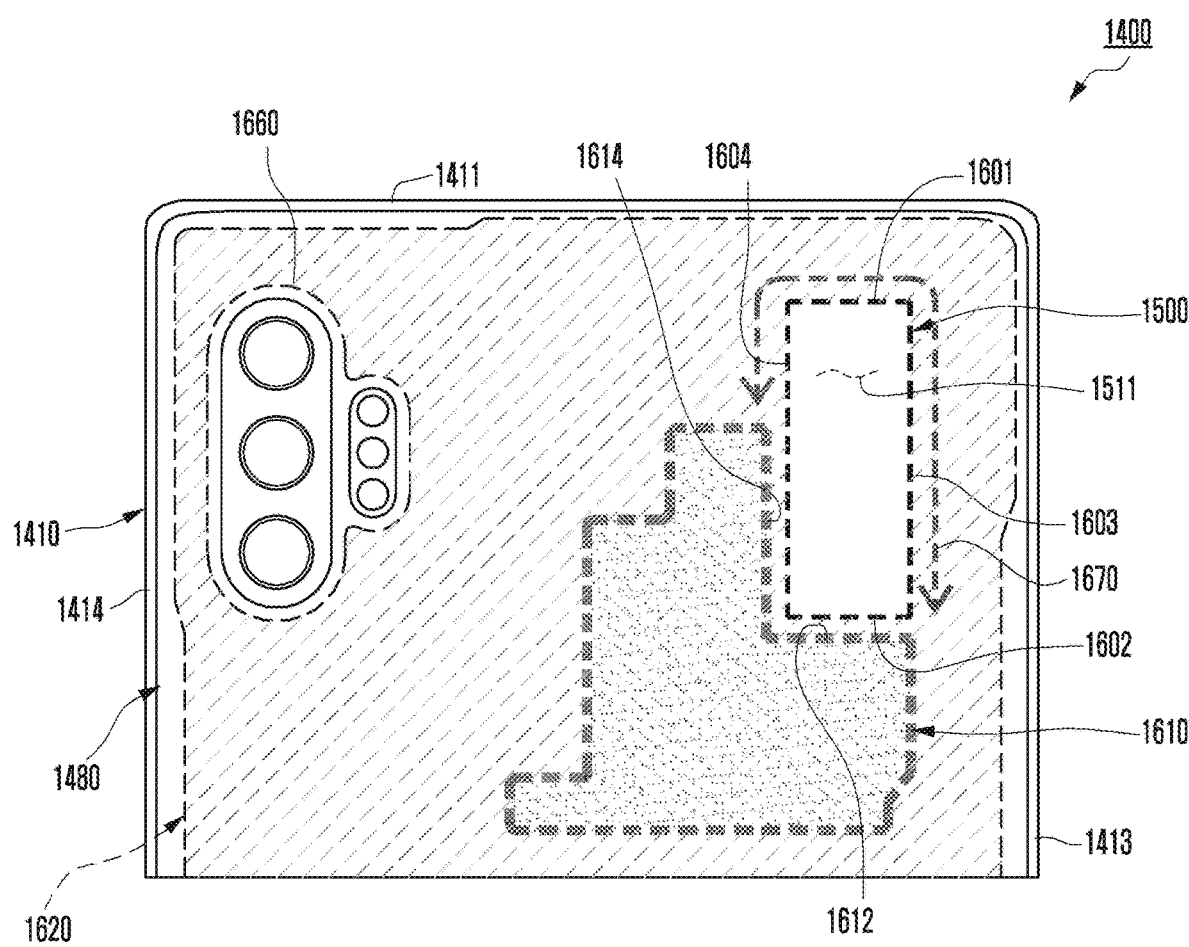
FIG. 16 is a plan view illustrating the electronic device of FIG. 14 with a rear plate, according to an embodiment of the disclosure.

FIG. 16 is a plan view illustrating the electronic device 1400 of FIG. 14 with a rear plate 1480, according to an embodiment of the disclosure.

Referring to FIG. 16, in an embodiment, a conductive sheet 1610 (e.g., the conductive sheet 710 in FIG. 7) may be disposed on the rear plate 1480. The conductive sheet 1610 may be disposed on a surface of the rear plate 1480 (e.g., the third surface 581 in FIG. 7) facing the first surface 1511 of the antenna module 1500. As described above with reference to FIGS. 7 and 8, the conductive sheet 1610 may be implemented in various forms.

According to an embodiment, when viewed from above the rear plate 1480, the conductive sheet 1610 may be overlapped at least in part with at least one conductive pattern (e.g., the first conductive pattern 1440, the second conductive pattern 1443, the third conductive pattern 1444, the fourth conductive pattern 1445, and/or the fifth conductive pattern 1446 in FIG. 14). In addition, the conductive sheet 1610 may be electromagnetically coupled to the overlapped conductive pattern(s), thereby operating as an antenna radiator. According to various embodiments, the conductive sheet 1610 may act as a heat spreader that spreads or disperses heat. In consideration of both the radiation efficiency increasing as the electrical conductivity is low, and the heat dissipation efficiency increasing as the thermal conductivity is high, the conductive sheet 1610 may be formed of various materials. The conductive sheet 1610 may include graphite.

According to an embodiment, the conductive sheet 1610 may be disposed so as not to exert an electromagnetic effect on the antenna module 1500. When viewed from above the rear plate 1480, the conductive sheet 1610 may not be overlapped with the first surface 1511 of the antenna module 1500. Thus, the effect of the conductive sheet 1610 on the radiation performance of the antenna array(s) (e.g., the first antenna array 1520 and/or the second antenna array 1530 in FIG. 14) disposed on the first surface 1511 of the antenna module 1500 may be reduced.

The first surface 1511 of the antenna module 1500 may have a first edge 1601, a second edge 1602 disposed opposite the first edge 1601, a third edge 1603 connecting one end of the first edge 1601 and one end of the second edge 1602, and a fourth edge 1604 disposed opposite the third edge 1603 and connecting the other end of the first edge 1601 and the other end of the second edge 1602. The first edge 1601 and the second edge 1602 may be parallel to each other, and also the third edge 1603 and the fourth edge 1604 may be parallel to each other.

According to an embodiment, when viewed from above the rear plate 1580, the conductive sheet 1610 may be disposed to at least partially surround the first surface 1511 of the antenna module 1500. When viewed from above the rear plate 1580, the conductive sheet 1610 may have an extended shape having a fifth edge 1612 facing at least a part of the second edge 1602 of the first surface 1511, and a sixth edge 1614 facing at least a part of the fourth edge 1604 of the first surface 1511. According to various embodiments, while having the fifth edge 1612 and the sixth edge 1614, the conductive sheet 1610 may be extended in consideration of electrical effects on nearby other antenna radiators.

According to an embodiment, when viewed from above the rear plate 1480, the conductive sheet 1610 may be disposed to be spaced apart from the antenna module 1500 by a certain distance or more based on the wavelength of the antenna module 1500 such that the conductive sheet 1610 and the antenna module 1500 can be electromagnetically isolated from each other. For example, when viewed from above the rear plate 1480, the fifth edge 1612 of the conductive sheet 1610 may be spaced apart from the second edge 1602 of the first surface 1511 by a half or more of the wavelength of the radio wave radiated from the antenna module 1500. Similarly, when viewed from above the rear plate 1480, the sixth edge 1614 of the conductive sheet 1610 may be spaced apart from the fourth edge 1604 of the first surface 1511 by a half or more of the wavelength of the radio wave radiated from the antenna module 1500.

According to various embodiments, when viewed from above the rear plate 1480, the conductive sheet 1610 may be formed to have only the fifth edge 1612 facing the second edge 1602 of the first surface 1511 or to have only the sixth edge 1614 facing the fourth edge 1604 of the first surface 1511. According to various embodiments, when viewed from above the rear plate 1480, the conductive sheet 1610 may be extended to have any edge facing at least a part of the first edge 1601 and/or the third edge 1603 of the first surface 1511 in consideration of electromagnetic effects with various components (e.g., an antenna radiator).

According to various embodiments, the conductive sheet 1610 is not limited to the shape illustrated in FIG. 16 and may be further expanded or reduced in shape in consideration of electrical effects exerted on various components included in the electronic device 1400. According to various embodiments, the conductive sheet 1610 may be extended while avoiding at least one designated portion 1660 (e.g., the at least one designated portion 902 in FIG. 9) of the rear plate 1480. For example, the designated portion 1660 may include a region in which an opening and a support structure associated with a camera module 1650 (e.g., the second camera module 312 and/or the flash 313 in FIG. 3B) are disposed.

According to an embodiment, a heat dissipation sheet 1620 (e.g., the heat dissipation sheet 720 in FIG. 7) may be disposed on the rear plate 1480. The heat dissipation sheet 1620 may be disposed with the conductive sheet 1610 on a surface of the rear plate 1480 (e.g., the third surface 581 in FIG. 7) facing the first surface 1511 of the antenna module 1500. As described above with reference to FIG. 7, the heat dissipation sheet 1620 may be implemented in various forms. For example, the heat dissipation sheet 1620 may be disposed in a region of the rear plate 1480 where the conductive sheet 1610 is not disposed. The heat dissipation sheet 1620 may act as a heat spreader for spreading or dispersing heat together with the conductive sheet 1610.

According to an embodiment, when viewed from above the rear plate 1480, the heat dissipation sheet 1620 may be overlapped at least in part with the first surface 1511 of the antenna module 1500 or the antenna array disposed on the first surface 1511. When viewed from above the rear plate 1480, the heat dissipation sheet 1620 may be overlapped at least in part with the at least one conductive pattern disposed on the second support member 1430 of FIG. 14. According to various embodiments, in order to prevent the radiation performance from being lowered due to the dielectric constant of the heat dissipation sheet 1620, the heat dissipation sheet 1620 may be disposed to be spaced apart from the first surface 1511 of the antenna module 1500, the antenna array disposed on the first surface 1511, or the at least one conductive pattern (e.g., the first conductive pattern 1440, the second conductive pattern 1443, the third conductive pattern 1444, the fourth conductive pattern 1445, and/or the fifth conductive pattern 1446 in FIG. 14).

According to various embodiments, in consideration of the fact that the lower the dielectric constant is, the more the radiation performance of a nearby antenna radiator is secured reliably, and in consideration of the fact that the higher the thermal conductivity is, the higher the heat dissipation efficiency is, the heat dissipation sheet 1620 may be implemented with various materials. The heat dissipation sheet 1620 may be a low-dielectric heat dissipation sheet. The low-dielectric heat dissipation sheet may refer to a heat dissipation sheet having a dielectric constant (a relative dielectric constant) of about 4 or less that does not substantially affect the antenna radiation performance. Also, the low-dielectric heat dissipation sheet may refer to a sheet having a thermal conductivity of about 10 Watts per meter-Kelvin (W/mK) or more.

According to an embodiment, the low-dielectric heat dissipation sheet may be formed variously based on a ceramic material. For example, the ceramic material may include boron nitride (BN) (thermal conductivity: 60 W/mK, dielectric constant: 3.9), aluminum nitride (AlN) (thermal conductivity: 200 W/mK, dielectric constant: 8.5), beryllium oxide (BeO) (thermal conductivity: 340 W/mK, dielectric constant: 6.8), alumina ($Al_2O_3$) (thermal conductivity: 36 W/mK, dielectric constant: 9.5), or silicon carbide (SiC) (thermal conductivity: 270 W/mK, dielectric constant: 40). Various other ceramic materials may be used for the low-dielectric heat dissipation sheet.

According to various embodiments, the low-dielectric heat dissipation sheet may be a polymer sheet based on a ceramic filler (e.g., BN, AlN, or $Al_2O_3$).

According to various embodiments, the low-dielectric heat dissipation sheet may be formed by processing a ceramic raw material (e.g., BN, AlN, or $Al_2O_3$) in a sheet form.

According to various embodiments, the low-dielectric heat dissipation sheet may be a sheet using a low-dielectric coating filler. For example, the low-dielectric heat dissipation sheet may be formed by coating a material having a low dielectric constant on a material having a high dielectric constant to lower the dielectric constant.

According to various embodiments, the low-dielectric heat dissipation sheet may be formed by combining 90% of boron nitride (BN) having a relative dielectric constant of 4 and 10% of a rubber binder having a relative dielectric constant of 2.

According to various embodiments, the low-dielectric heat dissipation sheet may be provided based on various other materials.

According to an embodiment, the antenna module 1500 may have directivity to concentrate electromagnetic energy in a specific direction or to transmit/receive waves. For example, by the beamforming system, the antenna module 1500 may form a beam pattern in which beams formed from the plurality of antenna elements of the antenna array(s) (e.g., the second antenna array 1520 and/or the third antenna array 1530 in FIG. 14) are combined. The beam pattern, which is an effective area in which the antenna array is capable of radiating or detecting electromagnetic waves, may be formed by combining radiant powers of the plurality of antenna elements of the antenna array. The beam pattern formed by the antenna module 1500 may have lobes, which are radiation groups into which the energy distribution of electromagnetic waves radiated from the antenna array is divided in various directions. The lobes may include beams for coverage for an angular range set toward the rear plate 1480. According to various embodiments, the lobes may also include beams for coverage for an angular range set in a side direction or a lateral direction (e.g., a direction toward the lateral member 1410).

According to an embodiment, surface waves guided through the rear plate 1480 facing the first surface 1511 may be generated by radio waves radiated from the antenna array of the antenna module 1500. The rear plate 1480 is a waveguide through which radio waves radiated from the antenna array of the antenna module 1500 flow and may be a path of a medium through which radio waves flow using the total reflection property. The beamforming system may be set to form a corresponding beam pattern through the antenna array of the antenna module 1500, but surface waves guided through the rear plate 1480 may cause deformation (or distortion) of the beam pattern or reduce beam coverage (i.e., reduce a communication range). For example, surface waves may cause power loss, which may lower antenna radiation performance. For example, at least a part of the electromagnetic field formed from the antenna array of the antenna module 1500 may be reflected from the rear plate 580, and the reflected component may cause compensation and/or interference in the maximum radiation direction (i.e., an antenna boresight direction or the direction of a main lobe), resulting in deformation (or distortion) of the beam pattern. The deformation (or distortion) of the beam pattern may include, for example, the formation of a null between the lobes of the beam pattern. The null may refer to, for example, an ineffective area in which the antenna array cannot radiate or detect electromagnetic waves. The null may indicate, for example, a direction where the radiation intensity is substantially zero. When a radio wave, such as a millimeter wave, having high directivity or sensitive to path loss is transmitted or received through the antenna module 1500, there is a high possibility that surface waves are guided through the rear plate 1480. Due to the deformation or distortion of the beam pattern caused by the surface waves, it is difficult to secure the beam coverage.

According to an embodiment, the conductive sheet 1610 may reduce or suppress the surface waves flowing by leakage of the radio waves, radiated from the antenna module 1500, to the rear plate 1480. This may reduce the deformation or distortion of the beam pattern, thereby securing antenna gain and beam coverage. The conductive sheet 1610 may reduce the deformation or distortion of the radio waves by changing a boundary condition of the radio waves with respect to the rear plate 1480. The conductive sheet 1610 may operate as a wave trap for suppressing surface waves or reducing disturbance waves. The conductive sheet 1610 may operate as a reflector that increases radiation in the maximum radiation direction (i.e., a boresight direction).

According to various embodiments, when viewed from above the rear plate 1480, the electronic device 1400 may include at least one conductor disposed at a nearby place 1670 of the antenna module 1500. For example, the at least one conductor may be at least one component positioned on the antenna module 1500, a conductive structure such as SUS, and/or the like. When viewed from above the rear plate 1480, such a conductor may surround at least in part the edges 1601, 1602, 1603, and 1604 of the first surface 1511 of the antenna module 1500 together with the conductive sheet 1610 disposed on the rear plate 1480. The at least one conductor may reduce the surface waves guided through the rear plate 1480 together with the conductive sheet 1610 disposed on the rear plate 1480. In various embodiments, a variety of electronic components, polymer structures, and/or metal structures are positioned as a medium capable of guiding surface waves at nearby places of the antenna module 1500. Substantially, a structure for suppressing the surface waves through the conductive sheet 1610 disposed on the rear plate 1480 may be advantageous in securing the antenna radiation performance of the antenna module 1500.

Figure 17A:
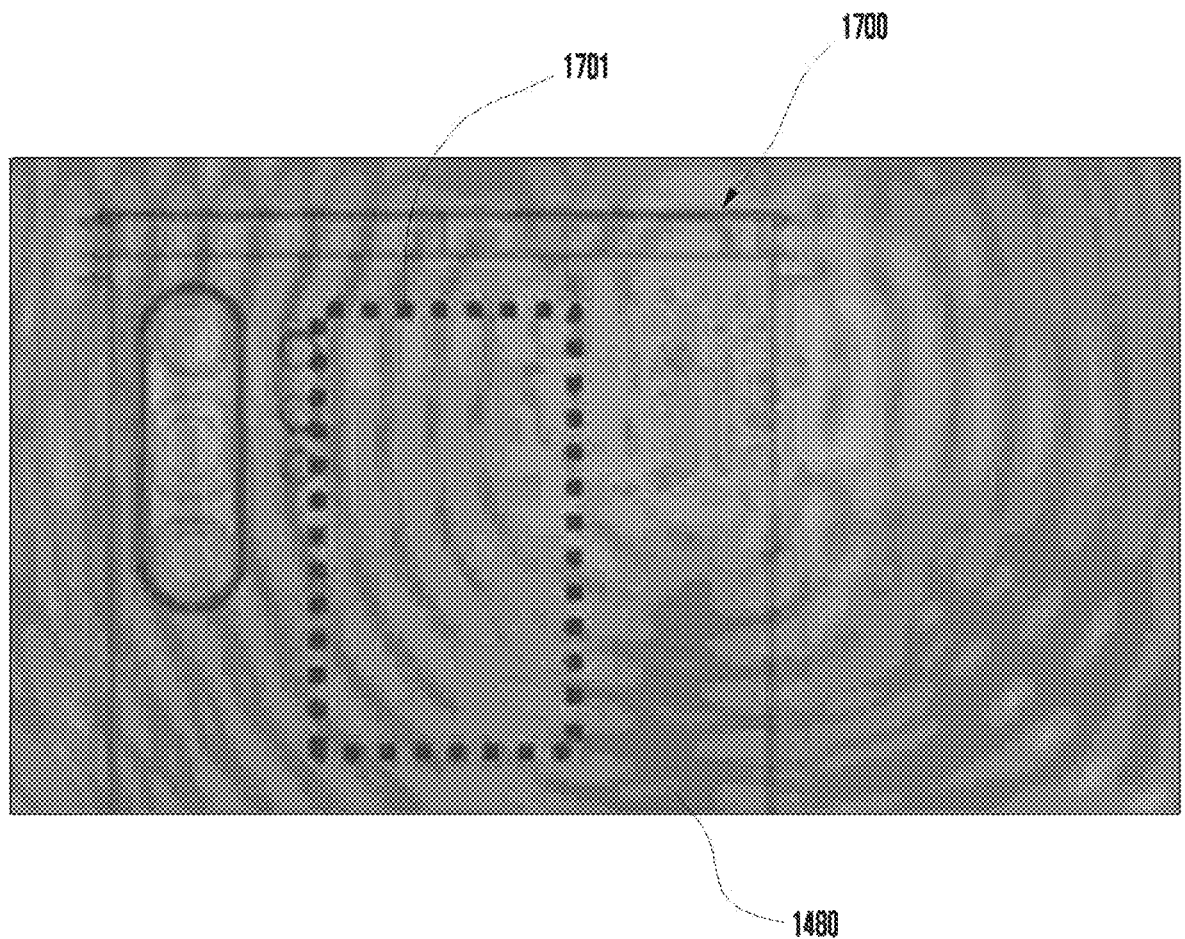
FIG. 17A illustrates an electric field distribution in case where no conductive sheet is disposed on a rear plate, according to an embodiment of the disclosure.
Figure 17B:
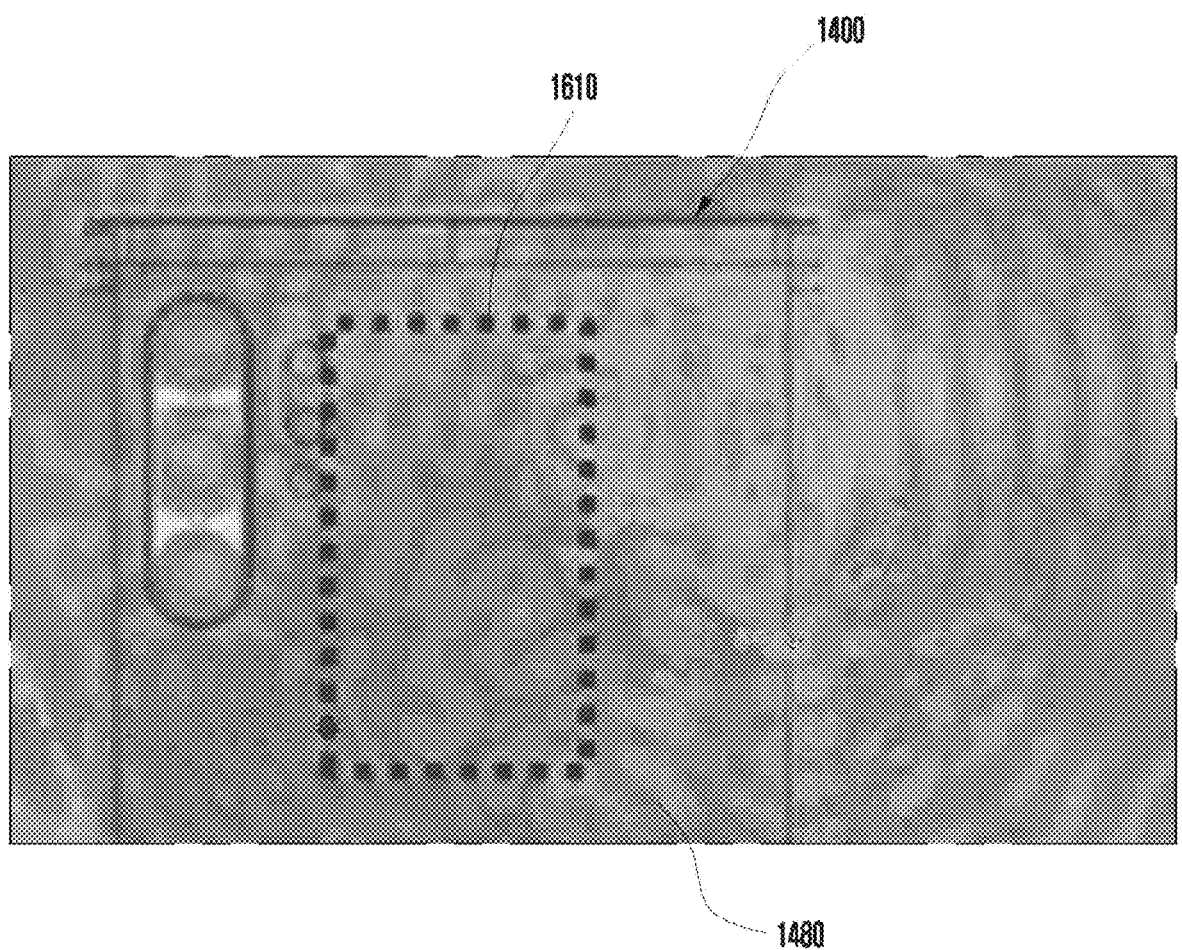
FIG. 17B illustrates an electric field distribution in case where a conductive sheet is disposed on a rear plate, according to an embodiment of the disclosure.

FIG. 17A illustrates an electric field distribution in case where no conductive sheet is disposed on a rear plate 1480, according to an embodiment of the disclosure. FIG. 17B illustrates an electric field distribution in case where a conductive sheet 1610 on a rear plate 1480 is disposed, according to an embodiment of the disclosure. Referring to FIG. 17B, the conductive sheet 1610 disposed on the rear plate 1480 can reduce the radio waves radiated from the antenna module 1500 from being guided or leaked to the rear plate 1480. On the contrary, referring to FIG. 17A, the radio waves radiated from the antenna module 1500 may be guided or leaked to a portion 1701 in which the conductive sheet 1610 is not disposed.

Figure 18A:
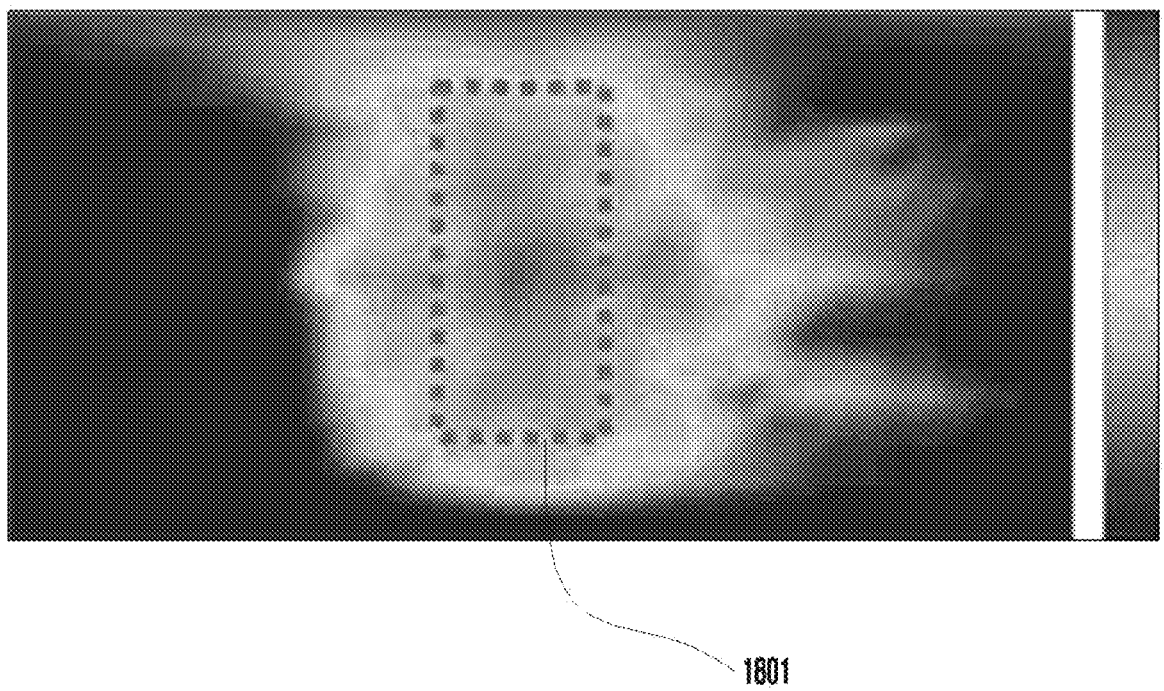
FIG. 18A illustrates a heat map for beam coverage in case where no conductive sheet is disposed on a rear plate, according to an embodiment of the disclosure.
Figure 18B:
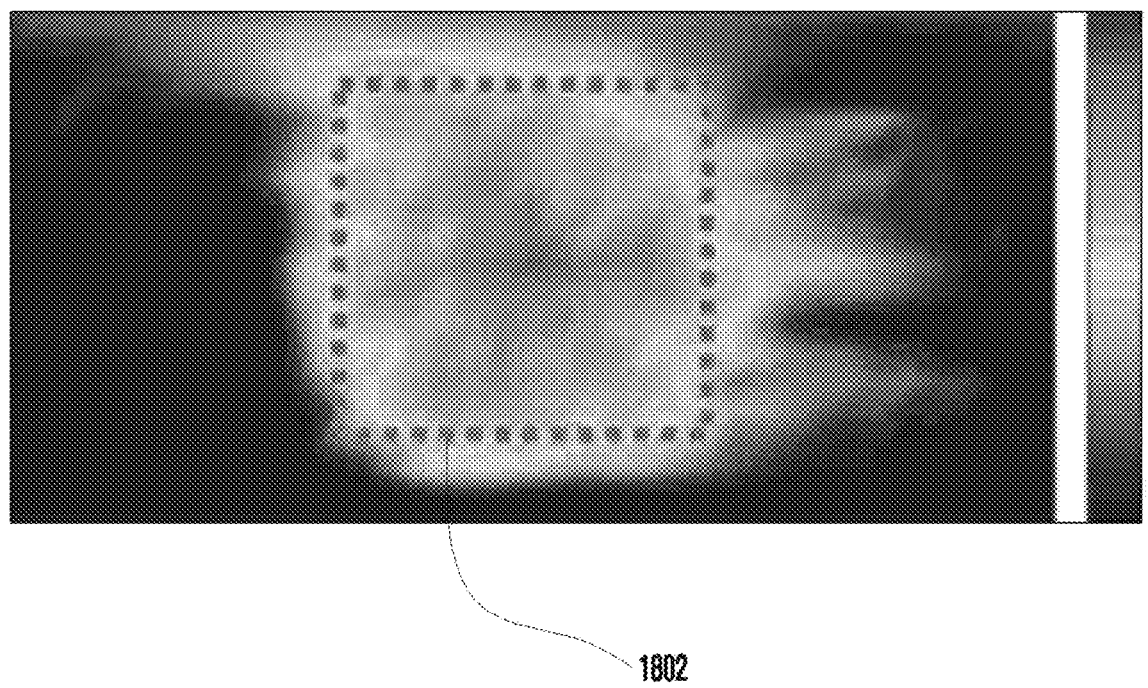
FIG. 18B illustrates a heat map for beam coverage in case where a conductive sheet is disposed on a rear plate, according to an embodiment of the disclosure.

FIG. 18A illustrates a heat map for beam coverage in case where no conductive sheet is disposed on a rear plate 1480, according to an embodiment of the disclosure. FIG. 18B illustrates a heat map for beam coverage in case where a conductive sheet 1610 is disposed on a rear plate 1480, according to an embodiment of the disclosure. Referring to FIGS. 18A and 18B, it can be seen that when the conductive sheet 1610 is disposed on the rear plate 1480, the beam coverage is expanded from a range 1801 shown in FIG. 18A to a range 1802 shown in FIG. 18B.

Figure 19:
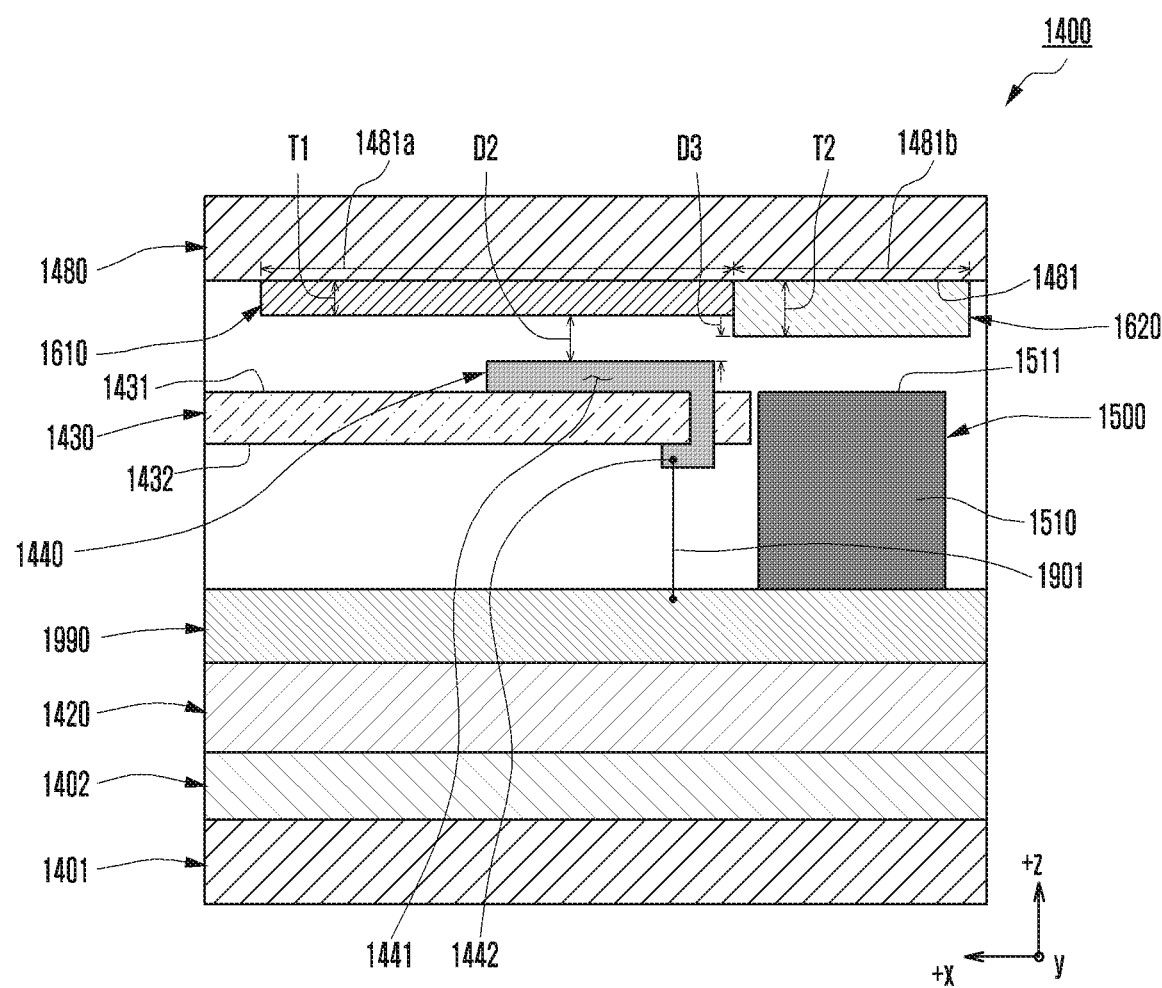
FIG. 19 is a cross-sectional view schematically illustrating the electronic device of FIG. 14, according to an embodiment of the disclosure.

FIG. 19 is a cross-sectional view schematically illustrating the electronic device 1400 of FIG. 14, according to an embodiment of the disclosure.

Referring to FIG. 19, the electronic device 1400 may include a front plate 1401, the rear plate 1480, a first support member 1420, a display 1402, a PCB 1990, the second support member 1430, a first conductive pattern 1440 (hereinafter referred to as "a conductive pattern"), the conductive sheet 1610, the heat dissipation sheet 1620, the antenna module 1500, and/or an electrical path 1901. At least one of such components of the electronic device 1400 may be identical with or similar to at least one of components shown in FIG. 4, and the description thereof may be omitted hereinafter. For example, the front plate 1401 may be similar to the front plate 302 shown in FIG. 4. The first support member 1420, which is a support structure on which the display 1402 (e.g., the display 301 in FIG. 1) and the PCB 1990 (e.g., the PCB 440 in FIG. 4) are disposed, may be similar to the first support member 411 shown in FIG. 4. The second support member 1430, which is a support structure disposed between the rear plate 1480 and the PCB 1990, may be similar to the second support member 460 shown in FIG. 4.

According to an embodiment, the conductive pattern 1440 (e.g., the first conductive pattern 540 in FIG. 8) disposed on the second support member 1430 (e.g., the second support member 530 in FIG. 8) may include a first portion 1441 disposed on one surface 1431 facing the rear plate 1480, and/or a second portion 1442 extended from the first portion 1441 and disposed on the other surface 1432 facing the PCB 1990 (e.g., the PCB 5911 in FIG. 8). The electrical path 1901 may electrically connect the second portion 1442 and the PCB 1990. The electrical path 1901 may include a flexible conductive member such as a C-clip, a pogo-pin, a spring, a conductive PORON™, a conductive rubber, a conductive tape, or a copper connector. The flexible conductive member may be disposed between the second portion 1442 and the PCB 1990 and electrically connect the conductive pattern 1440 and the PCB 1990. The second portion 1442 is a feeding part of the conductive pattern 1440 and may be electrically connected to a wireless communication circuit (e.g., the wireless communication module 192 in FIG. 1 or the first wireless communication module 14031 in FIG. 14) mounted on the PCB 1990. The wireless communication circuit may transmit the radiation current to the conductive pattern 1440 through the second portion 1442.

According to an embodiment, the conductive sheet 1610 (e.g., the conductive sheet 710 in FIG. 8) may be disposed on one surface 1481 (e.g., the third surface 581 in FIG. 7) of the rear plate 1480 facing the conductive pattern 1440. When viewed from above the rear plate 1480, the conductive sheet 1610 may be overlapped, at least in part, with the conductive pattern 1440. The conductive sheet 1610 may be disposed to be spaced apart from the conductive pattern 1440.

According to an embodiment, the conductive sheet 1610 may be electromagnetically coupled with the conductive pattern 1440, thus operating, together with the conductive pattern 1440, as an antenna radiator that transmits and/or receives a signal of a selected or designated frequency. According to various embodiments, the conductive sheet electromagnetically coupled with the conductive pattern 1440 may be implemented in various numbers or forms without being limited to the embodiment of FIG. 19.

According to an embodiment, the conductive sheet 1610 may be disposed so as not to exert an electromagnetic effect on antenna radiators (e.g., the second conductive pattern 1443, the third conductive pattern 1444, the fourth conductive pattern 1445, and the fifth conductive pattern 1446 in FIG. 14) other than the conductive pattern 1440. For example, when viewed from above the rear plate 1480, the conductive sheet 1610 may not be overlapped with the second conductive pattern 1443, the third conductive pattern 1444, the fourth conductive pattern 1445, and/or the fifth conductive pattern 1446 shown in FIG. 14. In addition, when viewed from above the rear plate 1480, the conductive sheet 1610 may be disposed to be spaced apart from the second conductive pattern 1443 (or the third conductive pattern 1444, the fourth conductive pattern 1445, and/or the fifth conductive pattern 1446) by a certain distance or more based on the wavelength of the second conductive pattern 1443 (or the third conductive pattern 1444, the fourth conductive pattern 1445, and/or the fifth conductive pattern 1446) such that the second conductive pattern 1443 (or the third conductive pattern 1444, the fourth conductive pattern 1445, and/or the fifth conductive pattern 1446) of FIG. 14 can be electromagnetically isolated from the conductive sheet 1610. In addition, when viewed from above the rear plate 1480, the conductive sheet 1610 may be disposed to be spaced apart from the second conductive pattern 1443 of FIG. 14 and electromagnetically isolated from the conductive sheet 1610.

According to an embodiment, the conductive sheet 1610 may adjust the frequency of an antenna device (or antenna system) that utilizes the conductive pattern 1440. For example, the conductive sheet 1610 may shift the resonant frequency of the conductive pattern 1440 to a designated frequency or shift the resonant frequency of the conductive pattern 1440 by a specified amount.

According to various embodiments, a structure in which the conductive pattern 1440 is physically separated from the conductive sheet 1610 and overlapped at least in part with the conductive sheet 1610 when viewed from above the rear plate 1480 may expand the bandwidth. For example, the antenna device (or antenna system) including both the conductive pattern 1440 and the conductive sheet 1610 may transmit/receive signals of different frequencies in a selected or designated frequency band.

According to various embodiments, the frequency or bandwidth may be variously adjusted depending on dimensions, such as length, width, or thickness, of the conductive sheet 1610. In addition, the frequency or bandwidth may be variously adjusted depending on a distance (D2) between the conductive sheet 1610 and the conductive pattern 1440. The conductive sheet 1610 may be disposed to be spaced apart from the conductive pattern 1440 within a half of the wavelength of the radio wave reflected from the conductive pattern 1440, thereby being electromagnetically coupled to the conductive pattern 1440. For example, the distance (D2) may range from about 0.30 micrometer (um) to about 0.50 um. When viewed from above the rear plate 1480, the frequency or bandwidth may be variously adjusted depending on the position or area of an overlap between the conductive sheet 1610 and the conductive pattern 1440.

According to various embodiments, the conductive sheet 1610 may be implemented to include a plurality of conductive parts separated from each other. The frequency or bandwidth may be variously adjusted depending on the shape, spacing, or other various factors of the plurality of conductive parts.

According to an embodiment, the conductive sheet 1610 may reduce or suppress surface waves flowing by leakage of radio waves, radiated from the antenna module 1500, to the rear plate 1480. This may reduce the deformation or distortion of a beam pattern, thereby securing antenna gain and beam coverage. The conductive pattern 1440 may be disposed near the antenna module 1500, and the conductive sheet 1610 may be disposed to not be overlapped with the antenna module 1500 but overlapped at least in part with the conductive pattern 1440 when viewed from above the rear plate 1480. The conductive sheet 1610 may perform both a function of operating as an additional antenna radiator by being electromagnetically coupled with the conductive pattern 1440, and a function of reducing or suppressing surface waves in order to secure the radiation performance of the antenna module 1500.

According to an embodiment, the conductive sheet 1610 may contain a thermally conductive material and thereby act as a heat spreader. The conductive sheet 1610 may be formed of a material capable of not only increasing the radiation efficiency together with the conductive pattern 1440, but also rapidly spreading or dispersing heat as the heat spreader. The conductive sheet 1610 may be formed of a graphite having an electrical conductivity smaller than that of copper, thereby ensuring reliable radiation efficiency and also performing smooth heat dissipation. According to various embodiments, the conductive sheet 1610 may be implemented with any other material in consideration of both the radiation efficiency increasing as the electrical conductivity is low, and the heat dissipation efficiency increasing as the thermal conductivity is high.

According to an embodiment, the heat dissipation sheet 1620 (or a polymer layer) (e.g., the heat dissipation sheet 720 in FIG. 7) may be disposed on one surface 1481 (e.g., the third surface 581 in FIG. 7) of the rear plate 1480. For example, the heat dissipation sheet 1620 may be disposed at least in part in a region of the one surface 1481 of the rear plate 1480 where the conductive sheet 1610 is not disposed. The one surface 1481 of the rear plate 1480 may have a first region 1481*a* in which the conductive sheet 1610 is disposed, and a second region 1481*b* in which the heat dissipation sheet 1620 is disposed. The conductive sheet 1610 and the heat dissipation sheet 1620 may adjoin or connect with each other at a boundary between the first region 1481*a* and the second region 1481*b*. The conductive sheet 1610 and the heat dissipation sheet 1620 may be implemented as one composite sheet and attached to the one surface 1481 of the rear plate 1480. According to various embodiments, the conductive sheet 1610 and/or the heat dissipation sheet 1620 may be disposed on the one surface 1481 of the rear plate 1480 in various other forms.

According to an embodiment, the heat dissipation sheet 1620 may be overlapped at least in part with the antenna module 1500 when viewed from above the rear plate 1480. For example, when viewed from above the rear plate 1480, the first surface 1511 of the PCB 1510 included in the antenna module 1500 may be overlapped at least in part with the heat dissipation sheet 1620. The antenna module 1500 may include an antenna array (e.g., the first antenna array 1520 and/or the second antenna array 1530 in FIG. 14) disposed on the first surface 1511 or near the first surface 1511 inside the PCB 1510. In order to prevent the degradation of the radiation performance due to the dielectric constant of the heat dissipation sheet 1620, such an antenna array of the antenna module 1500 may be spaced apart from the heat dissipation sheet 1620. The heat dissipation sheet 1620 may be utilized as a heat spreader for spreading or dispersing heat together with the conductive sheet 1610. In consideration of the fact that the lower the dielectric constant is, the more the radiation performance of the antenna module 1500 is reliably secured, and in consideration of the fact that the higher the thermal conductivity is, the higher the heat dissipation efficiency is, the heat dissipation sheet 1620 may be implemented with various materials.

According to an embodiment, the conductive sheet 1610 and the heat dissipation sheet 1620 may be different in thickness. For example, the thickness (T2) of the heat dissipation sheet 1620 may be greater than the thickness (T1) of the conductive sheet 1610. For example, the thickness (T2) of the heat dissipation sheet 1620 may be about 0.05 millimeter (mm) or more, and the thickness (T1) of the conductive sheet 1610 may be about 0.05 mm or less. The thickness (T2) of the heat dissipation sheet 1620 may be about 0.06 mm, and the thickness (T1) of the conductive sheet 1610 may be about 0.032 mm. In various embodiments, a distance (D3) at which the heat dissipation sheet 1620 is spaced front the first portion 1441 of the conductive pattern 1440 toward the rear plate 1480 may range from about 0.27 um to about 0.47 um.

Figure 20:
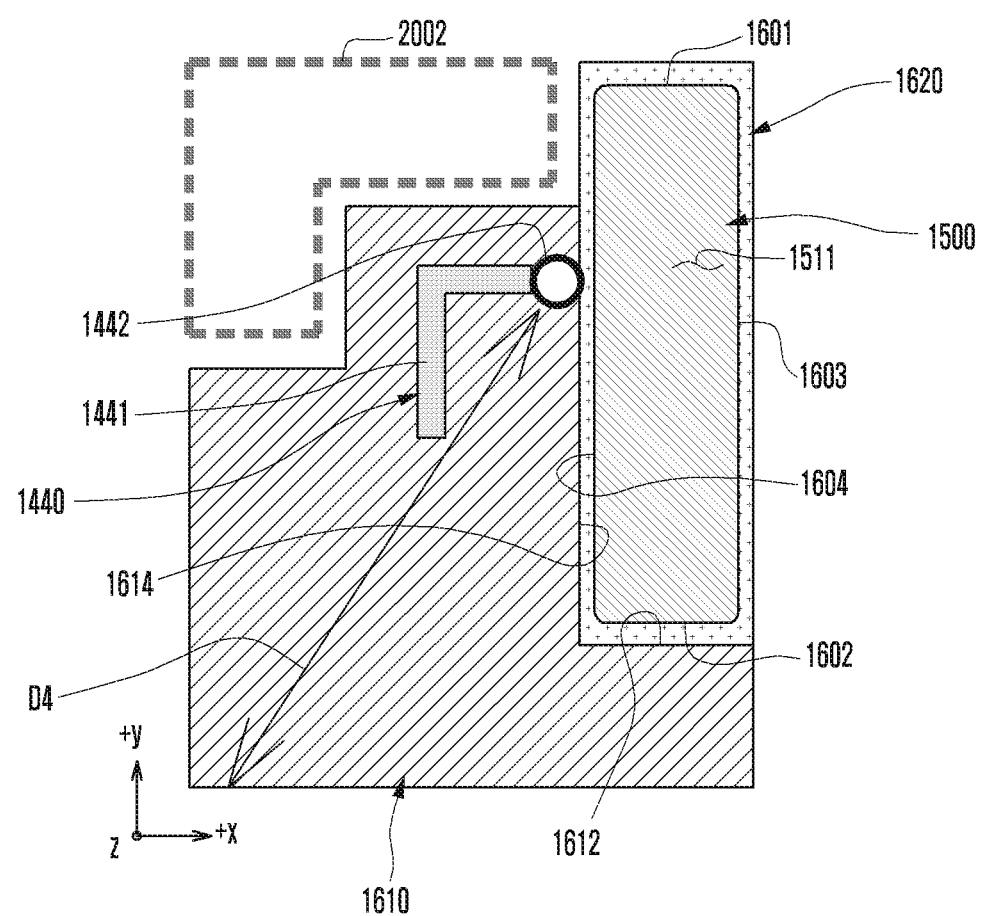
FIG. 20 is a diagram illustrating an arrangement structure of a conductive sheet, a conductive pattern, a heat dissipation sheet, and an antenna module in the electronic device of FIG. 19, according to an embodiment of the disclosure.

FIG. 20 is a diagram illustrating an arrangement structure of a conductive sheet 1610, a conductive pattern 1440, a heat dissipation sheet 1620, and an antenna module 1500 in the electronic device 1400 of FIG. 19, according to an embodiment of the disclosure.

FIG. 20 schematically illustrates, when viewed from above the front plate 1401 of FIG. 19, the arrangement structure of the conductive sheet 1610, the conductive pattern 1440, the heat dissipation sheet 1620, and the antenna module 1500. This is simply an example and is not to be construed as a limitation. Any other arrangement structure may be implemented.

Referring to FIG. 20, in an embodiment, the conductive sheet 1610 may be disposed on the rear plate 1480 of FIG. 19 to be overlapped with a feeding part (or a feeding point) (e.g., the second portion 1442) of the conductive pattern 1440 disposed on the second support member 1430 of FIG. 19. For example, the conductive sheet 1610 may be overlapped completely with the conductive pattern 1440. When the radiation current is supplied to the feeding part (e.g., the second portion 1442) of the conductive pattern 1440, the conductive pattern 1440 and the conductive sheet 1610 may be electromagnetically coupled with each other and thereby form at least one selected or designated resonant frequency. Such electromagnetic coupling may be made with the conductive sheet 1610 in the entire area of the conductive pattern 1440, and a frequency characteristic change due to the electromagnetic coupling with the conductive sheet 1610 may substantially or greatly occur at the feeding part (e.g., the second portion 1442) where the radiation current is maximum. The conductive sheet 1610 may shift the resonant frequency of the conductive pattern 1440 to a designated frequency, or shift the resonant frequency of the conductive pattern 1440 by a specified amount. For example, the resonant frequency may be lowered because of the electromagnetic coupling between the conductive pattern 1440 and the conductive sheet 1610.

According to an embodiment, the size of the conductive sheet 1610 may be determined based on a frequency selected or designated in a wireless communication that utilizes the conductive pattern 1440. The conductive sheet 1610 may be formed in a length of about a (λ)/4 wavelength or more for the selected or designated frequency in the wireless communication utilizing the conductive pattern 1440. For example, a distance (D4) between the feeding part (e.g., the second portion 1442) and an edge of the conductive sheet 1610 may be greater than or equal to about λ/4, which is the length related to the free radiation and resonant frequency characteristics of the antenna. When viewed from above the front plate 1401 or the rear plate 1480 of FIG. 19, the conductive sheet 1610 may be disposed such that the length from the feeding part (e.g., the second portion 1442) to the farthest edge of the conductive sheet 1610 is greater than or equal to about λ/4 for the selected or designated frequency.

According to an embodiment, the conductive sheet 1610 may be disposed so as not to exert an electromagnetic effect on the antenna module 1500. For example, the conductive sheet 1610 may be disposed on the rear plate 1480 of FIG. 19 so as not to be overlapped with the first surface 1511 of the antenna module 1500, whereby the effect of the conductive sheet 1610 on the radiation performance of the antenna module 1500 may be reduced.

According to an embodiment, the conductive sheet 1610 may reduce or suppress the surface waves flowing by leakage of the radio waves, radiated from the antenna module 1500, to the rear plate 1480. This may reduce the deformation or distortion of the beam pattern, thereby securing antenna gain and beam coverage. The first surface 1511 of the antenna module 1500 is rectangular, for example, including the first edge 1601, the second edge 1602, the third edge 1603, and the fourth edge 1604. The conductive sheet 1610 may have an extended shape having the fifth edge 1612 facing at least a part of the second edge 1602 of the first surface 1511, and the sixth edge 1614 facing at least a part of the fourth edge 1604 of the first surface 1511. According to various embodiments, the conductive sheet 1610 may be extended to have any other edge facing at least a part of the first edge 1601 or the third edge 1603 without exerting electromagnetic effects (e.g., electromagnetic coupling) on other antenna radiators around the antenna module 1500.

According to an embodiment, the conductive pattern 1440 may be disposed near the antenna module 1500, and the conductive sheet 1610 disposed thereon may perform both a function of operating as an additional antenna radiator by being electromagnetically coupled with the conductive pattern 1440, and a function of reducing or suppressing surface waves in order to secure the radiation performance of the antenna module 1500.

According to an embodiment, the conductive sheet 1610 may be disposed to be spaced apart from the antenna module 1500 by a certain distance or more based on the wavelength of the antenna module 1500 such that the conductive sheet 1610 and the antenna module 1500 can be electromagnetically isolated from each other. For example, the fifth edge 1612 of the conductive sheet 1610 may be spaced apart from the second edge 1602 of the first surface 1511 by a half or more of the wavelength of the radio wave radiated from the antenna module 1500. Similarly, the sixth edge 1614 of the conductive sheet 1610 may be spaced apart from the fourth edge 1604 of the first surface 1511 by a half or more of the wavelength of the radio wave radiated from the antenna module 1500.

According to various embodiments, when viewed from above the rear plate 1480, the conductive sheet 1610 may be formed to have only the fifth edge 1612 facing the second edge 1602 of the first surface 1511 or to have only the sixth edge 1614 facing the fourth edge 1604 of the first surface 1511. According to various embodiments, when viewed from above the rear plate 1480, the conductive sheet 1610 may be extended to have any edge facing at least a part of the first edge 1601 and/or the third edge 1603 of the first surface 1511 in consideration of electromagnetic effects with various components (e.g., an antenna radiator). For example, the conductive sheet 1610 may be extended to have an edge facing at least a part of the first edge 1601 and/or the third edge 1603 so as to or so as not to perform electromagnetic coupling with other antenna radiators around the antenna module 1500.

According to an embodiment, the heat dissipation sheet 1620 may be disposed on the rear plate 1480 of FIG. 19 so as to be overlapped at least partially with the first surface 1511 of the antenna module 1500. For example, the heat dissipation sheet 1620 may be extended from the fifth edge 1612 or the sixth edge 1614 of the conductive sheet 1610 and thereby overlapped at least in part with the first surface 1511 of the antenna module 1500.

According to an embodiment, in order to prevent the radiation performance from being lowered due to the dielectric constant of the heat dissipation sheet 1620, the first surface 1511 of the antenna module 1500 or the antenna array disposed on the first surface 1511 may be disposed to be spaced apart from the heat dissipation sheet 1620.

According to an embodiment, the rear plate 1480 of FIG. 19 may include at least one designated portion 2002 such as the specific portion 702 shown in FIG. 7. Both the conductive sheet 1610 and the heat dissipation sheet 1620 may be disposed to avoid the at least one designated portion 2002.

According to an embodiment, both the conductive sheet 1610 and the heat dissipation sheet 1620 may be utilized as a heat spreader for spreading or dispersing heat. A material of the conductive sheet 1610 may be selected in consideration of both the radiation efficiency increasing as the electrical conductivity is low, and the heat dissipation efficiency increasing as the thermal conductivity is high. Such a material of the heat dissipation sheet 1620 may be selected in consideration of the fact that the lower the dielectric constant is, the more the radiation performance of the antenna module 1500 is reliably secured, and in consideration of the fact that the higher the thermal conductivity is, the higher the heat dissipation efficiency is. For example, the heat dissipation sheet 1620 may have a thermal conductivity of about 10 W/mK or more, and may be a low-dielectric heat dissipation sheet based on a ceramic material.

Figure 21:
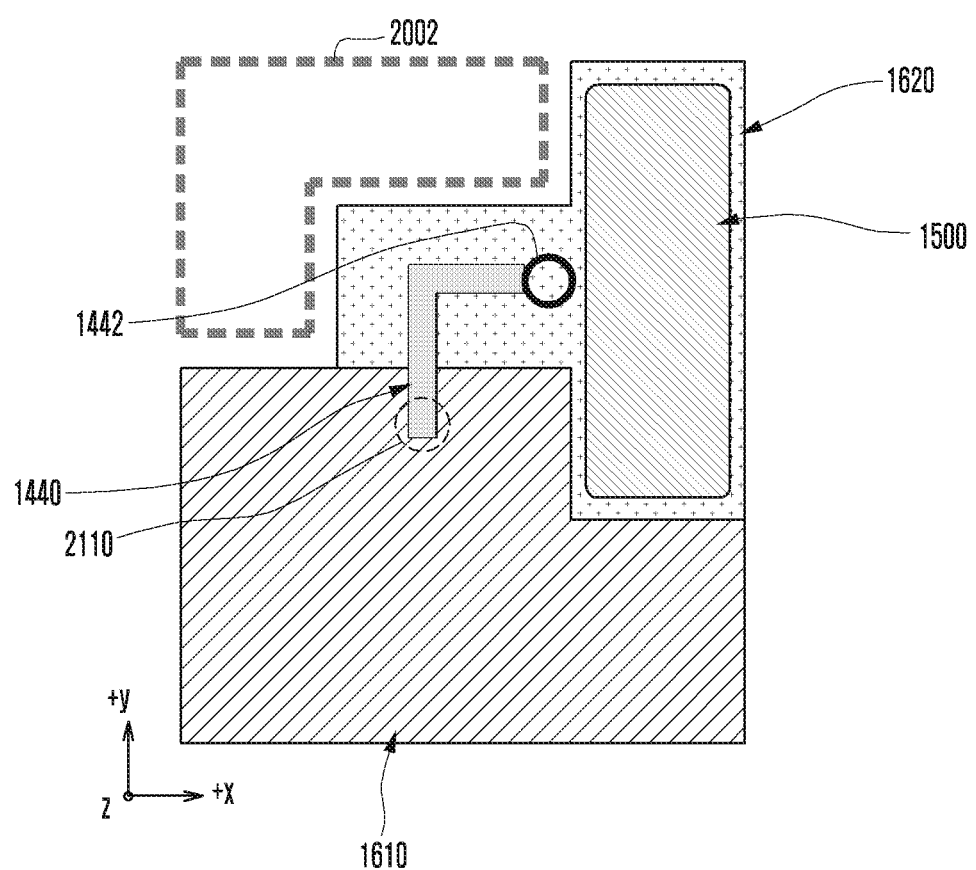
FIG. 21 is a diagram illustrating an arrangement structure of a conductive sheet, a conductive pattern, a heat dissipation sheet, and an antenna module in the electronic device of FIG. 19, according to an embodiment of the disclosure.

FIG. 21 is a diagram illustrating an arrangement structure of a conductive sheet 1610, a conductive pattern 1440, a heat dissipation sheet 1620, and an antenna module 1500 in the electronic device 1400 of FIG. 19, according to an embodiment of the disclosure.

FIG. 21 schematically illustrates, when viewed from above the front plate 1401 of FIG. 19, the arrangement structure of the conductive sheet 1610, the conductive pattern 1440, the heat dissipation sheet 1620, and the antenna module 1500. This is simply an example and is not to be construed as a limitation. Any other arrangement structure may be implemented. According to the embodiment of FIG. 21, compared to the embodiment of FIG. 20, the heat dissipation sheet 1620 may be expanded to be overlapped partially with the conductive pattern 1440 while the conductive sheet 1610 is overlapped with a part of the conductive pattern 1440.

According to an embodiment, when viewed from above the rear plate 1480, the feeding part (e.g., the second portion 1442) of the conductive pattern 1440 may not be overlapped with the conductive sheet 1610 but overlapped with the heat dissipation sheet 1620. When viewed from above the rear plate 1480, an open point 2110 (e.g., a point where the E-field is maximum) of the conductive pattern 1440 may be overlapped with the conductive sheet 1610. When a radiation current is supplied to the feeding part (e.g., the second portion 1442) of the conductive pattern 1440, the conductive pattern 1440 and the conductive sheet 1610 may be electromagnetically coupled with each other to form at least one selected or designated resonant frequency. The electromagnetic coupling with the conductive sheet 1610 may occur substantially at the open point 2110. A frequency characteristic change due to the electromagnetic coupling with the conductive sheet 1610 may substantially or greatly occur at the open point 2110. The conductive sheet 1610 may shift the resonant frequency of the conductive pattern 1440 to a designated frequency, or shift the resonant frequency of the conductive pattern 1440 by a specified amount. For example, the resonant frequency may be lowered because of the electromagnetic coupling between the conductive pattern 1440 and the conductive sheet 1610. In addition, the bandwidth and radiation efficiency may increase because of the electromagnetic coupling between the conductive pattern 1440 and the conductive sheet 1610.

Figure 22:
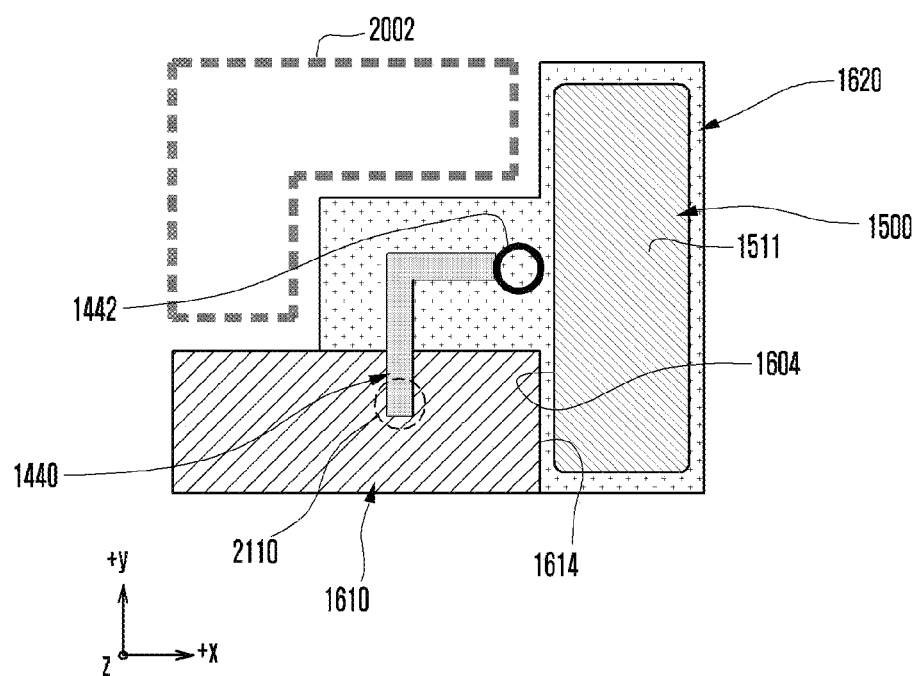
FIG. 22 is a diagram illustrating an arrangement structure of a conductive sheet, a conductive pattern, a heat dissipation sheet, and an antenna module in the electronic device of FIG. 19, according to an embodiment of the disclosure.

FIG. 22 is a diagram illustrating an arrangement structure of a conductive sheet 1610, a conductive pattern 1440, a heat dissipation sheet 1620, and an antenna module 1500 in the electronic device 1400 of FIG. 19, according to an embodiment of the disclosure.

FIG. 22 schematically illustrates, when viewed from above the front plate 1401 of FIG. 19, the arrangement structure of the conductive sheet 1610, the conductive pattern 1440, the heat dissipation sheet 1620, and the antenna module 1500. This is simply an example and is not to be construed as a limitation. Any other arrangement structure may be implemented. According to the embodiment of FIG. 22, compared to the embodiment of FIG. 21, the conductive sheet 1610 may be implemented to have only the sixth edge 1614 facing a part of the fourth edge 1604 of the first surface 1511 included in the antenna module 1500.

According to an embodiment, the open point 2110 (e.g., a point where the E-field is maximum) of the conductive pattern 1440 may be overlapped with the conductive sheet 1610. The electromagnetic coupling with the conductive sheet 1610 may occur substantially at the open point 2110. A frequency characteristic change due to the electromagnetic coupling with the conductive sheet 1610 may substantially or greatly occur at the open point 2110. The conductive sheet 1610 may shift the resonant frequency of the conductive pattern 1440 to a designated frequency, or shift the resonant frequency of the conductive pattern 1440 by a specified amount. For example, the resonant frequency may be lowered because of the electromagnetic coupling between the conductive pattern 1440 and the conductive sheet 1610. In addition, the bandwidth and radiation efficiency may increase because of the electromagnetic coupling between the conductive pattern 1440 and the conductive sheet 1610.

In the embodiment of FIG. 20, as compared with the embodiment of FIG. 21, the conductive sheet 1610 may be further expanded to improve the heat dissipation performance, increase the amount of electromagnetic coupling between the conductive pattern 1440 and the conductive sheet 1610, and improve the heat dissipation performance. Additionally, in the embodiment of FIG. 21, as compared with the embodiment of FIG. 22, the conductive sheet 1610 may be further expanded in an area surrounding the antenna module 1500 to increase the radiation performance of the antenna module 1500.

Figure 23:
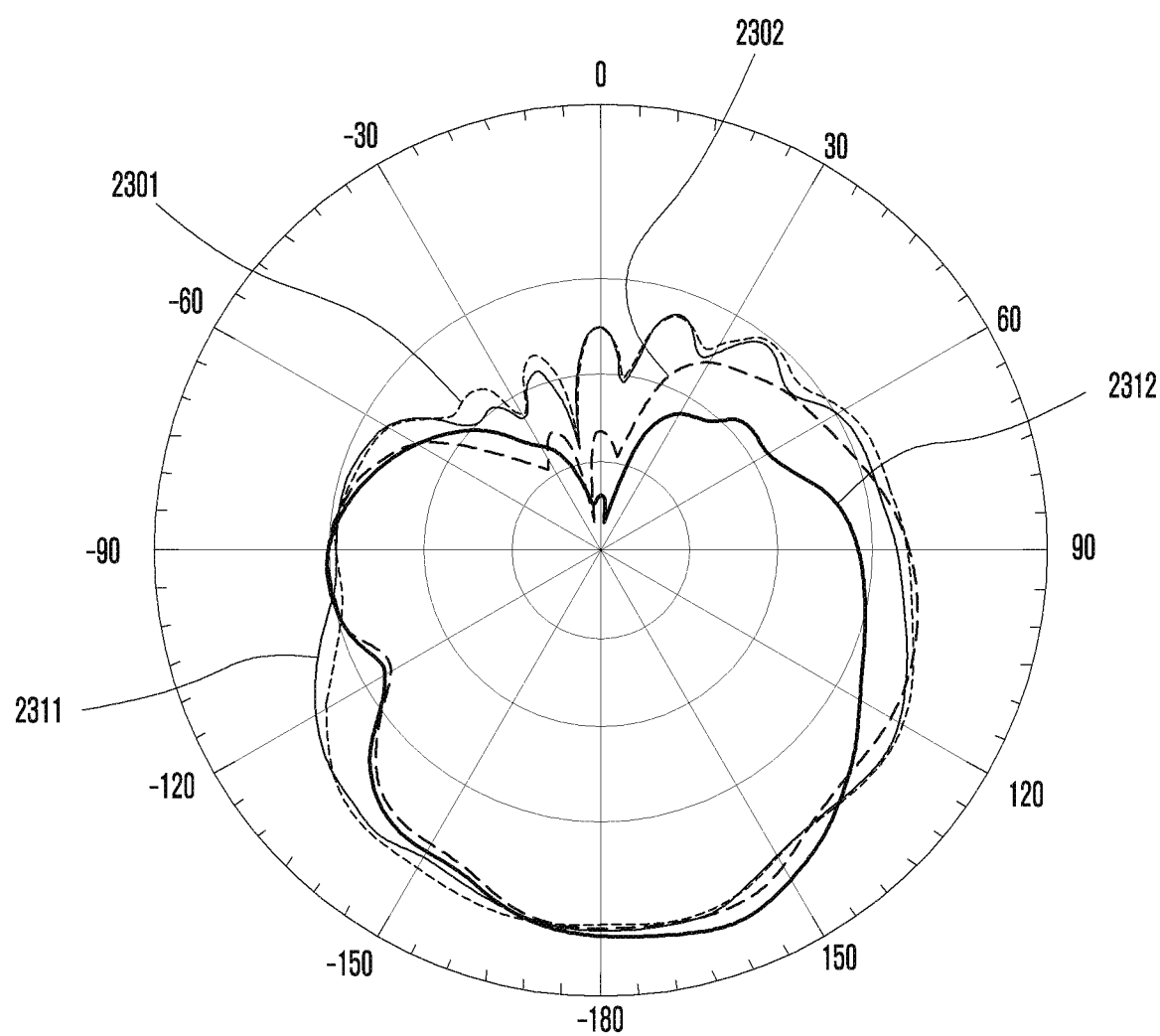
FIG. 23 illustrates radiation patterns of an antenna module in case where no conductive sheet is disposed on a rear plate and in case where a conductive sheet is disposed on a rear plate, according to an embodiment of the disclosure.
Figure 24:
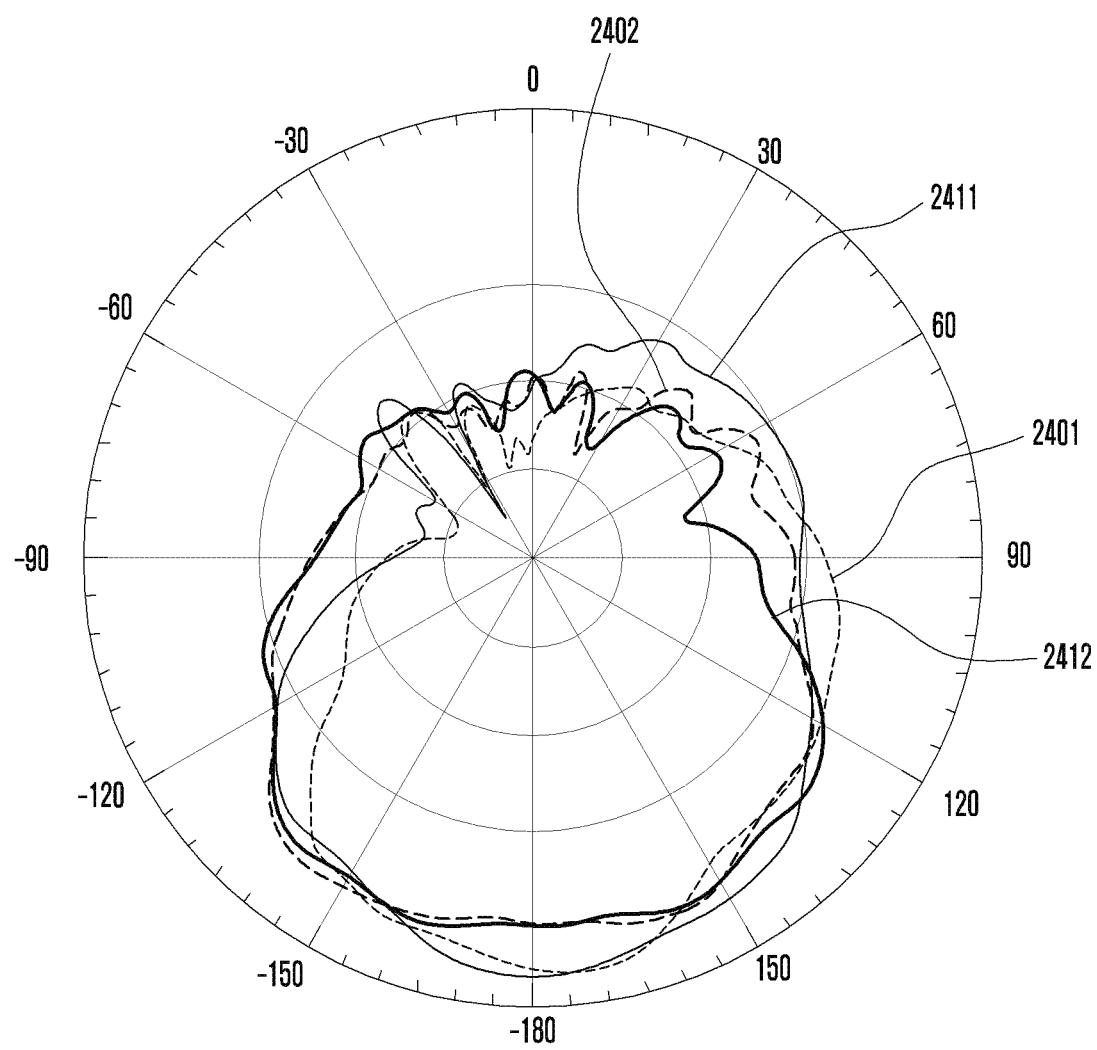
FIG. 24 illustrates radiation patterns of an antenna module in case where no conductive sheet is disposed on a rear plate and in case where a conductive sheet is disposed on a rear plate, according to an embodiment of the disclosure.

FIGS. 23 and 24 illustrate radiation patterns of an antenna module in case where no conductive sheet is disposed on a rear plate and in case where a conductive sheet is disposed on a rear plate, according to an embodiment of the disclosure. FIG. 25 is a table showing antenna gain of an antenna module based on the radiation patterns of FIGS. 23 and 24, according to an embodiment of the disclosure.

According to various embodiments, the case where the conductive sheet is disposed may correspond to the embodiment of FIG. 20, the embodiment of FIG. 21, or the embodiment of FIG. 22.

FIG. 23 shows the radiation patterns in case where the conductive sheet is disposed on the rear plate and in case where the conductive sheet is not disposed on the rear plate at a selected or designated millimeter wave frequency of about 28 GHz. Referring to FIG. 23, reference numeral 2301 indicates the radiation pattern for vertical polarization when no conductive sheet is disposed on the rear plate, and reference numeral 2302 indicates the radiation pattern for horizontal polarization when no conductive sheet is disposed on the rear plate. In addition, reference numeral 2311 indicates the radiation pattern for vertical polarization when the conductive sheet is disposed on the rear plate, and reference numeral 2312 indicates the radiation pattern for horizontal polarization when the conductive sheet is disposed on the rear plate.

FIG. 24 shows the radiation patterns in case where the conductive sheet is disposed on the rear plate and in case where the conductive sheet is not disposed on the rear plate at a selected or designated millimeter wave frequency of about 39 GHz. Referring to FIG. 24, reference numeral 2401 indicates the radiation pattern for vertical polarization when no conductive sheet is disposed on the rear plate, and reference numeral 2402 indicates the radiation pattern for horizontal polarization when no conductive sheet is disposed on the rear plate. In addition, reference numeral 2411 indicates the radiation pattern for vertical polarization when the conductive sheet is disposed on the rear plate, and reference numeral 2412 indicates the radiation pattern for horizontal polarization when the conductive sheet is disposed on the rear plate.

FIG. 25 is a table showing antenna gain of an antenna module based on the radiation patterns of FIGS. 23 and 24, according to an embodiment of the disclosure.

Referring to FIGS. 23, 24, and 25, when the conductive sheet (e.g., the conductive sheet 1610 in FIG. 19) is disposed on the rear plate (e.g., the rear plate 1480 in FIG. 19), an antenna gain of about 0.4 to 0.8 dB may increase in the maximum radiation direction (i.e., boresight). The conductive sheet (e.g., the conductive sheet 1610 in FIG. 20, 21, or 22) disposed on the rear plate may reduce or suppress the surface waves flowing by leakage of the radio waves, radiated from the antenna module (e.g., the antenna module 1500 in FIG. 14), to the rear plate. This may reduce the deformation or distortion of the beam pattern, thereby securing an antenna gain and beam coverage FIG. 26 is a table showing results of measuring heat dissipation in case where no conductive sheet is disposed on a rear plate and in case where a conductive sheet is disposed on a rear plate, according to an embodiment of the disclosure.

Figure 26:
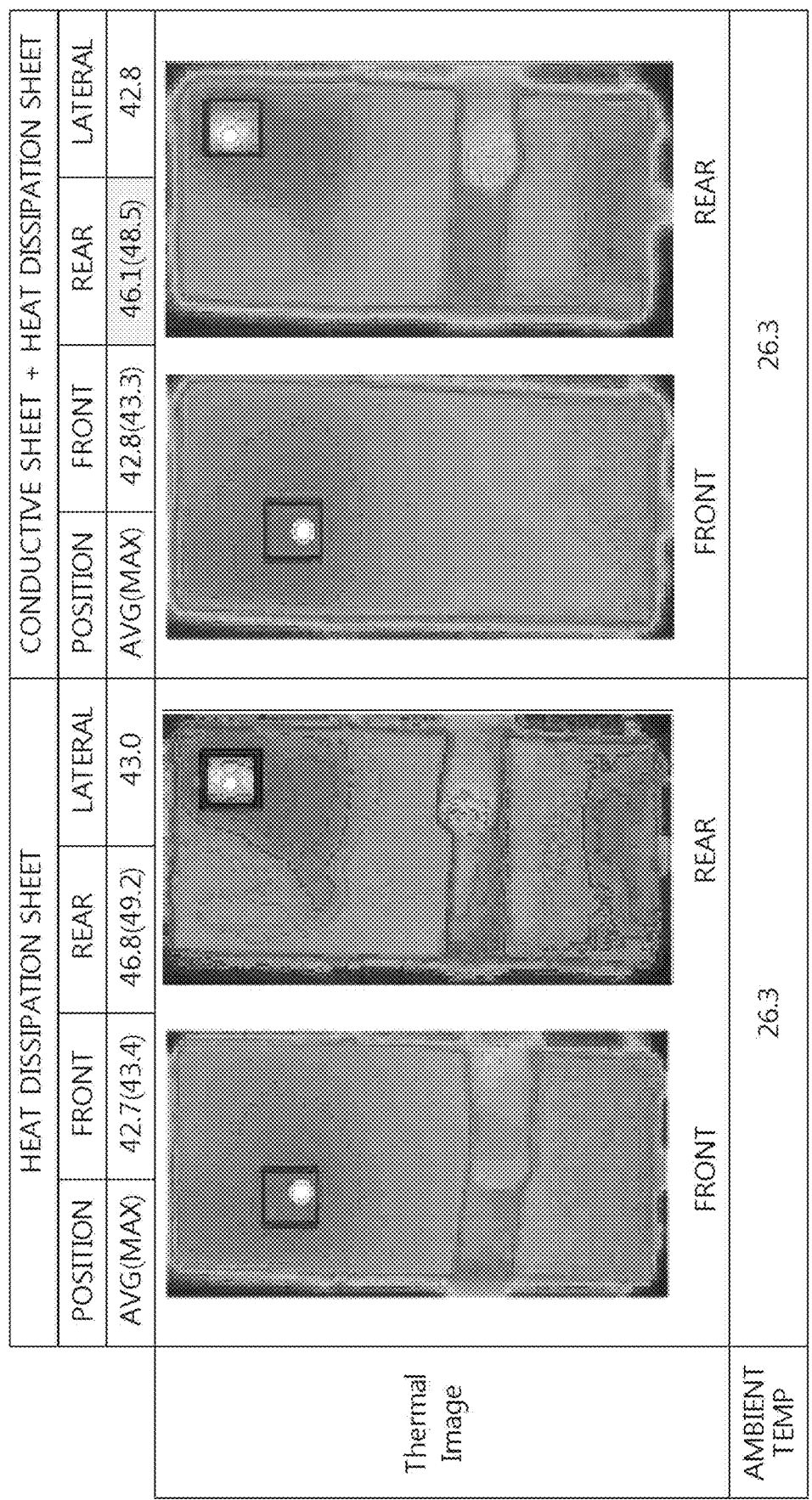
FIG. 26 is a table showing results of measuring heat dissipation in case where no conductive sheet is disposed on a rear plate and in case where a conductive sheet is disposed on a rear plate, according to an embodiment of the disclosure.

Referring to FIG. 26, in case of attaching both the heat dissipation sheet 1620 (e.g., a low-dielectric heat dissipation sheet such as the heat dissipation sheet 1620 in FIG. 16) and the conductive sheet (e.g., the conductive sheet 1610 in FIG. 16) to the rear plate (e.g., the rear plate 1480 in FIG. 16), as compared with a case where only the heat dissipation sheet 1620 is attached to the rear plate 1480 under the same conditions, a temperature of about 0.7° C. may be lowered on the rear surface (e.g., the rear surface 310B in FIG. 3B) of the electronic device.

Figure 27:
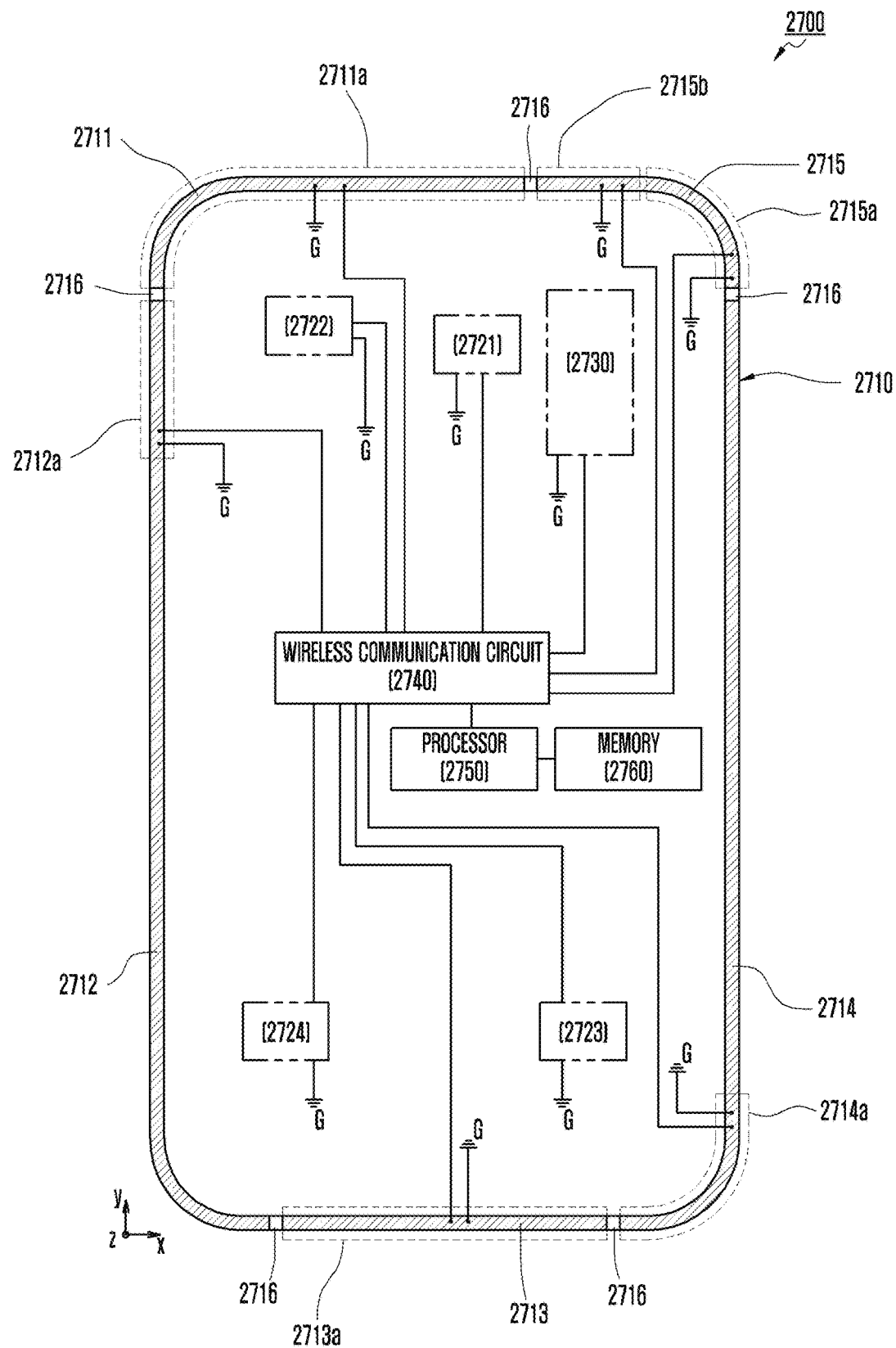
FIG. 27 illustrates an electronic device, according to an embodiment of the disclosure.

FIG. 27 illustrates an electronic device, according to an embodiment of the disclosure.

Referring to FIG. 27, the electronic device 2700 (e.g., the electronic device 101 in FIG. 1 or the electronic device 300 in FIG. 3A) may include a lateral member 2710, a plurality of conductive patterns 2721, 2722, 2723, and 2724, an antenna module 2730, a wireless communication circuit 2740, a processor 2750, and/or a memory 2760.

According to an embodiment, the lateral member 2710 (e.g., the lateral member 510 in FIG. 5A) may include a first conductive portion 2711, a second conductive portion 2712, a third conductive portion 2713, a fourth conductive portion 2714, and/or a fifth conductive portion 2715. The electronic device 2700 may include insulating portions 2716 respectively disposed between the first conductive portion 2711 and the second conductive portion 2712, between the second conductive portion 2712 and the third conductive portion 2713, between the third conductive portion 2713 and the fourth conductive portion 2714, between the fourth conductive portion 2714 and the fifth conductive portion 2715, and between the first conductive portion 2711 and the fifth conductive portion 2715. According to various embodiments, the number of such conductive portions and the positions of the insulating portions may not be limited to the embodiment of FIG. 27.

According to an embodiment, at least one or more of the first conductive portion 2711, the second conductive portion 2712, the third conductive portion 2713, the fourth conductive portion 2714, and/or the fifth conductive portion 2715 of the lateral member 2710 may be electrically connected to the wireless communication circuit 2740 (e.g., the wireless communication module 192 in FIG. 1 or the first wireless communication circuit 1403 in FIG. 14) and to the ground (G), thereby operating as at least one antenna radiator 2711*a*, 2712*a*, 2713*a*, 2714*a*, 2715*a*, and/or 2715*b*.

According to an embodiment, when viewed from above the rear plate (e.g., the rear plate 311 in FIG. 3B), the plurality of conductive patterns 2721, 2722, 2723, and 2724 (e.g., the plurality of conductive patterns 1440, 1443, 1444, 1445, and 1446 in FIG. 14) may be disposed at different positions in an inner space of the electronic device 2700 surrounded by the lateral member 2710. For example, the first conductive pattern 2721 may be disposed closer to the antenna module 2730 than the second conductive pattern 2722, the third conductive pattern 2723, and the fourth conductive pattern 2724. In addition, the plurality of conductive patterns 2721, 2722, 2723, and 2724 may be disposed to face the rear plate. The plurality of conductive patterns 2721, 2722, 2723, and 2724 may be electrically connected to the wireless communication circuit 2740 (e.g., the wireless communication module 192 in FIG. 1 or the first wireless communication circuit 1403 in FIG. 14) and the G, thereby operating as at least one antenna radiator.

Additionally, at least one of the first conductive pattern 540, the second conductive pattern 550, the third conductive pattern 560, and the fourth conductive pattern 570 may be, for example, disposed on one surface 531 of the second support member 530 facing the rear plate 580.

According to various embodiments, at least one of the plurality of conductive patterns 2721, 2722, 2723, and 2724 may be formed of a microstrip on a PCB. The plurality of conductive patterns 2721, 2722, 2723, and 2724 may be formed in various other forms. In various embodiments, the positions of the conductive patterns may be varied, and the number of conductive patterns may be varied without being limited to the embodiment of FIG. 27.

According to an embodiment, when viewed from above the rear plate (e.g., the rear plate 311 of FIG. 3B), the antenna module 2730 (e.g., the antenna module 1500 in FIG. 14) may be electrically connected to the wireless communication circuit 2740 (e.g., the wireless communication module 192 in FIG. 1 or the first wireless communication circuit 1403 in FIG. 14) at a position being not overlapped with the plurality of conductive patterns 2721, 2722, 2723, and 2724 in the inner space of the electronic device 2700 surrounded by the lateral member 2710. The antenna module 2730 may include an antenna array (e.g., the first antenna array 1520 and/or the second antenna array 1530 in FIG. 14) disposed on a surface (e.g., the first surface 1511 in FIG. 14) facing the rear plate. According to various embodiments, the position or number of antenna modules 2730 may be varied without being limited to the embodiment of FIG. 27.

According to an embodiment, the wireless communication circuit 2740 may process a transmission signal and/or a reception signal through at least one antenna radiator in at least one designated frequency band. For example, the designated frequency band may include at least one of a low band (LB) (about 1 GHz or less), a middle band (MB) (about 1 to 6 GHz), or a high band (HB) (about 24 GHz or more). According to various embodiments, the designated frequency band may include various other frequency bands.

According to an embodiment, the wireless communication circuit 2740 may transmit and/or receive a signal having at least one frequency of the LB through the antenna radiator(s) 2711*a*, 2712*a*, 2713*a*, 2714*a*, 2715*a*, and/or 2715*b* utilizing at least a portion of the lateral member 2710. The wireless communication circuit 2740 may transmit and/or receive a signal having at least one frequency of the MB through the plurality of conductive patterns 2721, 2722, 2723, and 2724. The wireless communication circuit 2740 may transmit and/or receive a signal having at least one frequency of the HB through the antenna module 2730.

According to an embodiment, the electronic device 2700 may include a conductive sheet (e.g., the conductive sheet 1610 in FIG. 19) disposed on the rear plate (e.g., the rear plate 1480 in FIG. 19).

According to an embodiment, when viewed from above the rear plate, the conductive sheet (e.g., the conductive sheet 1610 in FIG. 19) may be disposed on the rear plate so as to be electromagnetically isolated from the antenna radiators 2711*a*, 2712*a*, 2713*a*, 2714*a*, 2715*a*, and/or 2715*b* utilizing at least a portion of the lateral member 2710. Thus, the antenna radiators 2711*a*, 2712*a*, 2713*a*, 2714*a*, 2715*a*, and/or 2715*b* may be substantially free of electrical effects from the conductive sheet.

According to an embodiment, when viewed from above the rear plate, the conductive sheet (e.g., the conductive sheet 1610 in FIG. 19) disposed on the rear plate may be overlapped at least in part with the first conductive pattern 2721 (e.g., the first conductive pattern 1440 in FIG. 14) operating as an antenna radiator. The first conductive pattern 2721 and the conductive sheet may be formed, for example, as the arrangement structure between the conductive pattern 1440 and the conductive sheet 1610 described in the embodiment of FIG. 20, the embodiment of FIG. 21, or the embodiment of FIG. 22. The conductive pattern 2721 and the conductive sheet may be electromagnetically coupled with each other to form at least one selected or designated resonant frequency. Because of the electromagnetic coupling between the conductive pattern 2721 and the conductive sheet, the resonant frequency may be shifted, and the bandwidth and radiation efficiency may be increased. According to various embodiments, for overlap with other conductive patterns 2722, 2723, and/or 2724 that require tuning, bandwidth expansion, or securing radiation efficiency, the conductive sheet (e.g., the conductive sheet 1610 in FIG. 19) may be expanded or any other conductive sheet may be added when viewed from above the rear plate.

According to an embodiment, the antenna module 2730 may include an antenna array (e.g., the first antenna array 1520 or the second antenna array 1530 in FIG. 15A) disposed on one surface (e.g., the first surface 1511 in FIG. 15A) facing the rear plate 311 or near the one surface in the PCB (e.g., the PCB 1510 in FIG. 15A). The conductive sheet (e.g., the conductive sheet 1610 in FIG. 19) disposed on the rear plate may surround at least partially, when viewed from above the rear plate, the edges of the one surface 2517 of the antenna module 2730 as described in the embodiment of FIG. 20, the embodiment of FIG. 21, or the embodiment of FIG. 22. The conductive sheet may reduce or suppress surface waves flowing by leakage of radio waves, radiated from the antenna module 2730, to the rear plate. This may reduce the deformation or distortion of a beam pattern, thereby securing an antenna gain and beam coverage. The first conductive pattern 2721 overlapped at least partially with the conductive sheet may be disposed near the antenna module 2730. The conductive sheet may perform both a function of operating as an additional antenna radiator by being electromagnetically coupled with the first conductive pattern 2721, and a function of reducing or suppressing surface waves in order to secure the radiation performance of the antenna module 2730.

According to an embodiment, on the rear plate (e.g., the rear plate 1480 in FIG. 19), a heat dissipation sheet (e.g., the heat dissipation sheet 1620 in FIG. 19) may be disposed together with the conductive sheet (e.g., the conductive sheet 1610 in FIG. 19). As described with reference to FIG. 16, the heat dissipation sheet may be implemented as a low-dielectric heat dissipation sheet (e.g., a ceramic-based low-dielectric heat dissipation sheet) to reduce the effect on antenna radiation performance.

According to an embodiment, the conductive sheet 2790 may act as a heat spreader together with the heat dissipation sheet. In consideration of both the radiation efficiency increasing as the electrical conductivity is low, and the heat dissipation efficiency increasing as the thermal conductivity is high, the conductive sheet 2790 may be formed, for example, of graphite.

According to various embodiments, the wireless communication circuit 2740 or the processor 2750 (e.g., the processor 120 in FIG. 1 or the processor 1404 in FIG. 14) may transmit and/or receive data through a multiple input multiple Output (MIMO) technique using a plurality of antenna radiators in a communication mode using a corresponding frequency band. The electronic device 2700 may include the memory 2760 (e.g., the memory 130 in FIG. 1 or the memory 1405 in FIG. 14) electrically connected to the processor 2750. The memory 2760 may store instructions that cause the processor 2750 to transmit and/or receive data through the MIMO technique selectively using, based on the communication mode, some of the antenna radiators 2711*a*, 2712*a*, 2713*a*, 2714*a*, 2715*a*, and 2715*b* by utilizing the lateral member 2710 and the conductive patterns 2721, 2722, 2723, and 2724. For example, the MIMO technique may include a "beamforming" technique that adjusts phase information of each antenna radiator and adjusts signal strength according to an angle between a user and a base station (or a transmitter) to remove surrounding interference and improve performance. For example, the MIMO technique may include a "diversity" technique that improves performance by placing a distance between antenna radiators to make signals between the antenna radiators independent. For example, the MIMO technique may include a "multiplexing" technique that creates a virtual auxiliary channel between transmitting/receiving antenna radiators and transmits different data through the respective transmitting antennas to increase a transmission rate. A technique in which a base station transmits different data through respective transmission antennas and also a technique in which the electronic device 2700 distinguishes transmission data through appropriate signal processing may be utilized. For example, a 4×4 MIMO technique may utilize four antenna radiators at each of the base station (or transmitter) and the electronic device 2700 (or receiver).

According to an embodiment of the disclosure, an electronic device (e.g., the electronic device 500 in FIG. 7) may include a housing including a front plate (e.g., the front plate 501 in FIG. 7) and a rear plate (e.g., the rear plate 580 in FIG. 7) disposed opposite to the front plate, and a display (e.g., the display 502 in FIG. 7) disposed in a space between the front plate and the rear plate, and disposed at least in part along the front plate. The electronic device may further include a first antenna structure (e.g., the first conductive pattern 540 in FIG. 7) disposed in the space, transmitting and/or receiving a first signal in a first frequency band, and including at least one first conductive pattern. The electronic device may also include a second antenna structure (e.g., the second conductive pattern 550, the third conductive pattern 560, and/or the fourth conductive pattern 570 in FIG. 5B, or the antenna structure 1501 in FIG. 15A) disposed in the space without being overlapped with the first conductive pattern when viewed from above the rear plate, and transmitting and/or receiving a second signal in a second frequency band different from the first frequency band. In addition, the electronic device may include a conductive sheet (e.g., the conductive sheet 710 in FIG. 7, or the conductive sheet 1610 in FIG. 19) disposed in the space and on the rear plate. The conductive sheet may be physically separated from the first conductive pattern, and overlapped at least in part with the first conductive pattern when viewed from above the rear plate.

According to an embodiment of the disclosure, the conductive sheet (e.g., the conductive sheet 710 in FIG. 7, or the conductive sheet 1610 in FIG. 19) may have a lower electrical conductivity than copper.

According to an embodiment of the disclosure, the conductive sheet (e.g., the conductive sheet 710 in FIG. 7, or the conductive sheet 1610 in FIG. 19) may contain a graphite.

According to an embodiment of the disclosure, the second antenna structure may include a second conductive pattern (e.g., the second conductive pattern 550, the third conductive pattern 560, and/or the fourth conductive pattern 570 in FIG. 5B), and the first conductive pattern (e.g., the first conductive pattern 540 in FIG. 5B) or the second conductive pattern may be disposed on a non-conductive support member (e.g., the second support member 530 in FIG. 5B or 7, or the second support member 1430 in FIG. 19) disposed at least partially between the display and the rear plate.

According to an embodiment of the disclosure, a feeding part (e.g., the second portion 542 in FIG. 9, or the second portion 1442 in FIG. 20) of the first antenna structure may be overlapped with the conductive sheet (e.g., the conductive sheet 710 in FIG. 9, or the conductive sheet 1610 in FIG. 20) when viewed from above the rear plate.

According to an embodiment of the disclosure, a feeding part (e.g., the second portion 1442 in FIG. 21 or 22) of the first antenna structure may not be overlapped with the conductive sheet (e.g., the conductive sheet 1610 in FIG. 21 or 22) when viewed from above the rear plate.

According to an embodiment of the disclosure, the conductive sheet (e.g., the conductive sheet 710 in FIG. 7, or the conductive sheet 1610 in FIG. 19) and the first conductive pattern (e.g., the first conductive pattern 541 in FIG. 7, or the conductive pattern 1440 in FIG. 19) may be spaced apart from each other at a distance of 0.3 um to 0.5 um.

According to an embodiment of the disclosure, the second antenna structure (e.g., the antenna structure 1501 in FIG. 15A) may be disposed between the rear plate and the display. The second antenna structure may include a PCB (e.g., the PCB 1510 in FIG. 15A) having a first surface (e.g., the first surface 1511 in FIG. 15A) disposed to face the rear plate, and a second surface (e.g., the second surface 1512 in FIG. 15B) opposite to the first surface. The second antenna structure may also include a plurality of antenna elements (e.g., the first antenna array 1520 and/or the second antenna array 1530 in FIG. 15A) disposed on the first surface or inside the PCB near the first surface.

According to an embodiment of the disclosure, the conductive sheet (e.g., the conductive sheet 1610 in FIG. 20, 21, or 22) may surround at least a part of the first surface (e.g., the first surface 1511 in FIG. 20, 21, or 22) along an edge of the first surface when viewed from above the rear plate.

According to an embodiment of the disclosure, the electronic device may further include a heat dissipation sheet (e.g., the heat dissipation sheet 720 in FIG. 8, or the heat dissipation sheet 1620 in FIG. 21 or 22) disposed on the rear plate so as not to be overlapped with the conductive sheet in the space, and formed of a material different from the conductive sheet. The heat dissipation sheet may be overlapped at least in part with the second antenna structure (e.g., the second conductive pattern 550, the third conductive pattern 560, and/or the fourth conductive pattern 570 in FIG. 5B, or the antenna module 1500 in FIG. 20, 21, or 22) when viewed from above the rear plate.

According to an embodiment of the disclosure, the heat dissipation sheet (e.g., the heat dissipation sheet 720 in FIG. 8, or the heat dissipation sheet 1620 in FIG. 21 or 22) may have a relative dielectric constant of 4 or less.

According to an embodiment of the disclosure, the heat dissipation sheet (e.g., the heat dissipation sheet 720 in FIG. 8, or the heat dissipation sheet 1620 in FIG. 21 or 22) may contain a ceramic material.

According to an embodiment of the disclosure, the first frequency band may include 3 to 6 GHz, and the second frequency band may include 3 GHz or less, or 24 GHz or more.

According to an embodiment of the disclosure, an electronic device (e.g., the electronic device 1400 in FIG. 19) may include a housing including a front plate (e.g., the front plate 1401 in FIG. 19) and a rear plate (e.g, the rear plate 1480 in FIG. 19) disposed opposite to the front plate. The electronic device may include a display (e.g., the display 1402 in FIG. 19) disposed in a space between the front plate and the rear plate, and disposed at least in part along the front plate. The electronic device may include an antenna structure (e.g., the antenna structure 1501 in FIG. 15A) disposed between the rear plate and the display. The antenna structure may include a PCB (e.g., the PCB 1510 in FIG. 14) having a first surface (e.g., the first surface 1511 in FIG. 14) disposed to face the rear plate, and a second surface (e.g., the second surface 1512 in FIG. 15B) opposite to the first surface. The antenna structure may also include a plurality of antenna elements (e.g., the first antenna array 1520 and/or the second antenna array 1530 in FIG. 14) disposed on the first surface or inside the PCB near the first surface. The electronic device may include an antenna radiator (e.g., the conductive pattern 1440 in FIG. 19) disposed in the space without being overlapped with the antenna structure when viewed from above the rear plate. The electronic device may include a conductive sheet (e.g., the conductive sheet 1610 in FIG. 19) disposed in the space and on the rear plate. The conductive sheet may be physically separated from the antenna radiator, and overlapped at least in part with the antenna radiator while surrounding at least a part of the first surface along an edge of the first surface when viewed from above the rear plate.

According to an embodiment of the disclosure, the conductive sheet (e.g., the conductive sheet 1610 in FIG. 19) may contain a graphite.

According to an embodiment of the disclosure, a feeding part (e.g., the second portion 1442 in FIG. 20) of the antenna radiator may be overlapped with the conductive sheet (e.g., the conductive sheet 1610 in FIG. 20) when viewed from above the rear plate.

According to an embodiment of the disclosure, the conductive sheet (e.g., the conductive sheet 1610 in FIG. 20) may be disposed such that a length from the feeding part (e.g., the second portion 1442 in FIG. 20) to a farthest edge of the conductive sheet is greater than or equal to about λ/4 for a selected or designated frequency.

According to an embodiment of the disclosure, a feeding part (e.g., the second portion 1442 in FIG. 21 or 22) of the antenna radiator may not be overlapped with the conductive sheet (e.g., the conductive sheet 1610 in FIG. 21 or 22) when viewed from above the rear plate.

According to an embodiment of the disclosure, the electronic device may further include a heat dissipation sheet (e.g., the heat dissipation sheet 1620 in FIG. 19) disposed on the rear plate so as not to be overlapped with the conductive sheet in the space, and formed of a material different from the conductive sheet. The heat dissipation sheet may be overlapped at least in part with the first surface (e.g., the first surface 1511 in FIG. 19) when viewed from above the rear plate.

According to an embodiment of the disclosure, the housing may further include a conductive lateral member (e.g., the lateral member 2710 in FIG. 27) surrounding at least partially the space between the front plate and the rear plate. At least a portion (e.g., the antenna radiators 2711*a*, 2712*a*, 2713*a*, 2714*a*, 2715*a*, and/or 2715*b* in FIG. 27) of the lateral member may transmit and/or receive a signal in a frequency band different from frequency bands of the antenna radiator (e.g., the conductive pattern 1440 in FIG. 19, or the first conductive pattern 2721 in FIG. 27) and the at least one antenna element (e.g., the first antenna array 1520 and/or the second antenna array 1530 in FIG. 14). The conductive sheet may be disposed on the rear plate to be electromagnetically isolated from the at least a portion of the lateral member.

According to an embodiment of the disclosure, the antenna radiator (e.g., the first conductive pattern 2721 in FIG. 27) may transmit and/or receive a signal of 1 to 6 GHz. The antenna structure (e.g., the antenna module 2730 in FIG. 27) may transmit and/or receive a signal of 24 GHz or more. The at least a portion (e.g., the antenna radiators 2711*a*, 2712*a*, 2713*a*, 2714*a*, 2715*a*, and/or 2715*b* in FIG. 27) of the lateral member may transmit and/or receive a signal of 1 GHz or less.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising:
   a housing including a front plate and a rear plate disposed opposite the front plate;
   a display disposed in a space between the front plate and the rear plate, and disposed at least partially along the front plate;
   a first antenna structure disposed in the space and configured to transmit or receive a first signal in a first frequency band, wherein the first antenna structure includes at least one first conductive pattern;
   a second antenna structure disposed in the space without being overlapped with the at least one first conductive pattern when viewed from above the rear plate, and configured to transmit or receive a second signal in a second frequency band different from the first frequency band;
   a conductive sheet disposed in the space and on the rear plate; and
   a heat dissipation sheet disposed on the rear plate so as not to be overlapped with the conductive sheet in the space, and formed of a material different from the conductive sheet,
   wherein the heat dissipation sheet is overlapped at least in part with the second antenna structure when viewed from above the rear plate, and
   wherein the conductive sheet is physically separated from the at least one first conductive pattern, and at least partially overlapped with the at least one first conductive pattern when viewed from above the rear plate.

2. The electronic device of claim 1, wherein the conductive sheet has a lower electrical conductivity than copper.

3. The electronic device of claim 2, wherein the conductive sheet contains a graphite.

4. The electronic device of claim 1, wherein the second antenna structure includes at least one second conductive pattern, and
   wherein the at least one first conductive pattern or the at least one second conductive pattern is disposed on a non-conductive support member disposed at least partially between the display and the rear plate.

5. The electronic device of claim 1, wherein a feeding part of the first antenna structure is overlapped with the conductive sheet when viewed from above the rear plate.

6. The electronic device of claim 1, wherein a feeding part of the first antenna structure is not overlapped with the conductive sheet when viewed from above the rear plate.

7. The electronic device of claim 1, wherein the conductive sheet and the at least one first conductive pattern are spaced apart from each other at a distance of 0.3 micrometer (μm) to 0.5 μm.

8. The electronic device of claim 1, wherein the second antenna structure is disposed between the rear plate and the display and includes:
   a printed circuit board (PCB) having a first surface disposed to face the rear plate, and a second surface opposite to the first surface; and
   a plurality of antenna elements disposed on the first surface or inside the PCB near the first surface.

9. The electronic device of claim 8, wherein the conductive sheet surrounds at least a part of the first surface along an edge of the first surface when viewed from above the rear plate.

10. The electronic device of claim 1, wherein the heat dissipation sheet has a relative dielectric constant of 4 or less.

11. The electronic device of claim 1, wherein the heat dissipation sheet contains a ceramic material.

12. The electronic device of claim 1, wherein the first frequency band includes 3 to 6 gigahertz (GHz), and the second frequency band includes 3 GHz or less, or 24 GHz or more.

13. An electronic device comprising:
   a housing including a front plate and a rear plate disposed opposite the front plate;
   a display disposed in a space between the front plate and the rear plate, and disposed at least partially along the front plate;
   an antenna structure disposed between the rear plate and the display, the antenna structure including:
   a printed circuit board (PCB) having a first surface disposed to face the rear plate, and a second surface opposite to the first surface; and a plurality of antenna elements disposed on the first surface or inside the PCB near the first surface;

an antenna radiator disposed in the space without being overlapped with the antenna structure when viewed from above the rear plate;

a conductive sheet disposed in the space and on the rear plate; and a heat dissipation sheet disposed on the rear plate so as not to be overlapped with the conductive sheet in the space, and formed of a material different from the conductive sheet, wherein the heat dissipation sheet is at least partially overlapped with the first surface when viewed from above the rear plate, and wherein the conductive sheet is physically separated from the antenna radiator, and at least partially overlapped with the antenna radiator while surrounding at least a part of the first surface along an edge of the first surface when viewed from above the rear plate.

14. The electronic device of claim 13, wherein the conductive sheet contains a graphite.

15. The electronic device of claim 13, wherein a feeding part of the antenna radiator is overlapped with the conductive sheet when viewed from above the rear plate, and wherein the conductive sheet is disposed such that a length from the feeding part to a farthest edge of the conductive sheet is greater than or equal to a wavelength ($\lambda$)/4 for a selected or designated frequency.

16. The electronic device of claim 13, wherein a feeding part of the antenna radiator is not overlapped with the conductive sheet when viewed from above the rear plate.

17. The electronic device of claim 13, wherein the housing further includes a conductive lateral member at least partially surrounding the space between the front plate and the rear plate, wherein at least a portion of the conductive lateral member transmits and/or receives a signal in a frequency band different from frequency bands of the antenna radiator and the at least one antenna element, and wherein the conductive sheet is disposed on the rear plate to be electromagnetically isolated from the portion of the conductive lateral member.

18. The electronic device of claim 17, wherein the antenna radiator transmits or receives a signal of 1 to 6 gigahertz (GHz), wherein the antenna structure transmits or receives a signal of 24 GHz or more, and wherein the portion of the conductive lateral member transmits or receives a signal of 1 GHz or less.

* * * * *